(12) United States Patent
Liu et al.

(10) Patent No.: US 10,931,884 B2
(45) Date of Patent: Feb. 23, 2021

(54) PIXEL SENSOR HAVING ADAPTIVE EXPOSURE TIME

(71) Applicant: Facebook Technologies, LLC, Menlo Park, CA (US)

(72) Inventors: Xinqiao Liu, Medina, WA (US); Andrew Samuel Berkovich, Bellevue, WA (US); Song Chen, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/544,136

(22) Filed: Aug. 19, 2019

(65) Prior Publication Data

US 2020/0059589 A1    Feb. 20, 2020

Related U.S. Application Data

(60) Provisional application No. 62/719,953, filed on Aug. 20, 2018.

(51) Int. Cl.
*H04N 5/235* (2006.01)
*H04N 5/355* (2011.01)
(Continued)

(52) U.S. Cl.
CPC ....... *H04N 5/2353* (2013.01); *G02B 27/0172* (2013.01); *H01L 27/14612* (2013.01);
(Continued)

(58) Field of Classification Search
CPC ............ H04N 5/2353; H04N 5/37452; H04N 5/37455; H04N 5/3559; H04N 5/35554;
(Continued)

(56) References Cited

U.S. PATENT DOCUMENTS 8,144,227 B2    3/2012   Kobayashi
8,773,562 B1    7/2014   Fan
(Continued)

FOREIGN PATENT DOCUMENTS

EP    1746820 A1    1/2007
EP    2063630 A1    5/2009
(Continued)

OTHER PUBLICATIONS

U.S. Appl. No. 15/801,216, "Advisory Action", dated Apr. 7, 2020, 3 pages.
(Continued)

*Primary Examiner* — Twyler L Haskins
*Assistant Examiner* — Akshay Trehan
(74) *Attorney, Agent, or Firm* — Kilpatrick Townsend & Stockton

(57) ABSTRACT

In one example, a method comprises: exposing a first photodiode to incident light to generate first charge; exposing a second photodiode to the incident light to generate second charge; converting, by a first charge sensing unit, the first charge to a first voltage; converting, by a second charge sensing unit, the second charge to a second voltage; controlling an ADC to detect, based on the first voltage, that a quantity of the first charge reaches a saturation threshold, and to measure a saturation time when the quantity of the first charge reaches the saturation threshold; stopping the exposure of the first photodiode and the second photodiode to the incident light based on detecting that the quantity of the first charge reaches the saturation threshold; and controlling the ADC to measure, based on the second voltage, a quantity of the second charge generated by the second photodiode before the exposure ends.

20 Claims, 31 Drawing Sheets

(51) Int. Cl.
| | |
|---|---|
| H04N 5/3745 | (2011.01) |
| H01L 27/146 | (2006.01) |
| G02B 27/01 | (2006.01) |
| G06K 9/00 | (2006.01) |
| F21V 8/00 | (2006.01) |

(52) U.S. Cl.
CPC .......... *G02B 6/0016* (2013.01); *G02B 6/0036* (2013.01); *G02B 27/0179* (2013.01); *G02B 2027/0112* (2013.01); *G02B 2027/0138* (2013.01); *G02B 2027/0178* (2013.01); *G02B 2027/0187* (2013.01); *H01L 27/1465* (2013.01); *H01L 27/14621* (2013.01); *H01L 27/14627* (2013.01); *H01L 27/14636* (2013.01); *H01L 27/14652* (2013.01)

(58) Field of Classification Search
CPC ......... H01L 27/14612; H01L 27/14652; H01L 27/14636; H01L 27/1465; H01L 27/14627; H01L 27/14621; H01L 27/14605; G02B 27/0172; G02B 27/0179; G02B 202/0178; G02B 2027/0138; G02B 2027/0112; G02B 2027/0118; G02B 2027/0187; G02B 6/0016; G02B 6/0036; G06K 9/209; G06K 9/2018; G06K 9/00604; G06K 9/00671
See application file for complete search history.

(56) References Cited

U.S. PATENT DOCUMENTS

| | | | |
|---|---|---|---|
| 8,779,346 | B2 | 7/2014 | Fowler et al. |
| 8,946,610 | B2 | 2/2015 | Iwabuchi et al. |
| 9,094,629 | B2 | 7/2015 | Ishibashi |
| 9,343,497 | B2 | 5/2016 | Cho |
| 9,478,579 | B2 | 10/2016 | Dai et al. |
| 10,003,759 | B2 | 6/2018 | Fan |
| 10,015,416 | B2 | 7/2018 | Borthakur et al. |
| 10,750,097 | B2 | 8/2020 | Liu |
| 2003/0049925 | A1 | 3/2003 | Layman et al. |
| 2004/0095495 | A1 | 5/2004 | Inokuma et al. |
| 2004/0251483 | A1 | 12/2004 | Ko et al. |
| 2005/0280727 | A1 | 12/2005 | Sato et al. |
| 2006/0023109 | A1 | 2/2006 | Mabuchi et al. |
| 2007/0092244 | A1 | 4/2007 | Pertsel et al. |
| 2008/0042046 | A1 | 2/2008 | Mabuchi |
| 2008/0088014 | A1 | 4/2008 | Adkisson et al. |
| 2009/0002528 | A1 | 1/2009 | Manabe et al. |
| 2009/0091645 | A1 | 4/2009 | Trimeche et al. |
| 2009/0128640 | A1 | 5/2009 | Yumiki |
| 2009/0224139 | A1 | 9/2009 | Buettgen et al. |
| 2009/0244328 | A1 | 10/2009 | Yamashita |
| 2009/0261235 | A1* | 10/2009 | Lahav ................ H04N 5/37455 250/208.1 |
| 2010/0276572 | A1 | 11/2010 | Iwabuchi et al. |
| 2011/0049589 | A1 | 3/2011 | Chuang et al. |
| 2011/0149116 | A1 | 6/2011 | Kim |
| 2012/0039548 | A1 | 2/2012 | Wang et al. |
| 2012/0092677 | A1 | 4/2012 | Suehira et al. |
| 2012/0273654 | A1 | 11/2012 | Hynecek et al. |
| 2013/0020466 | A1 | 1/2013 | Ayers et al. |
| 2013/0056809 | A1 | 3/2013 | Mao et al. |
| 2013/0082313 | A1 | 4/2013 | Manabe |
| 2013/0113969 | A1 | 5/2013 | Manabe et al. |
| 2013/0120615 | A1 | 5/2013 | Hirooka et al. |
| 2013/0126710 | A1 | 5/2013 | Kondo |
| 2013/0234029 | A1 | 9/2013 | Bikumandla |
| 2013/0248685 | A1 | 9/2013 | Ann |
| 2013/0293752 | A1 | 11/2013 | Peng et al. |
| 2013/0299674 | A1 | 11/2013 | Fowler et al. |
| 2013/0300906 | A1 | 11/2013 | Yan |
| 2014/0042299 | A1 | 2/2014 | Wan et al. |
| 2014/0042582 | A1 | 2/2014 | Kondo |
| 2014/0085523 | A1 | 3/2014 | Hynecek |
| 2014/0176770 | A1 | 6/2014 | Kondo |
| 2014/0211052 | A1 | 7/2014 | Choi |
| 2014/0306276 | A1 | 10/2014 | Yamaguchi |
| 2015/0083895 | A1 | 3/2015 | Hashimoto et al. |
| 2015/0090863 | A1 | 4/2015 | Mansoorian et al. |
| 2015/0172574 | A1 | 6/2015 | Honda et al. |
| 2015/0279884 | A1 | 10/2015 | Kusumoto |
| 2015/0350582 | A1 | 12/2015 | Korobov et al. |
| 2015/0358593 | A1 | 12/2015 | Sato |
| 2015/0381907 | A1 | 12/2015 | Boettiger et al. |
| 2016/0037111 | A1 | 2/2016 | Dai et al. |
| 2016/0093659 | A1 | 3/2016 | Nakamura et al. |
| 2016/0111457 | A1 | 4/2016 | Sekine |
| 2016/0165160 | A1 | 6/2016 | Hseih et al. |
| 2016/0204150 | A1 | 7/2016 | Oh et al. |
| 2016/0240570 | A1 | 8/2016 | Barna et al. |
| 2016/0337605 | A1 | 11/2016 | Ito |
| 2016/0353045 | A1 | 12/2016 | Kawahito et al. |
| 2016/0360127 | A1 | 12/2016 | Dierickx et al. |
| 2017/0013215 | A1 | 1/2017 | McCarten |
| 2017/0053962 | A1 | 2/2017 | Oh et al. |
| 2017/0062501 | A1 | 3/2017 | Velichko et al. |
| 2017/0099422 | A1* | 4/2017 | Goma ................... H04N 5/378 |
| 2017/0104021 | A1 | 4/2017 | Park et al. |
| 2017/0104946 | A1 | 4/2017 | Hong |
| 2017/0170223 | A1 | 6/2017 | Hynecek et al. |
| 2017/0207268 | A1 | 7/2017 | Kurokawa |
| 2017/0366766 | A1 | 12/2017 | Geurts et al. |
| 2018/0019269 | A1 | 1/2018 | Klipstein |
| 2019/0052788 | A1 | 2/2019 | Liu |
| 2019/0056264 | A1 | 2/2019 | Liu |
| 2019/0057995 | A1 | 2/2019 | Liu |
| 2019/0058058 | A1 | 2/2019 | Liu |
| 2019/0172868 | A1 | 6/2019 | Chen et al. |
| 2019/0348460 | A1 | 11/2019 | Chen et al. |
| 2019/0371845 | A1 | 12/2019 | Chen et al. |

FOREIGN PATENT DOCUMENTS

| | | |
|---|---|---|
| KR | 20110050351 A | 5/2011 |
| WO | 2017058488 A1 | 4/2017 |
| WO | 2017069706 A1 | 4/2017 |
| WO | 2019168929 A1 | 9/2019 |

OTHER PUBLICATIONS

U.S. Appl. No. 15/801,216, "Final Office Action", dated Dec. 26, 2019, 5 pages.
U.S. Appl. No. 15/801,216, "Non-Final Office Action", dated Jun. 27, 2019, 13 pages.
U.S. Appl. No. 15/801,216, "Notice of Allowance", dated Jun. 23, 2020, 5 pages.
U.S. Appl. No. 15/847,517, "Non-Final Office Action", dated Nov. 23, 2018, 21 pages.
U.S. Appl. No. 15/983,391, "Non-Final Office Action", dated Aug. 29, 2019, 12 pages.
U.S. Appl. No. 15/983,391, "Notice of Allowance", dated Apr. 8, 2020, 8 pages.
U.S. Appl. No. 16/210,748, "Final Office Action", dated Jul. 7, 2020, 11 pages.
U.S. Appl. No. 16/210,748, "Non-Final Office Action", dated Jan. 31, 2020, 11 pages.
U.S. Appl. No. 16/384,720, "Non-Final Office Action", dated May 1, 2020, 6 pages.
U.S. Appl. No. 16/384,720, "Notice of Allowance", dated Aug. 26, 2020, 8 pages.
U.S. Appl. No. 16/435,449, "Notice of Allowance", dated Jul. 27, 2020, 8 pages.
U.S. Appl. No. 16/436,049, "Non-Final Office Action", dated Jun. 30, 2020, 11 pages.
U.S. Appl. No. 16/436,049, "Non-Final Office Action", dated Mar. 4, 2020, 9 pages.
EP18179838.0, "Partial European Search Report", dated Dec. 5, 2018, 14 pages.

(56) References Cited

OTHER PUBLICATIONS

EP18188684.7, "Extended European Search Report", dated Jan. 16, 2019, 10 pages.
EP18188684.7, "Office Action", dated Nov. 26, 2019, 9 pages.
EP18188962.7, "Extended European Search Report", dated Oct. 23, 2018, 8 pages.
EP18188962.7, "Office Action", dated Aug. 28, 2019, 6 pages.
PCT/US2018/039352, "International Search Report and Written Opinion", dated Oct. 26, 2018, 10 pages.
PCT/US2018/039431, "International Search Report and Written Opinion", dated Nov. 7, 2018, 14 pages.
PCT/US2018/045666, "International Preliminary Report on Patentability", dated Feb. 27, 2020, 11 pages.
PCT/US2018/045666, "International Search Report and Written Opinion", dated Dec. 3, 2018, 13 pages.
PCT/US2018/045673, "International Search Report and Written Opinion", dated Dec. 4, 2018, 13 pages.
PCT/US2018/064181, "International Search Report and Written Opinion", dated Mar. 29, 2019, 12 pages.
PCT/US2019/031521, "International Search Report and Written Opinion", dated Jul. 11, 2019, 11 pages.
PCT/US2019/036492, "International Search Report and Written Opinion", dated Sep. 25, 2019, 9 pages.
PCT/US2019/036536, "International Search Report and Written Opinion", dated Sep. 26, 2019, 14 pages.
PCT/US2019/047156, "International Search Report and Written Opinion", dated Oct. 23, 2019, 9 pages.
PCT/US2019/049756, "International Search Report and Written Opinion", dated Dec. 16, 2019, 8 pages.
PCT/US2019/059754, "International Search Report and Written Opinion", dated Mar. 24, 2020, 15 pages.
U.S. Appl. No. 16/435,449, "Notice of Allowance", dated Sep. 16, 2020, 7 pages.
U.S. Appl. No. 16/407,072, "Non-Final Office Action", dated Dec. 24, 2020, 15 pages.
U.S. Appl. No. 16/436,049, "Notice of Allowance", dated Oct. 21, 2020, 8 pages.
U.S. Appl. No. 16/672,427, "Non Final Office Action", dated Dec. 7, 2020, 8 pages.

* cited by examiner

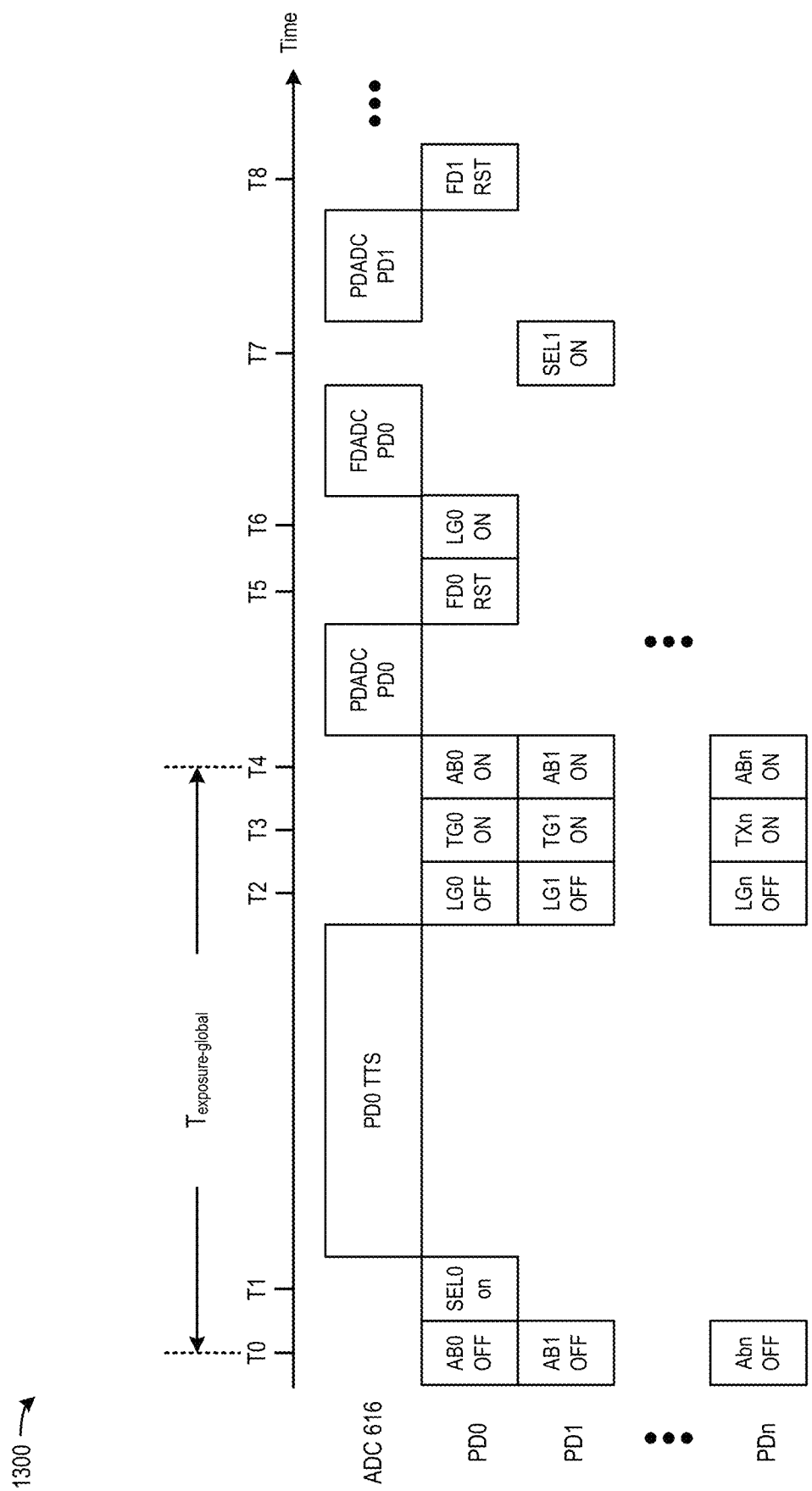

PIXEL SENSOR HAVING ADAPTIVE EXPOSURE TIME

RELATED APPLICATION

This patent application claims priority to U.S. Provisional Patent Application Ser. No. 62/719,953, filed Aug. 20, 2018, entitled "Digital Pixel Sensor with Kernel-Based Exposure Control," and which is assigned to the assignee hereof and is incorporated herein by reference in its entirety for all purposes.

BACKGROUND

The disclosure relates generally to image sensors, and more specifically to pixel cell structure including interfacing circuitries for determining light intensity for image generation.

A typical pixel in an image sensor includes a photodiode to sense incident light by converting photons into charge (e.g., electrons or holes). The incident light can include components of different wavelength ranges for different applications, such as 2D and 3D sensing. Moreover, to reduce image distortion, a global shutter operation can be performed in which each photodiode of the array of photodiodes senses the incident light simultaneously in a global exposure period to generate the charge. The charge can be converted by a charge sensing unit (e.g., a floating diffusion) to convert to a voltage. The array of pixel cells can measure different components of the incident light based on the voltages converted by the charge sensing unit and provide the measurement results for generation of 2D and 3D images of a scene.

SUMMARY

The present disclosure relates to image sensors. More specifically, and without limitation, this disclosure relates to a pixel cell. This disclosure also relates to operating the circuitries of pixel cells to generate a digital representation of the intensity of incident light.

In one example, an apparatus is provided. The apparatus comprises: a first photodiode to generate first charge; a second photodiode to generate second charge; a first charge sensing unit to convert the first charge to a first voltage; a second charge sensing unit to convert the second charge to a second voltage; an ADC capable of measuring a saturation time and a quantity of charge; and a controller configured to: expose the first photodiode and the second photodiode to incident light to generate, respectively, the first charge and the second charge; connect the ADC to the first charge sensing unit to detect, based on the first voltage, that a quantity of the first charge reaches a saturation threshold, and to measure the saturation time when the quantity of the first charge reaches the saturation threshold; stop the exposure of the first photodiode and the second photodiode to the incident light based on detecting that the quantity of the first charge reaches the saturation threshold; and connect the ADC to the second charge sensing unit to measure, based on the second voltage, a quantity of the second charge generated by the second photodiode before the exposure ends.

In one aspect, the apparatus further comprises: a first shutter switch coupled between the first photodiode and a first charge sink; and a second shutter switch coupled between the second photodiode and a second charge sink. The controller is configured to: exposure the first photodiode and the second photodiode to the incident light based on disabling the first shutter switch and the second shutter switch; and stop the exposure of the first photodiode and the second photodiode to the incident light based on enabling the first shutter switch and the second shutter switch.

In one aspect, the controller is configured to disable the first shutter switch and the second shutter switch together at a first time and to enable the first shutter switch and the second shutter switch together at a second time, such that a global shutter switch for the first photodiode and the second photodiode starts at the first time and ends at the second time.

In one aspect, each of the first charge sensing unit and the second charge sensing unit includes, respectively, a first capacitor and a second capacitor. The apparatus further comprises: a first transfer switch coupled between the first photodiode and the first charge sensing unit; and a second transfer switch coupled between the second photodiode and the second charge sensing unit. The controller is configured to: control the first transfer switch to transfer the first charge to the first capacitor of the first charge sensing unit; control the second transfer switch to transfer the first charge to the second capacitor of the first charge sensing unit; and stop the exposure of the first photodiode and the second photodiode to the incident light after the transfer of the first charge and the second charge completes.

In one aspect, the controller is configured to: at a first time, bias the first transfer switch at a first bias voltage to transfer first overflow charge of the first charge from the first photodiode to the first charge sensing unit for storage; at the first time, bias the second transfer switch at the first bias voltage to transfer second overflow charge of the second charge from the second photodiode to the second charge sensing unit for storage; at a second time, bias the first transfer switch at a second bias voltage to transfer first residual charge of the first charge from the first photodiode to the first charge sensing unit for storage; and at the second time, bias the second transfer switch at the second bias voltage to transfer second residual charge of the second charge from the second photodiode to the second charge sensing unit for storage. The exposure of the first photodiode and the second photodiode to the incident light is stopped after the transfer of the first residual charge and the transfer of the second residual charge completes.

In one aspect, the first charge sensing unit includes a first switchable buffer coupled between the first capacitor and the ADC. The second charge sensing unit includes a second switchable buffer coupled between the first capacitor and the ADC. The controller is configured to: when the first transfer switch is biased at the first bias voltage, enable the first switch buffer to control the ADC to detect whether the quantity of the first overflow charge exceeds the saturation threshold, and to measure the saturation time when the quantity of the first overflow charge reaches the saturation threshold; and after the exposure of the first photodiode and the second photodiode to the incident light stops: control the ADC to measure a quantity of the second residual charge stored in the second capacitor.

In one aspect, the first capacitor develops the first voltage when the first overflow charge is transferred to the first capacitor. The ADC is configured to measure the saturation time based on comparing the first voltage against a first static threshold voltage representing the saturation threshold.

In one aspect, the first capacitor includes a first main capacitor and a first auxiliary capacitor. Prior to the transfer of the first residual charge, the controller is configured to: disconnect the first auxiliary capacitor from the first main capacitor; and reset the first main capacitor. The first residual charge is transferred to the first main capacitor after the first main capacitor is reset to generate a third voltage. The ADC is configured to measure a quantity of the first residual charge stored in the first main capacitor based on comparing the third voltage at the first main capacitor with a first ramping threshold voltage. The ADC is configured to, after measuring a quantity of the first residual charge: connect the first auxiliary capacitor that stores a portion of the first overflow charge with the first main capacitor to generate a fourth voltage; and measure a quantity of the first overflow charge based on comparing the fourth voltage with a second ramping threshold voltage. The controller is configured select an output generated by ADC based on one of the first voltage, the third voltage, or the fourth voltage. The selection is based on whether the first voltage crosses the first static threshold voltage and based on whether the third voltage crosses a second static threshold voltage representing a storage capacity of the first photodiode. The controller is configured to provide the selected output to represent an intensity of the incident light received by the first photodiode.

In one aspect, the second capacitor includes a second main capacitor and a second auxiliary capacitor. Prior to the transfer of the second residual charge, the controller is configured to: disconnect the second auxiliary capacitor from the second main capacitor; and reset the second main capacitor. The second residual charge is transferred to the second main capacitor after the second main capacitor is reset to generate the second voltage. The ADC is configured to measure the quantity of the second residual charge stored in the second main capacitor based on comparing the second voltage at the second main capacitor with a first ramping threshold voltage. The ADC is configured to, after measuring a quantity of the second residual charge: connect the second auxiliary capacitor that stores a portion of the second overflow charge with the second main capacitor to generate a third voltage; and measure a quantity of the second overflow charge based on comparing the third voltage with a second ramping threshold voltage. The controller is configured select an output generated by ADC based on one of the second voltage or the third voltage. The selection is based on whether the second voltage crosses a static threshold voltage representing a storage capacity of the second photodiode. The controller is configured to provide the selected output to represent an intensity of the incident light received by the second photodiode.

In one aspect, the first photodiode is configured to detect a first component of the incident light having a first wavelength range. The second photodiode is configured to detect a second component of incident light having a second wavelength range.

In one aspect, the first wavelength range and the second wavelength range are identical.

In one aspect, the first photodiode and the second photodiode are part of a pixel cell.

In one aspect, the first photodiode and the second photodiode are part of, respectively, a first pixel cell and a second pixel cell.

In one aspect, the first pixel cell and the second pixel cell are part of a pixel cell array. The first pixel cell and the second pixel cell are separated by one or more pixel cells.

In one example, a method is provided. The method comprises: exposing a first photodiode to incident light to generate first charge; exposing a second photodiode to the incident light to generate second charge; converting, by a first charge sensing unit, the first charge to a first voltage; converting, by a second charge sensing unit, the second charge to a second voltage; controlling an ADC to detect, based on the first voltage, that a quantity of the first charge reaches a saturation threshold, and to measure a saturation time when the quantity of the first charge reaches the saturation threshold; stopping the exposure of the first photodiode and the second photodiode to the incident light based on detecting that the quantity of the first charge reaches the saturation threshold; and controlling the ADC to measure, based on the second voltage, a quantity of the second charge generated by the second photodiode before the exposure ends.

In one aspect, the first charge is generated by the first photodiode based on detecting a first component of the incident light having a first wavelength range. The second charge is generated by the second photodiode based on detecting a second component of the incident light having a second wavelength range. The first wavelength range and the second wavelength range are different.

BRIEF DESCRIPTION OF THE DRAWINGS

Illustrative examples are described with reference to the following figures.

FIG. 13A, FIG. 13B, and FIG. 13C illustrate examples of a multi-photodiode pixel cell and its operation.

Figure 1A:
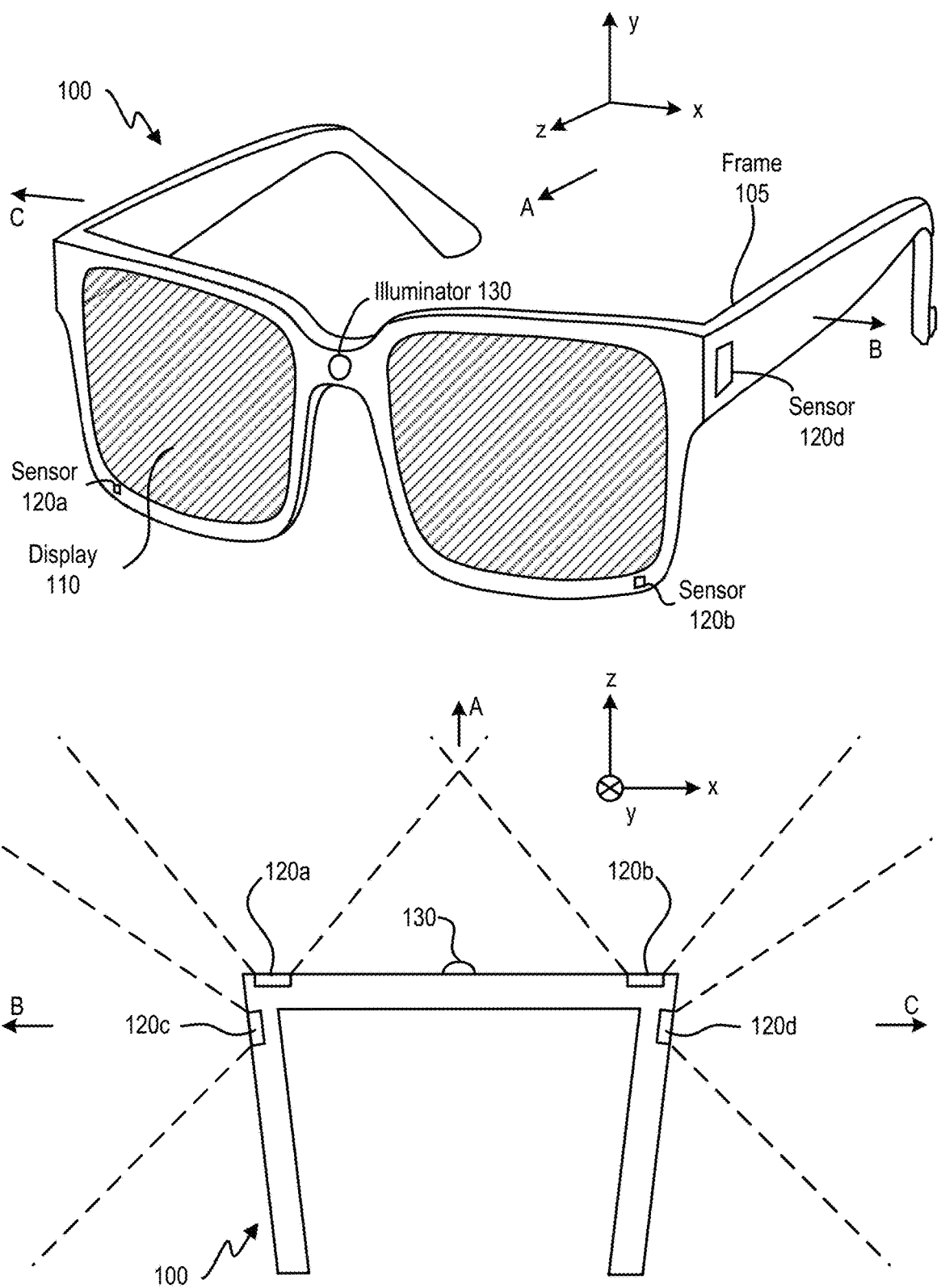
FIG. 1A and FIG. 1B are diagrams of an example of a near-eye display.

The figures depict examples of the present disclosure for purposes of illustration only. One skilled in the art will readily recognize from the following description that alternative examples of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive examples. However, it will be apparent that various examples may be practiced without these specific details. The figures and description are not intended to be restrictive.

A typical image sensor includes an array of pixel cells. Each pixel cell includes a photodiode to measure the intensity of incident light by converting photons into charge (e.g., electrons or holes). The charge generated by the photodiode can be converted to a voltage by a charge sensing unit, which can include a floating drain node. The voltage can be quantized by an analog-to-digital converter (ADC) into a digital value. The digital value can represent an intensity of light received by the pixel cell and can form a pixel, which can correspond to light received from a spot of a scene. An image comprising an array of pixels can be derived from the digital outputs of the array of pixel cells.

An image sensor can be used to perform different modes of imaging, such as 2D and 3D sensing. The 2D and 3D sensing can be performed based on light of different wavelength ranges. For example, visible light can be used for 2D sensing, whereas invisible light (e.g., infra-red light) can be used for 3D sensing. An image sensor may include an optical filter array to allow visible light of different optical wavelength ranges and colors (e.g., red, green, blue, monochrome, etc.) to a first set of pixel cells assigned for 2D sensing, and invisible light to a second set of pixel cells assigned for 3D sensing.

To perform 2D sensing, a photodiode at a pixel cell can generate charge at a rate that is proportional to an intensity of visible light component (e.g., red, green, blue, monochrome, etc.) incident upon the pixel cell, and the quantity of charge accumulated in an exposure period can be used to represent the intensity of visible light (or a certain color component of the visible light). The charge can be stored temporarily at the photodiode and then transferred to a capacitor (e.g., a floating diffusion) to develop a voltage. The voltage can be sampled and quantized by an analog-to-digital converter (ADC) to generate an output corresponding to the intensity of visible light. An image pixel value can be generated based on the outputs from multiple pixel cells configured to sense different color components of the visible light (e.g., red, green, and blue colors).

Moreover, to perform 3D sensing, light of a different wavelength range (e.g., infra-red light) can be projected onto an object, and the reflected light can be detected by the pixel cells. The light can include structured light, light pulses, etc. The pixel cells outputs can be used to perform depth sensing operations based on, for example, detecting patterns of the reflected structured light, measuring a time-of-flight of the light pulse, etc. To detect patterns of the reflected structured light, a distribution of quantities of charge generated by the pixel cells during the exposure time can be determined, and pixel values can be generated based on the voltages corresponding to the quantities of charge. For time-of-flight measurement, the timing of generation of the charge at the photodiodes of the pixel cells can be determined to represent the times when the reflected light pulses are received at the pixel cells. Time differences between when the light pulses are projected to the object and when the reflected light pulses are received at the pixel cells can be used to provide the time-of-flight measurement.

A pixel cell array can be used to generate information of a scene. In some examples, a subset (e.g., a first set) of the pixel cells within the array can detect visible components of light to perform 2D sensing of the scene, and another subset (e.g., a second set) of the pixel cells within the array can detect an infra-red component of the light to perform 3D sensing of the scene. The fusion of 2D and 3D imaging data are useful for many applications that provide virtual-reality (VR), augmented-reality (AR) and/or mixed reality (MR) experiences. For example, a wearable VR/AR/MR system may perform a scene reconstruction of an environment in which the user of the system is located. Based on the reconstructed scene, the VR/AR/MR can generate display effects to provide an interactive experience. To reconstruct a scene, a subset of pixel cells within a pixel cell array can perform 3D sensing to, for example, identify a set of physical objects in the environment and determine the distances between the physical objects and the user. Another subset of pixel cells within the pixel cell array can perform 2D sensing to, for example, capture visual attributes including textures, colors, and reflectivity of these physical objects. The 2D and 3D image data of the scene can then be merged to create, for example, a 3D model of the scene including the visual attributes of the objects. As another example, a wearable VR/AR/MR system can also perform a head tracking operation based on a fusion of 2D and 3D image data. For example, based on the 2D image data, the VR/AR/AR system can extract certain image features to identify an object. Based on the 3D image data, the VR/AR/AR system can track a location of the identified object relative to the wearable device worn by the user. The VR/AR/AR system can track the head movement based on, for example, tracking the change in the location of the identified object relative to the wearable device as the user's head moves.

To improve the correlation of 2D and 3D image data, an array of pixel cells can be configured to provide collocated imaging of different components of incident light from a spot of a scene. Specifically, each pixel cell can include a plurality of photodiodes, and a plurality of corresponding charge sensing units. Each photodiode of the plurality of photodiodes is configured to convert a different light component of incident light to charge. To enable the photodiodes to receive different light components of the incident light, the photodiodes can be formed in a stack which provides different absorption distances for the incident light for different photodiodes, or can be formed on a plane under an array of optical filters. Each charge sensing unit include one or more capacitors to sense the charge of the corresponding photodiode by converting the charge to a voltage, which can be quantized by an ADC to generate a digital representation of an intensity of an incident light component converted by each photodiode. The ADC includes a comparator. As part of a quantization operation, the comparator can compare the voltage with a reference to output a decision. The output of the comparator can control when a memory stores a value from a free-running counter. The value can provide a result of quantizing the voltage.

The ADC can quantize the voltages based on different quantization operations associated with different intensity ranges, which can increase the dynamic range of the light intensity measurement operation. Specifically, each photodiode can generate a quantity of charge within an exposure period, with the quantity of charge representing the incident light intensity. Each photodiode also has a quantum well to store at least some of the charge as residual charge. The quantum well capacity can be set based on a bias voltage on the switch between the photodiode and the charge sensing unit. For a low light intensity range, the photodiode can store the entirety of the charge as residual charge in the quantum well. In a PD ADC quantization operation, the ADC can quantize a first voltage generated by the charge sensing unit from sensing a quantity of the residual charge to provide a digital representation of the low light intensity. As the residual charge is typically much less susceptible to dark current in the photodiode, the noise floor of the low light intensity measurement can be lowered, which can further extend the lower limit of the dynamic range.

Moreover, for a medium light intensity range, the quantum well can be saturated by the residual charge, and the photodiode can transfer the remaining charge as overflow charge to the charge sensing unit, which can generate a second voltage from sensing a quantity of the overflow charge. In a FD ADC quantization operation, the ADC can quantize the second voltage to provide a digital representation of the medium light intensity. For both low and medium light intensities, the one or more capacitors in the charge sensing unit are not yet saturated, and the magnitudes of the first voltage and second voltage correlate with the light intensity. Accordingly for both low and medium light intensities, the comparator of the ADC can compare the first voltage or second voltage against a ramping voltage to generate a decision. The decision can control the memory to store a counter value which can represent a quantity of residual charge or overflow charge.

For a high light intensity range, the overflow charge can saturate the one or more capacitors in the charge sensing unit. As a result, the magnitudes of the second voltage no longer tracks the light intensity, and non-linearity can be introduced to the light intensity measurement. To reduce the non-linearity caused by the saturation of the capacitors, the ADC can perform a time-to-saturation (TTS) measurement operation by comparing the second voltage with a static threshold to generate a decision, which can control the memory to store a counter value. The counter value can represent a time when the second voltage reaches a saturation threshold. The time-to-saturation can represent the intensity of light in a range where the charge sensing unit is saturated and the value second voltage no longer reflects the intensity of light. With such arrangements, the upper limit of the dynamic range can be extended.

The comparator of the ADC typically occupies the largest space and consumes the most power among all other components of a pixel cell, especially when performing the multiple quantization operations described above. Therefore, to reduce power and pixel cell footprint, a single ADC can be shared among the multiple charge sensing units within a pixel cell. A controller of the pixel cell can control each charge sensing unit to take turn to connect to the single ADC to perform the TTS, FD ADC, and PD ADC operations, to generate a digital representation of the intensity of a light component of the incident light. Such arrangements, however, can substantially increase the total time of quantization operations of a pixel cell as well as the frame period required to generate an image frame, which can lead to a lower frame rate. This can degrade the image sensor's capability of providing high resolution images of high speed objects and/or scenes that change at a high speed and reduce the applications of the image sensor. To reduce the total time of the quantization operations for each photodiode, the controller can configure some of the photodiodes to perform only a subset of the TTS, FD ADC, and PD ADC operations. For example, the controller can connect the charge sensing unit of one of the photodiodes to the ADC, and control the ADC to perform the TTS, FD ADC, and PD ADC operations. The controller can then connect other charge sensing units of other photodiodes sequentially to the ADC, and control the ADC to perform only the PD ADC and FD ADC operations for the outputs of those charge sensing units. In addition to reducing the frame period, such arrangements can also ensure that all the photodiodes within the pixel cell have the same exposure period, which can improve shutter efficiency and reduce motion blurring and distortions when imaging a bright, fast moving object similar to a rolling shutter operation.

Although reducing the quantization operations of a subset of photodiodes of a pixel cell can reduce the total time of quantization operations of the pixel cell and increase the frame rate, such arrangements can reduce the upper limit of the dynamic range of the subset of photodiodes. Specifically, the capacitor of the charge sensing units of the subset of photodiodes can become saturated when the pixel cell is exposed to high intensity light components. But since no TTS operations are performed for those photodiodes, the quantization outputs of the ADC is linear only for the low and medium light intensity ranges. This reduces the measurable upper limit of the light intensity for those photodiodes and reduce their dynamic ranges. As a result, non-linearity can be introduced to the measurements of some or all light components of incident light by a pixel cell, which not degrades not only the collated 2D/3D imaging operations but also the global shutter operation of the pixel cell array.

This disclosure relates to an image sensor that can provide improved collocated 2D and 3D imaging operations, as well as improved global shutter operations, by addressing at least some of the issues above. Specifically, an image sensor may include a first photodiode, a second photodiode, a first charge sensing unit, a second charge sensing unit, and a controller. The first photodiode can generate first charge in response to a first component of incident light. The second photodiode can generate second charge in response to a second component of incident light. Each of first charge sensing unit and second charge sensing unit includes a capacitor, which can be formed by a floating drain, to store the charge generated by the photodiodes. The first charge sensing unit can share an ADC with the second charge sensing unit. Under the sharing scheme, the ADC is to perform a TTS operation on the output of the first charge sensing unit to measure a saturation time for a quantity of the first charge to reach a saturation threshold, followed by a PD ADC operation and/or a FD ADC operation to measure a quantity of the first charge. Moreover, the ADC is not to perform the TTS operation on the output of the second charge sensing unit, and only to perform the PD ADC and/or FD ADC operations on the output of the second charge sensing unit to measure a quantity of the second charge.

The controller can start an exposure period for the first photodiode and the second photodiode to generate, respectively, the first charge and the second charge. The image sensor may include a shutter switch coupled between each of the first photodiode and the second photodiode and a charge sink which can drain away the first charge and the second charge. The exposure period can be started based on disabling the shutter switches. The controller can control the ADC to perform the TTS operation on the output of the first charge sensing unit to detect saturation and to measure the saturation time. Upon detecting saturation, the controller can stop the exposure period of the first photodiode and the second photodiode based on enabling the switches. The controller can then control the ADC to perform the PD ADC and/or FD ADC operations on the output of the second charge sensing unit to measure the quantity of the second charge generated by the second photodiode within the exposure period. The controller can also control the ADC to perform the PD ADC and/or FD ADC operations on the output of first sensing unit to measure the quantity of the first charge generated by the first photodiode within the exposure period, after the TTS operation. The quantization outputs from the first photodiode and the second photodiode can form the same image frame, or the same set of frames (e.g., 2D and 3D frame) of the same frame period.

In some examples, the first photodiode and the second photodiode can be part of a kernel. A kernel can include multiple pixel cells and/or multiple photodiodes of a pixel cell. In a kernel, a group of photodiodes can share an ADC. All of the photodiodes within the group except the a master photodiode (e.g., the first photodiode) has access to an ADC to perform only PD ADC and/or FD ADC operations, whereas the master photodiode has access to an ADC to perform the TTS, as well as PD ADC and/or FD ADC operations. All the photodiodes within the group can have the same exposure period, which can be stopped when the charge sensing unit of the master photodiode is saturated. As a result, the quantization result of the charge sensing units of those photodiodes, based on PD ADC and/or FD ADC operations, can still represent the intensities of the light components with a reasonable fidelity. On the other hand, if there is no indication of saturation from the master photodiode, the photodiodes can generate at least a threshold quantity of charge within the pre-configured exposure period to maintain a minimum signal-to-noise ratio for measurements of low and medium light intensities, which can set the lower limit of the dynamic range.

The photodiodes of a kernel can be from different pixel cells or from the same pixel cell, and can be configured to detect the same or different light components. The grouping of photodiodes in a kernel can be based on various schemes and can be application specific. As an example, groups of pixels can be defined based on the contour/shape of a pre-determined object to be imaged (e.g., a pointed light source), and each group of the pixels can form a kernel. As another example, pixel cells that are likely to receive light components of similar intensity can form a kernel. Moreover, the spatial distribution of the photodiodes of the kernel within a pixel cell array can be based on the application of the image sensor. For example, if the image sensor images a small part of a scene, such that the received NIR light is concentrated at a small number of pixel cells, the kernel can include photodiodes of adjacent pixel cells. On the other hand, if the image sensor images a large part of a scene, such that the pattern of NIR light is sparsely distributed over the pixel cells, the kernel can include photodiodes of pixel cells that are spaced apart. In some examples, a kernel of photodiodes can also include photodiodes of the same pixel cell and configured to detect light components of different wavelength ranges. Such arrangements can be useful when the image sensor operates in an environment with strong ambient light and where each photodiode of a pixel cell can receive a high-intensity light component, and the charge sensing unit of each photodiode is likely to saturate. In all these cases, the photodiodes of a kernel can be configured to detect light of the same wavelength range or different wavelength ranges, With embodiments of the present disclosure, with each pixel cell having the same exposure period, a global shutter operation can be provided, while each pixel cell includes multiple photodiodes to detect different components of light from the same spot of a scene to support collated 2D and 3D imaging operations. Moreover, the photodiodes of the pixel cells are or organized into kernels, with each kernel of photodiodes sharing an ADC to perform quantization operations to reduce the size and power consumption of the pixel cell, while the exposure period of the photodiodes of each kernel can be dynamically adjusted to improve the linearity of the measurement operations as well as the dynamic range of the image sensor. All these can improve the performance of the image sensor.

The disclosed techniques may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some examples, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HIVID, a mobile device or computing system, or any other hardware platform capable of providing artificial reality content to one or more viewers.

FIG. 1A is a diagram of an example of a near-eye display 100. Near-eye display 100 presents media to a user. Examples of media presented by near-eye display 100 include one or more images, video, and/or audio. In some examples, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some examples, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some examples, display 110 comprises a waveguide display assembly for directing light from one or more images to an eye of the user.

Near-eye display 100 further includes image sensors 120a, 120b, 120c, and 120d. Each of image sensors 120a, 120b, 120c, and 120d may include a pixel array configured to generate image data representing different fields of views along different directions. For example, sensors 120a and 120*b* may be configured to provide image data representing two fields of view towards a direction A along the Z axis, whereas sensor 120*c* may be configured to provide image data representing a field of view towards a direction B along the X axis, and sensor 120*d* may be configured to provide image data representing a field of view towards a direction C along the X axis.

In some examples, sensors 120*a*-120*d* can be configured as input devices to control or influence the display content of the near-eye display 100, to provide an interactive VR/AR/MR experience to a user who wears near-eye display 100. For example, sensors 120*a*-120*d* can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some examples, the location tracking system may operate a SLAM algorithm to track a set of objects in the physical environment and within a view of field of the user as the user moves within the physical environment. The location tracking system can construct and update a map of the physical environment based on the set of objects, and track the location of the user within the map. By providing image data corresponding to multiple fields of views, sensors 120*a*-120*d* can provide the location tracking system a more holistic view of the physical environment, which can lead to more objects to be included in the construction and updating of the map. With such an arrangement, the accuracy and robustness of tracking a location of the user within the physical environment can be improved.

In some examples, near-eye display 100 may further include one or more active illuminators 130 to project light into the physical environment. The light projected can be associated with different frequency spectrums (e.g., visible light, infra-red light, ultra-violet light, etc.), and can serve various purposes. For example, illuminator 130 may project light in a dark environment (or in an environment with low intensity of infra-red light, ultra-violet light, etc.) to assist sensors 120*a*-120*d* in capturing images of different objects within the dark environment to, for example, enable location tracking of the user. Illuminator 130 may project certain markers onto the objects within the environment, to assist the location tracking system in identifying the objects for map construction/updating.

In some examples, illuminator 130 may also enable stereoscopic imaging. For example, one or more of sensors 120*a* or 120*b* can include both a first pixel array for visible light sensing and a second pixel array for infra-red (IR) light sensing. The first pixel array can be overlaid with a color filter (e.g., a Bayer filter), with each pixel of the first pixel array being configured to measure intensity of light associated with a particular color (e.g., one of red, green or blue colors). The second pixel array (for IR light sensing) can also be overlaid with a filter that allows only IR light through, with each pixel of the second pixel array being configured to measure intensity of IR lights. The pixel arrays can generate an RGB image and an IR image of an object, with each pixel of the IR image being mapped to each pixel of the RGB image. Illuminator 130 may project a set of IR markers on the object, the images of which can be captured by the IR pixel array. Based on a distribution of the IR markers of the object as shown in the image, the system can estimate a distance of different parts of the object from the IR pixel array, and generate a stereoscopic image of the object based on the distances. Based on the stereoscopic image of the object, the system can determine, for example, a relative position of the object with respect to the user, and can update the image data provided to display 100 based on the relative position information to provide the interactive experience.

As discussed above, near-eye display 100 may be operated in environments associated with a very wide range of light intensities. For example, near-eye display 100 may be operated in an indoor environment or in an outdoor environment, and/or at different times of the day. Near-eye display 100 may also operate with or without active illuminator 130 being turned on. As a result, image sensors 120*a*-120*d* may need to have a wide dynamic range to be able to operate properly (e.g., to generate an output that correlates with the intensity of incident light) across a very wide range of light intensities associated with different operating environments for near-eye display 100.

Figure 1B:
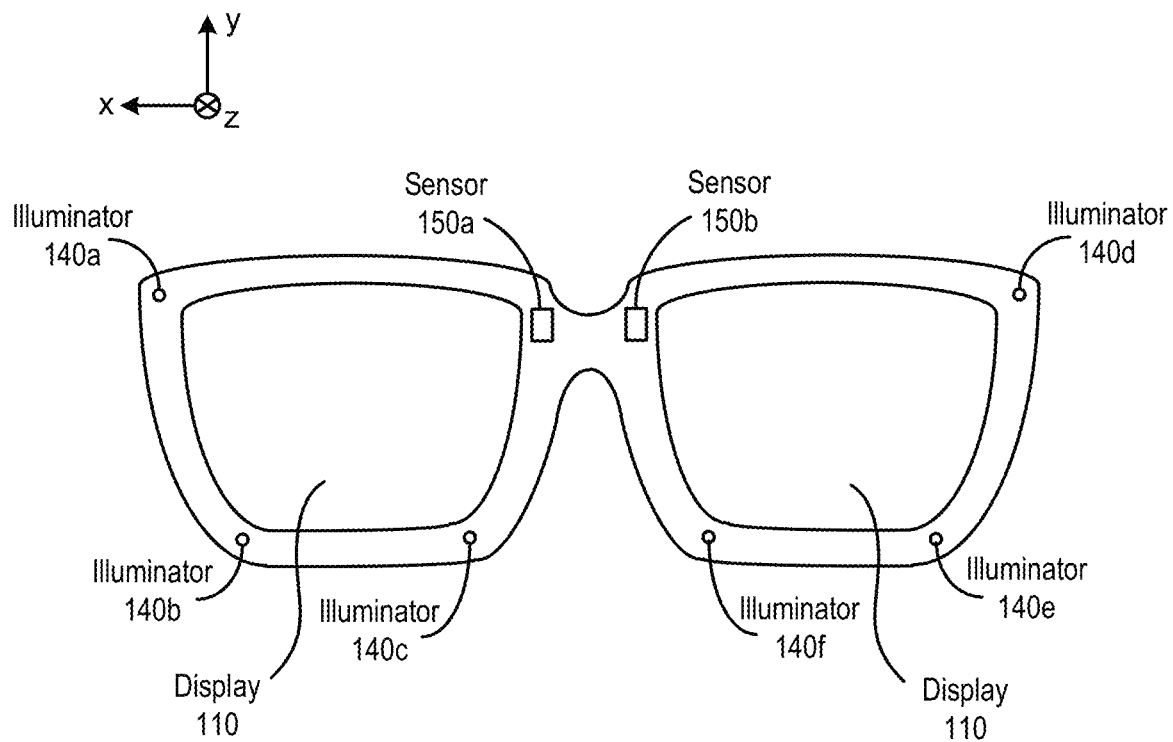

FIG. 1B is a diagram of another example of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140*a*, 140*b*, 140*c*, 140*d*, 140*e*, and 140*f*. Near-eye display 100 further includes a plurality of image sensors 150*a* and 150*b*. Illuminators 140*a*, 140*b*, and 140*c* may emit lights of certain frequency range (e.g., NIR) towards direction D (which is opposite to direction A of FIG. 1A). The emitted light may be associated with a certain pattern, and can be reflected by the left eyeball of the user. Sensor 150*a* may include a pixel array to receive the reflected light and generate an image of the reflected pattern. Similarly, illuminators 140*d*, 140*e*, and 140*f* may emit NIR lights carrying the pattern. The NIR lights can be reflected by the right eyeball of the user, and may be received by sensor 150*b*. Sensor 150*b* may also include a pixel array to generate an image of the reflected pattern. Based on the images of the reflected pattern from sensors 150*a* and 150*b*, the system can determine a gaze point of the user, and update the image data provided to display 100 based on the determined gaze point to provide an interactive experience to the user.

As discussed above, to avoid damaging the eyeballs of the user, illuminators 140*a*, 140*b*, 140*c*, 140*d*, 140*e*, and 140*f* are typically configured to output lights of very low intensities. In a case where image sensors 150*a* and 150*b* comprise the same sensor devices as image sensors 120*a*-120*d* of FIG. 1A, the image sensors 120*a*-120*d* may need to be able to generate an output that correlates with the intensity of incident light when the intensity of the incident light is very low, which may further increase the dynamic range requirement of the image sensors.

Moreover, the image sensors 120*a*-120*d* may need to be able to generate an output at a high speed to track the movements of the eyeballs. For example, a user's eyeball can perform a very rapid movement (e.g., a saccade movement) in which there can be a quick jump from one eyeball position to another. To track the rapid movement of the user's eyeball, image sensors 120*a*-120*d* need to generate images of the eyeball at high speed. For example, the rate at which the image sensors generate an image frame (the frame rate) needs to at least match the speed of movement of the eyeball. The high frame rate requires short total exposure time for all of the pixel cells involved in generating the image frame, as well as high speed for converting the sensor outputs into digital values for image generation. Moreover, as discussed above, the image sensors also need to be able to operate at an environment with low light intensity.

Figure 1B:
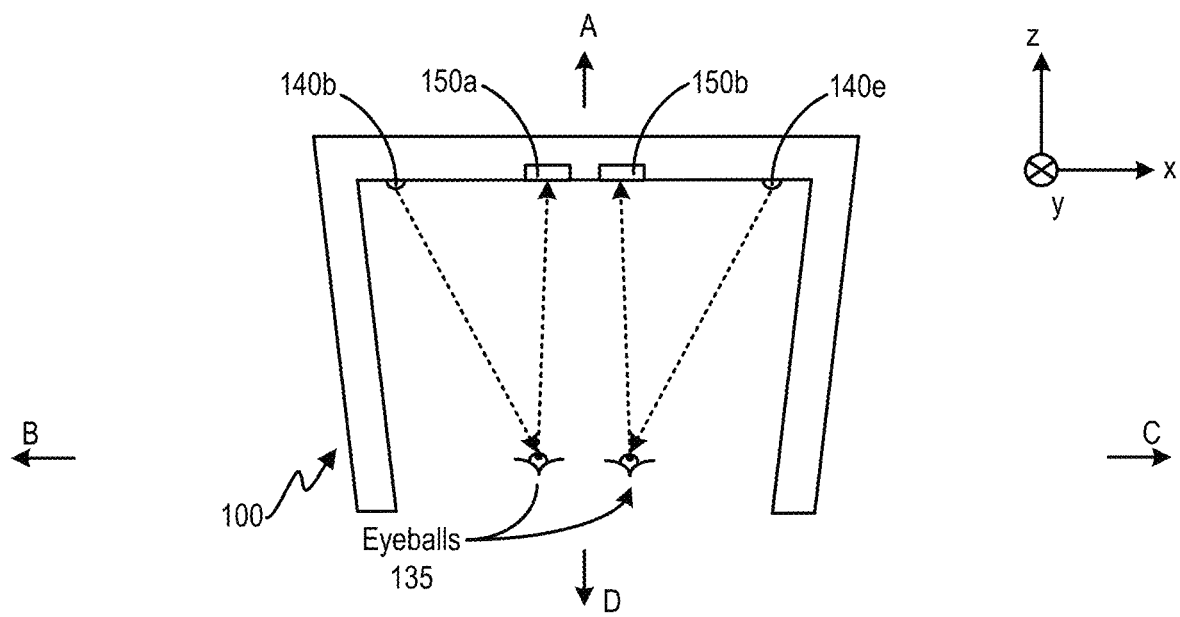
Figure 2:
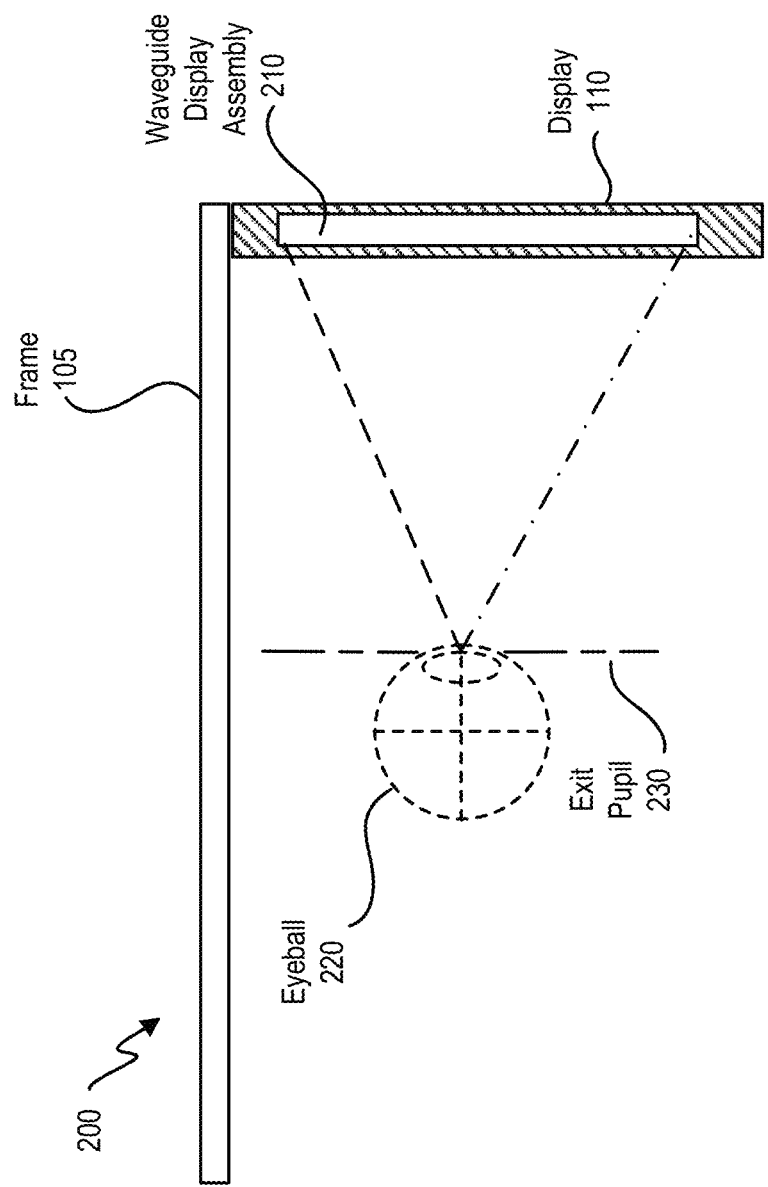
FIG. 2 is an example of a cross section of the near-eye display.

FIG. 2 is an example of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass, etc.) with one or more refractive indices. In some examples, near-eye display 100 includes one or more optical elements between waveguide display assembly 210 and eyeball 220.

In some examples, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate examples, waveguide display assembly 210 may include the stacked waveguide display and the varifocal waveguide display.

Figure 3:
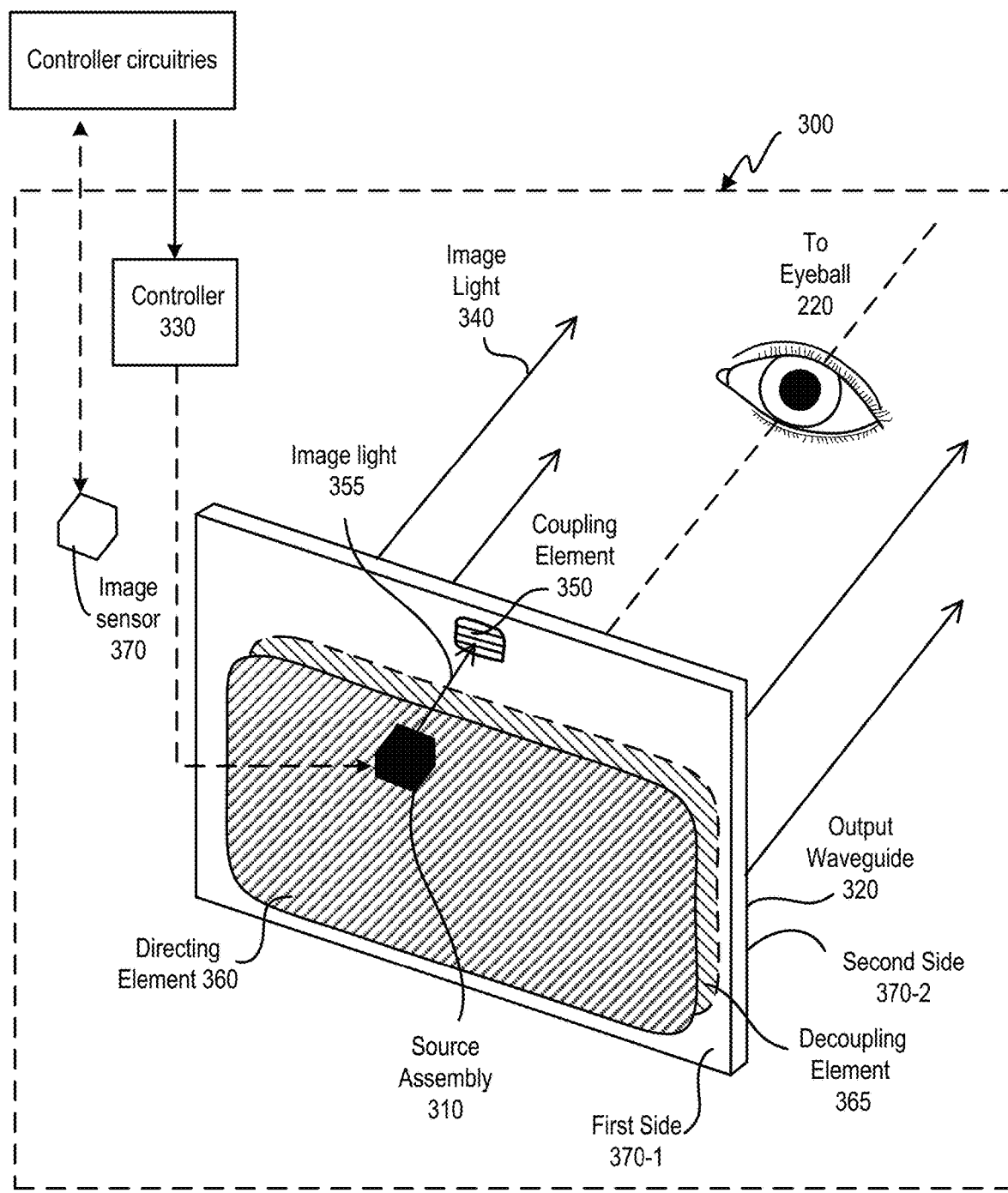
FIG. 3 illustrates an isometric view of an example of a waveguide display with a single source assembly.

FIG. 3 illustrates an isometric view of an example of a waveguide display 300. In some examples, waveguide display 300 is a component (e.g., waveguide display assembly 210) of near-eye display 100. In some examples, waveguide display 300 is part of some other near-eye display or other system that directs image light to a particular location.

Waveguide display 300 includes a source assembly 310, an output waveguide 320, and a controller 330. For purposes of illustration, FIG. 3 shows the waveguide display 300 associated with a single eyeball 220, but in some examples, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some examples, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some examples, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A to generate image data of a physical environment in front of the user (e.g., for location determination). Image sensor 370 may also be located on second side 370-2 and may include image sensors 150a and 150b of FIG. 1B to generate image data of eyeball 220 (e.g., for gaze point determination) of the user. Image sensor 370 may interface with a remote console that is not located within waveguide display 300. Image sensor 370 may provide image data to the remote console, which may determine, for example, a location of the user, a gaze point of the user, etc., and determine the content of the images to be displayed to the user. The remote console can transmit instructions to controller 330 related to the determined content. Based on the instructions, controller 330 can control the generation and outputting of image light 355 by source assembly 310.

Figure 4:
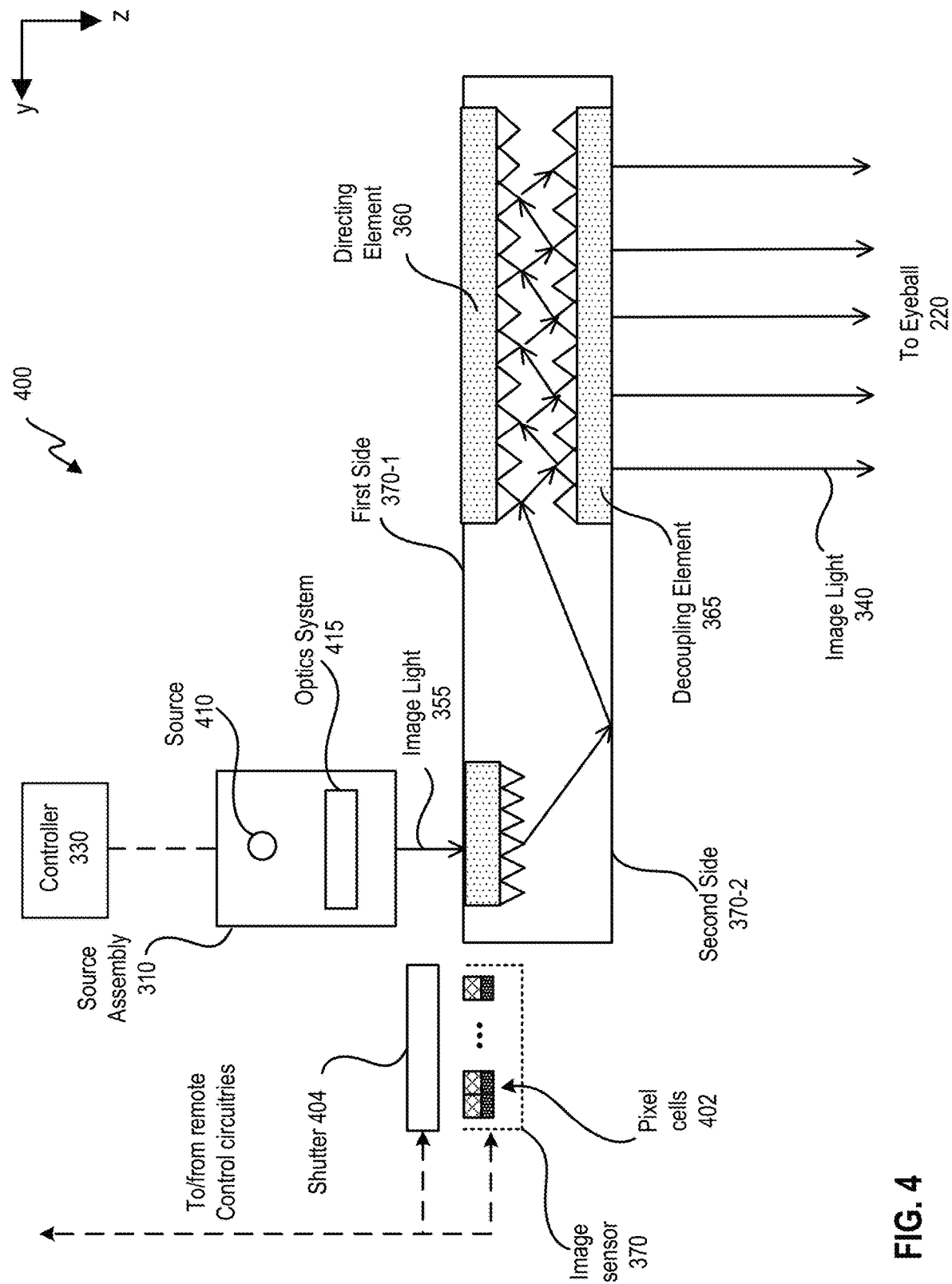
FIG. 4 illustrates a cross section of an example of the waveguide display.

FIG. 4 illustrates an example of a cross section 400 of the waveguide display 300. The cross section 400 includes source assembly 310, output waveguide 320, and image sensor 370. In the example of FIG. 4, image sensor 370 may include a set of pixel cells 402 located on first side 370-1 to generate an image of the physical environment in front of the user. In some examples, there can be a mechanical shutter 404 interposed between the set of pixel cells 402 and the physical environment to control the exposure of the set of pixel cells 402. In some examples, the mechanical shutter 404 can be replaced by an electronic shutter gate, as to be discussed below. Each of pixel cells 402 may correspond to one pixel of the image. Although not shown in FIG. 4, it is understood that each of pixel cells 402 may also be overlaid with a filter to control the frequency range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402, and generate image data based on an intensity distribution of the incident light samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode.

Optics system 415 includes one or more optical components that condition the light from source 410. Conditioning light from source 410 may include, e.g., expanding, collimating, and/or adjusting orientation in accordance with instructions from controller 330. The one or more optical components may include one or more lenses, liquid lenses, mirrors, apertures, and/or gratings. In some examples, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In examples where coupling element 350 is diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In examples where directing element 360 is a diffraction grating, the pitch of the diffraction grating is chosen to cause incident image light 355 to exit output waveguide 320 at angle(s) of inclination relative to a surface of decoupling element 365.

In some examples, directing element 360 and/or decoupling element 365 are structurally similar. Expanded image light 340 exiting output waveguide 320 is expanded along one or more dimensions (e.g., may be elongated along x-dimension). In some examples, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
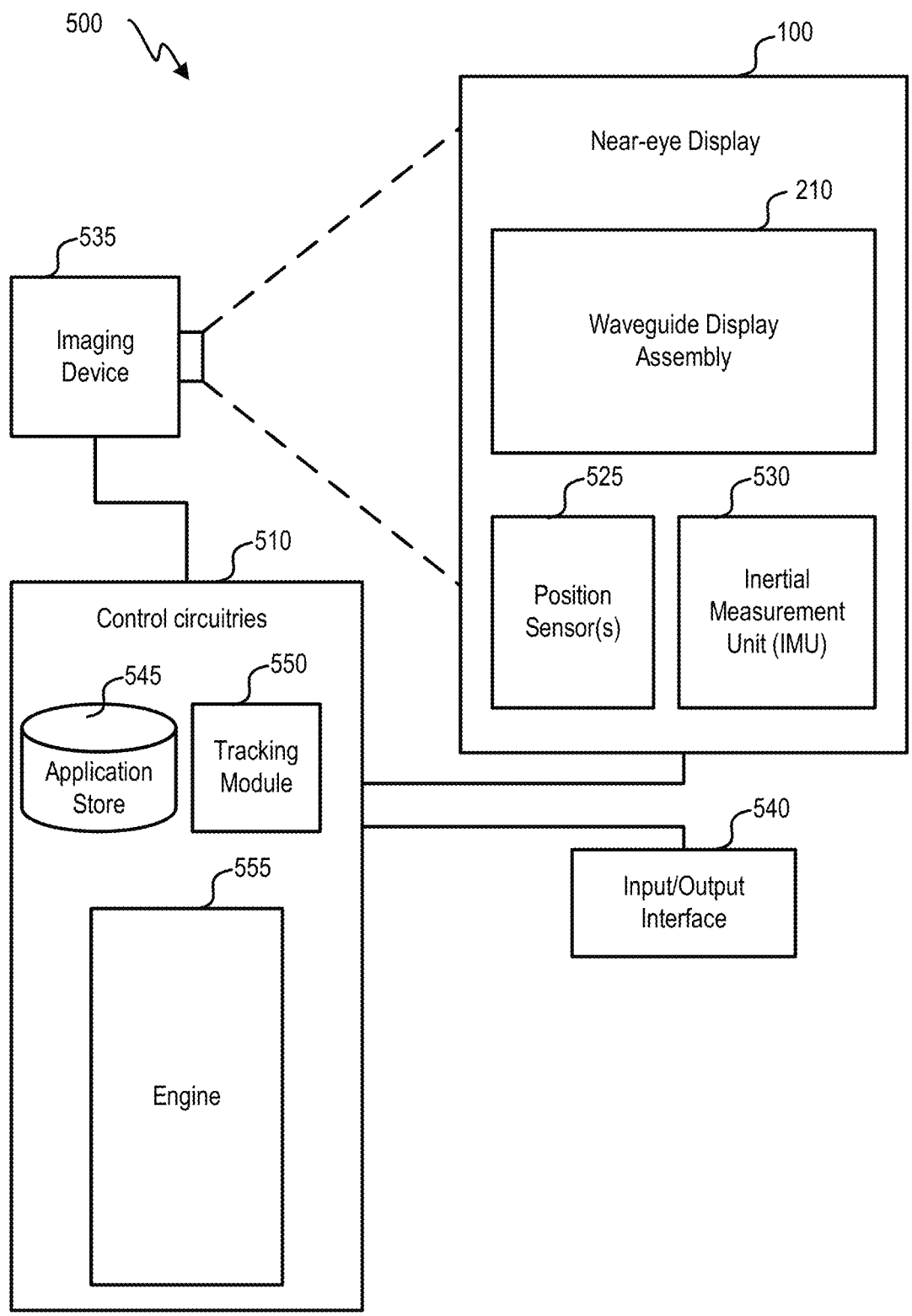
FIG. 5 is a block diagram of an example of a system including the near-eye display.

FIG. 5 is a block diagram of an example of a system 500 including the near-eye display 100. The system 500 comprises near-eye display 100, an imaging device 535, an input/output interface 540, and image sensors 120a-120d and 150a-150b that are each coupled to control circuitries 510. System 500 can be configured as a head-mounted device, a wearable device, etc.

Near-eye display 100 is a display that presents media to a user. Examples of media presented by the near-eye display 100 include one or more images, video, and/or audio. In some examples, audio is presented via an external device (e.g., speakers and/or headphones) that receives audio information from near-eye display 100 and/or control circuitries 510 and presents audio data based on the audio information to a user. In some examples, near-eye display 100 may also act as an AR eyewear glass. In some examples, near-eye display 100 augments views of a physical, real-world environment, with computer-generated elements (e.g., images, video, sound, etc.).

Near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100 based on measurement signals received from one or more of position sensors 525.

Imaging device 535 may generate image data for various applications. For example, imaging device 535 may generate image data to provide slow calibration data in accordance with calibration parameters received from control circuitries 510. Imaging device 535 may include, for example, image sensors 120a-120d of FIG. 1A for generating image data of a physical environment in which the user is located, for performing location tracking of the user. Imaging device 535 may further include, for example, image sensors 150a-150b of FIG. 1B for generating image data for determining a gaze point of the user, to identify an object of interest of the user.

The input/output interface 540 is a device that allows a user to send action requests to the control circuitries 510. An action request is a request to perform a particular action. For example, an action request may be to start or end an application or to perform a particular action within the application.

Control circuitries 510 provide media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions, that, when executed by a processor, generates content for presentation to the user. Examples of applications include: gaming applications, conferencing applications, video playback applications, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some examples, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), or a gaze point of the user (e.g., based on image data provided by imaging device 535), a distance between an object and user (e.g., based on image data provided by imaging device 535).

Figure 6:
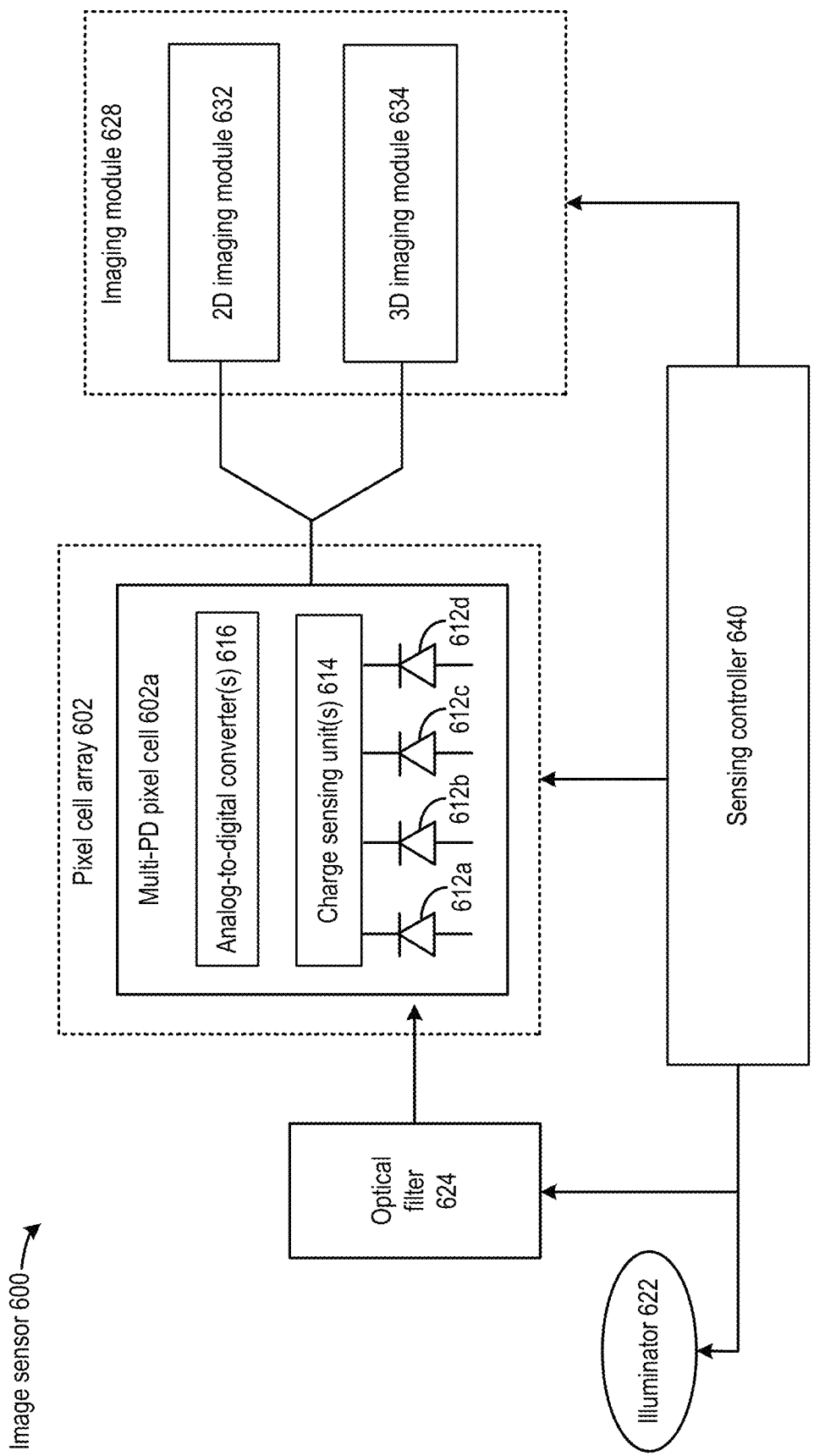
FIG. 6 illustrates block diagrams of an example of an image sensor.

FIG. 6 illustrates an example of an image sensor 600. Image sensor 600 can be part of near-eye display 100, and can provide 2D and 3D image data to control circuitries 510 of FIG. 5 to control the display content of near-eye display 100. As shown in FIG. 6, image sensor 600 may include an array of pixel cells 602 including pixel cell 602a. Pixel cell 602a can include a plurality of photodiodes 612 including, for example, photodiodes 612a, 612b, 612c, and 612d, one or more charge sensing units 614, and one or more analog-to-digital converters 616. The plurality of photodiodes 612 can convert different components of incident light to charge. For example, photodiode 612a-612c can correspond to different visible light channels, in which photodiode 612a can convert a visible blue component (e.g., a wavelength range of 450-490 nanometers (nm)) to charge. Photodiode 612b can convert a visible green component (e.g., a wavelength range of 520-560 nm) to charge. Photodiode 612c can convert a visible red component (e.g., a wavelength range of 635-700 nm) to charge. Moreover, photodiode 612d can convert an infra-red component (e.g., 700-1000 nm) to charge. Each of the one or more charge sensing units 614 can include a charge storage device and a buffer to convert the charge generated by photodiodes 612a-612d to voltages, which can be quantized by one or more ADCs 616 into digital values. The digital values generated from photodiodes 612a-612c can represent the different visible light components of a pixel, and each can be used for 2D sensing in a particular visible light channel. Moreover, the digital value generated from photodiode 612d can represent the infra-red light component of the same pixel and can be used for 3D sensing. Although FIG. 6 shows that pixel cell 602a includes four photodiodes, it is understood that the pixel cell can include a different number of photodiodes (e.g., two, three, etc.).

In addition, image sensor 600 also includes an illuminator 622, an optical filter 624, an imaging module 628, and a sensing controller 630. Illuminator 622 may be an infra-red illuminator, such as a laser, a light emitting diode (LED), etc., that can project infra-red light for 3D sensing. The projected light may include, for example, structured light, light pulses, etc. Optical filter 624 may include an array of filter elements overlaid on the plurality of photodiodes 612a-612d of each pixel cell including pixel cell 606a. Each filter element can set a wavelength range of incident light received by each photodiode of pixel cell 606a. For example, a filter element over photodiode 612a may transmit the visible blue light component while blocking other components, a filter element over photodiode 612b may transmit the visible green light component, a filter element over photodiode 612c may transmit the visible red light component, whereas a filter element over photodiode 612d may transmit the infra-red light component.

Image sensor 600 further includes an imaging module 628. Imaging module 628 may further include a 2D imaging module 632 to perform 2D imaging operations and a 3D imaging module 634 to perform 3D imaging operations. The operations can be based on digital values provided by ADCs 616. For example, based on the digital values from each of photodiodes 612a-612c, 2D imaging module 632 can generate an array of pixel values representing an intensity of an incident light component for each visible color channel, and generate an image frame for each visible color channel. Moreover, 3D imaging module 634 can generate a 3D image based on the digital values from photodiode 612d. In some examples, based on the digital values, 3D imaging module 634 can detect a pattern of structured light reflected by a surface of an object, and compare the detected pattern with the pattern of structured light projected by illuminator 622 to determine the depths of different points of the surface with respect to the pixel cells array. For detection of the pattern of reflected light, 3D imaging module 634 can generate pixel values based on intensities of infra-red light received at the pixel cells. As another example, 3D imaging module 634 can generate pixel values based on time-of-flight of the infra-red light transmitted by illuminator 622 and reflected by the object.

Figure 7A:
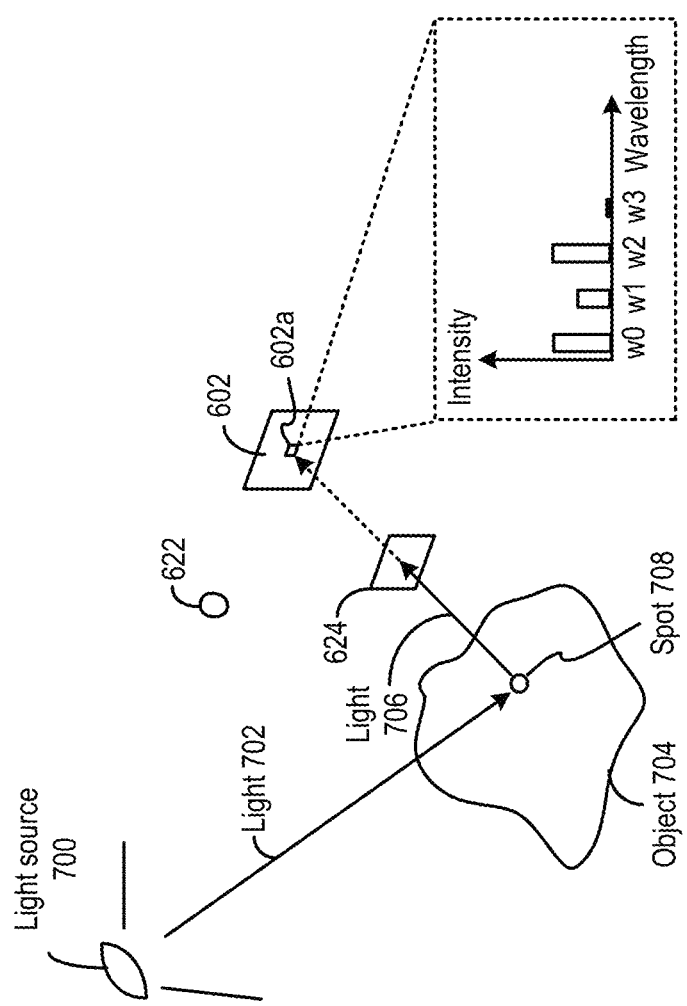
FIG. 7A, FIG. 7B, and FIG. 7C illustrate operations for determining light intensities of different ranges by example image sensor of FIG. 6.
Figure 7B:
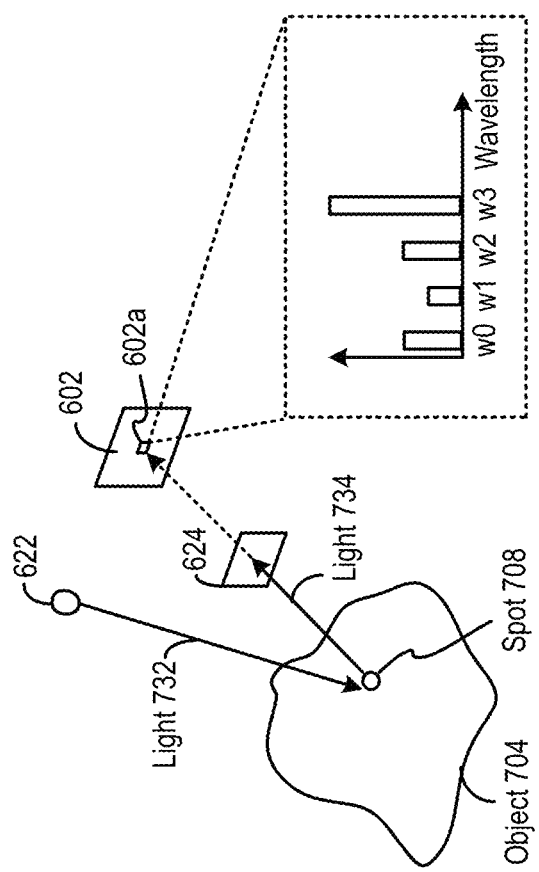
Figure 7C:
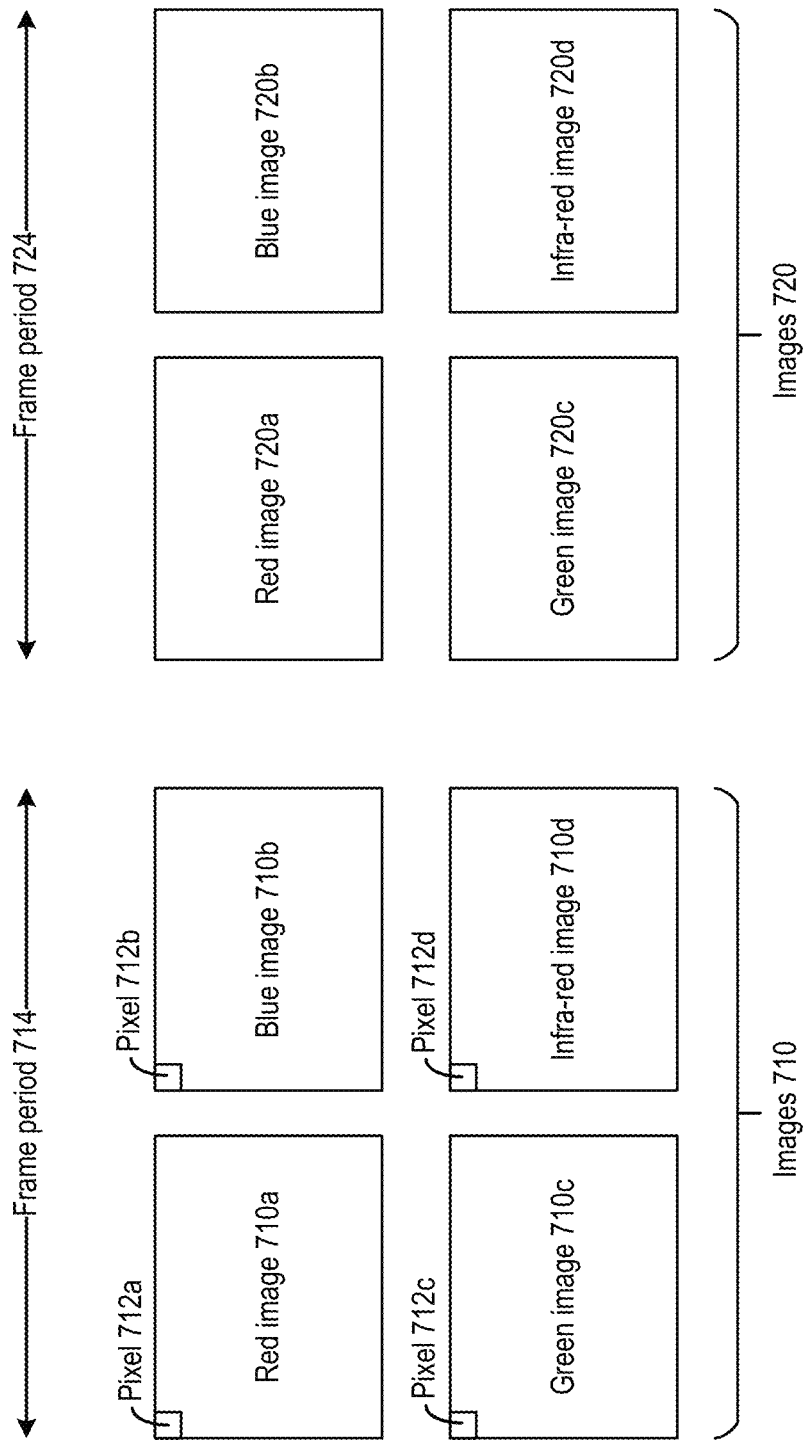

Image sensor 600 further includes a sensing controller 640 to control different components of image sensor 600 to perform 2D and 3D imaging of an object. Reference is now made to FIG. 7A-FIG. 7C, which illustrate examples of operations of image sensor 600 for 2D and 3D imaging. FIG. 7A illustrates an example of operations for 2D imaging. For 2D imaging, pixel cells array 602 can detect visible light in the environment including visible light reflected off an object. For example, referring to FIG. 7A, visible light source 700 (e.g., a light bulb, the sun, or other sources of ambient visible light) can project visible light 702 onto an object 704. Visible light 706 can be reflected off a spot 708 of object 704. Visible light 706 can also include the ambient infra-red light component. Visible light 706 can be filtered by optical filter array 624 to pass different components of visible light 706 of wavelength ranges w0, w1, w2, and w3 to, respectively, photodiodes 612a, 612b, 612c, and 612d of pixel cell 602a. Wavelength ranges w0, w1, w2, and w3 can correspond to, respectively, blue, green, red, and infra-red. As shown in FIG. 7A, as the infra-red illuminator 622 is not turned on, the intensity of infra-red component (w3) is contributed by the ambient infra-red light and can be very low. Moreover, different visible components of visible light 706 can also have different intensities. Charge sensing units 614 can convert the charge generated by the photodiodes to voltages, which can be quantized by ADCs 616 into digital values representing the red, blue, and green components of a pixel representing spot 708. Referring to FIG. 7C, after the digital values are generated, sensing controller 640 can control 2D imaging module 632 to generate, based on the digital values, sets of images including a set of images 710, which includes a red image frame 710a, a blue image frame 710b, and a green image frame 710c each representing one of red, blue, or green color image of a scene within a frame period 714. Each pixel from the red image (e.g., pixel 712a), from the blue image (e.g., pixel 712b), and from the green image (e.g., pixel 712c) can represent visible components of light from the same spot (e.g., spot 708) of a scene. A different set of images 720 can be generated by 2D imaging module 632 in a subsequent frame period 724. Each of red image (e.g., red images 710a, 720a, etc.), blue image (e.g., blue images 710b, 720b, etc.), and green images (e.g., green images 710c, 720c, etc.) can represent the image of a scene captured in a specific color channel and at a particular time, and can be provided to an application to, for example, extract image features from the specific color channel. As each image captured within a frame period can represent the same scene, while each corresponding pixel of the images is generated based on detecting light from the same spot of the scene, the correspondence of images between different color channels can be improved.

Furthermore, image sensor 600 can also perform 3D imaging of object 704. Referring to FIG. 7B, sensing controller 610 can control illuminator 622 to project infra-red light 732, which can include a light pulse, structured light, etc., onto object 704. Infra-red light 732 can have a wavelength range of 700 nanometers (nm) to 1 millimeter (mm). Infra-red light 734 can reflect off spot 708 of object 704 and can propagate towards pixel cells array 602 and pass through optical filter 624, which can provide the infra-red component (of wavelength range w3) to photodiode 612d to convert to charge. Charge sensing units 614 can convert the charge to a voltage, which can be quantized by ADCs 616 into digital values. Referring to FIG. 7C, after the digital values are generated, sensing controller 640 can control 3D imaging module 634 to generate, based on the digital values, an infra-red image 710d of the scene as part of images 710 captured within frame period 714. Moreover, 3D imaging module 634 can also generate an infra-red image 720d of the scene as part of images 720 captured within frame period 724. As each infra-red image can represent the same scene as other images captured within the same frame period albeit in a different channel (e.g., infra-red image 710d versus red, blue, and green images 710a-710c, infra-red image 720d versus red, blue, and green images 720a-720c, etc.), while each pixel of an infra-red image is generated based on detecting infra-red light from the same spot of the scene as other corresponding pixels in other images within the same frame period, the correspondence between 2D and 3D imaging can be improved as well.

Figure 8A:
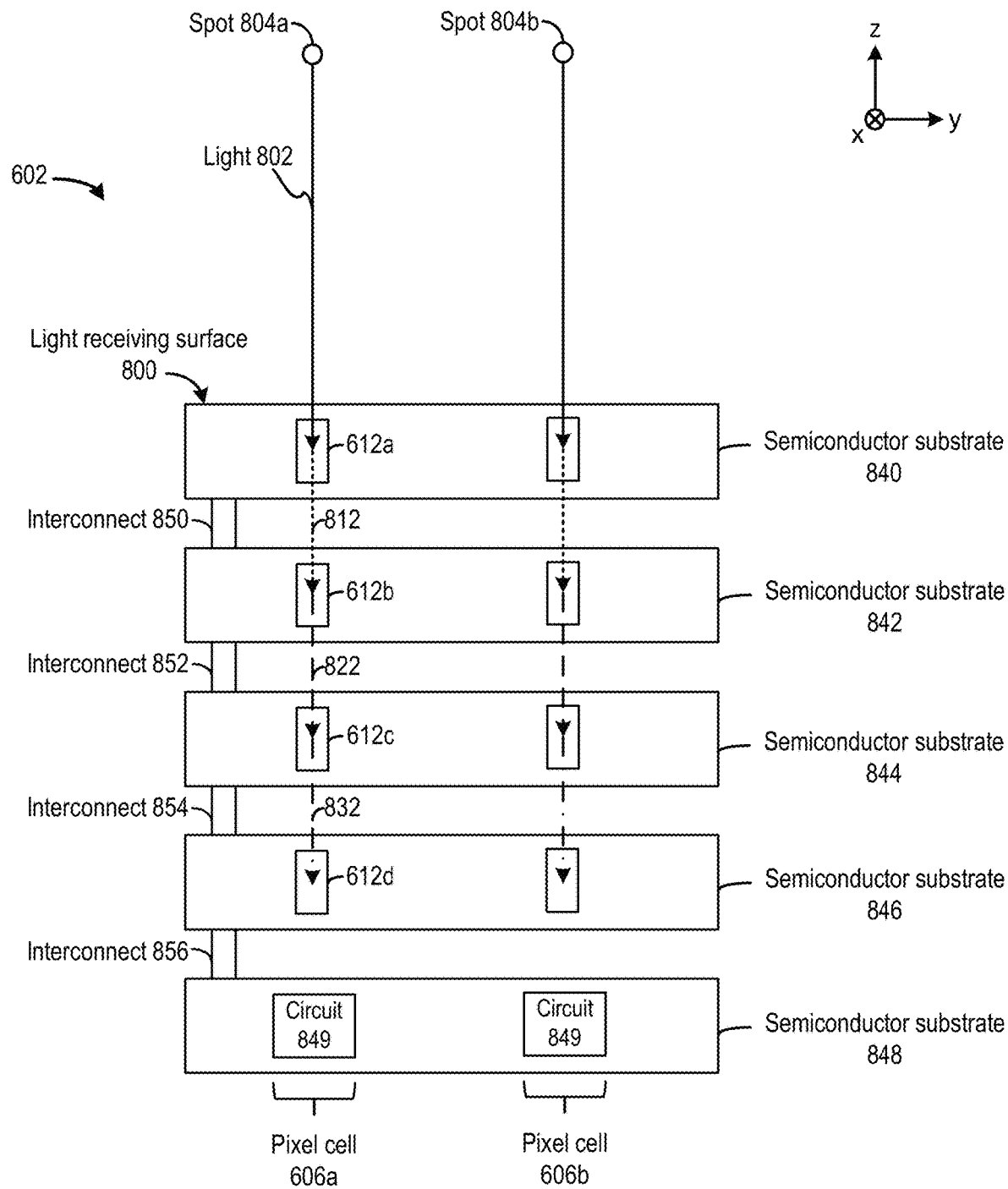
FIG. 8A, FIG. 8B, FIG. 8C, and FIG. 8D illustrate examples of internal components of an example pixel cell of the example image sensor of FIG. 6.

FIG. 8A-FIG. 8D illustrate examples of arrangements of photodiodes 612 in a pixel cell. As shown in FIG. 8A, the photodiodes 612a-612d in a pixel cell 602a can form a stack along an axis that is perpendicular to a light receiving surface 800 through which pixel cell 602a receives incident light 802 from a spot 804a. For example, the photodiodes 612a-612d can form a stack along a vertical axis (e.g., the z-axis) when the light receiving surface 800 is parallel with the x and y axes. Each photodiode can have a different distance from light receiving surface 800, and the distance can set the component of incident light 802 being absorbed and converted to charge by each photodiode. For example, photodiode 612a is closest to light receiving surface 800 and can absorb and convert the blue component to charge, which is of the shortest wavelength range among the other components. Light 812 includes the remaining components of light 802 (e.g., green, red, and infra-red) and can propagate to photodiode 612b, which can absorb and convert the green component. Light 822 includes the remaining components of light 812 (e.g., red and infra-red) and can propagate to photodiode 612c, which can absorb and convert the red component. The remaining infra-red component 832 can propagate to photodiode 612d to be converted to charge.

Each the photodiodes 612a, 612b, 612c, and 612d can be in a separate semiconductor substrate, which can be stacked to form image sensor 600. For example, photodiode 612a can be in a semiconductor substrate 840, photodiode 612b can be in a semiconductor substrate 842, photodiode 612c can be in a semiconductor substrate 844, whereas photodiode 612d can be in a semiconductor substrate 846. Each semiconductor substrate can include other photodiodes of other pixel cells, such as pixel cells 602b to receive light from spot 804b. Image sensor 600 can include another semiconductor substrate 848 which can include pixel cell processing circuits 849 which can include, for example, charge sensing units 614, ADCs 616, etc. Each semiconductor substrate can be connected to a metal interconnect, such as metal interconnects 850, 852, 854, and 856 to transfer the charge generated at each photodiode to processing circuit 849.

Figure 8B:
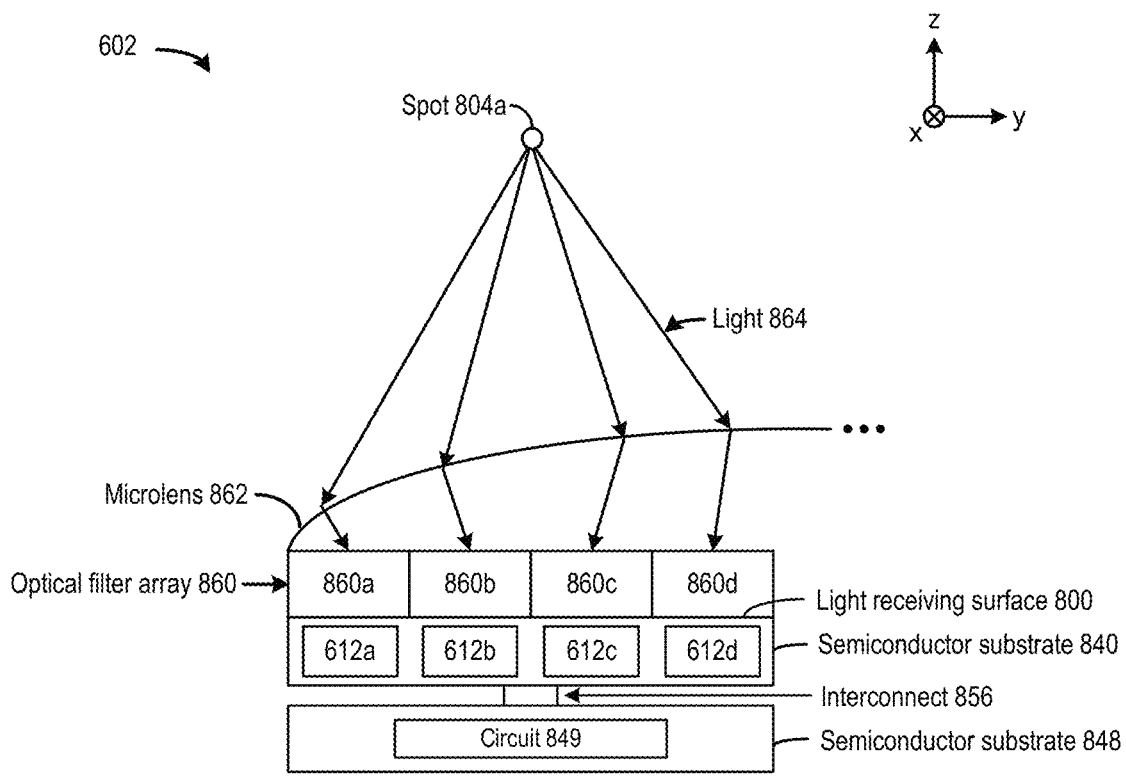
Figure 8B:
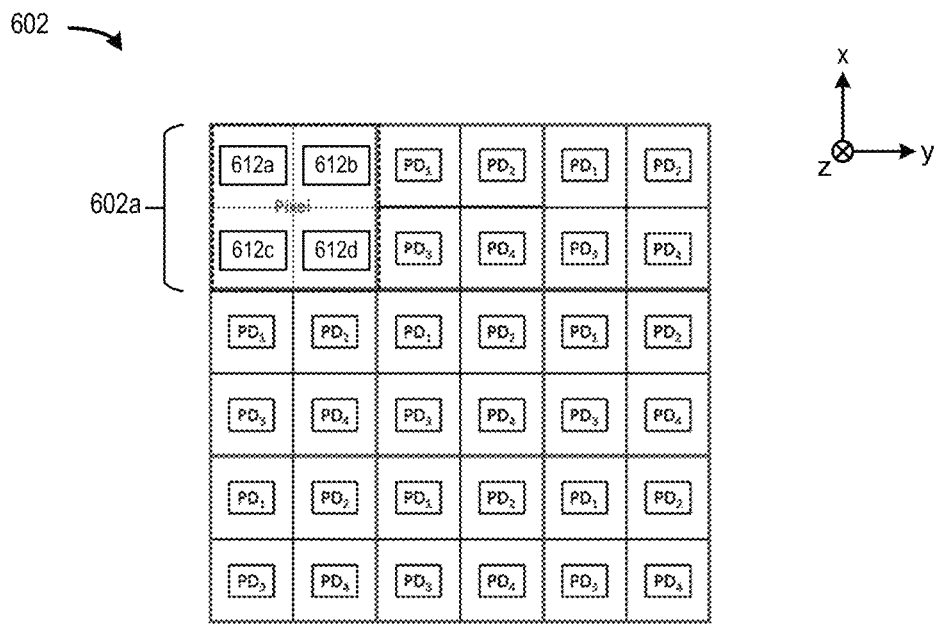
Figure 8C:
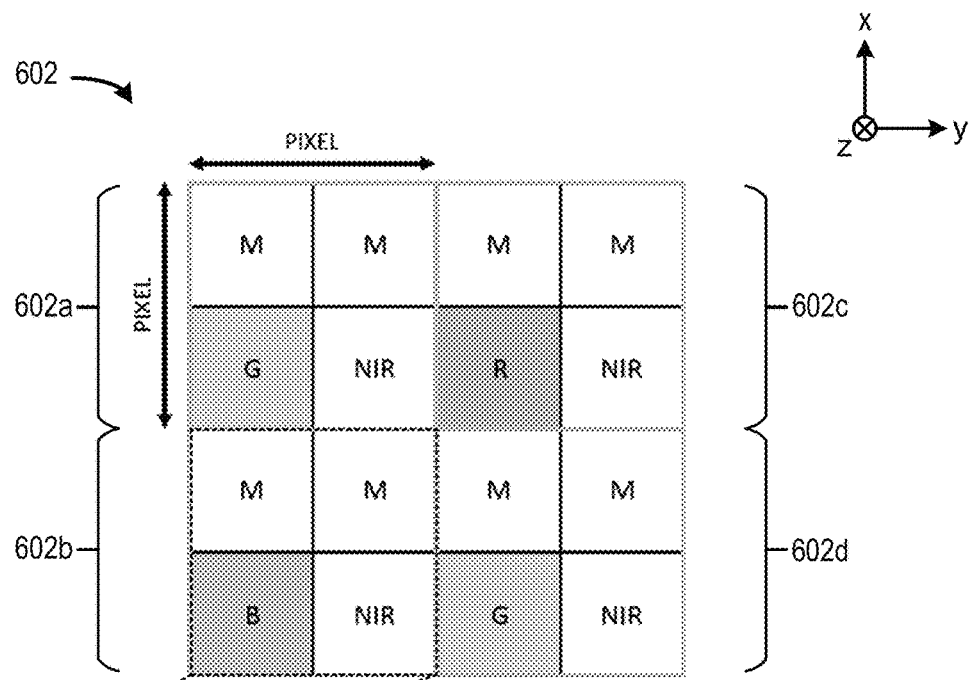
Figure 8C:
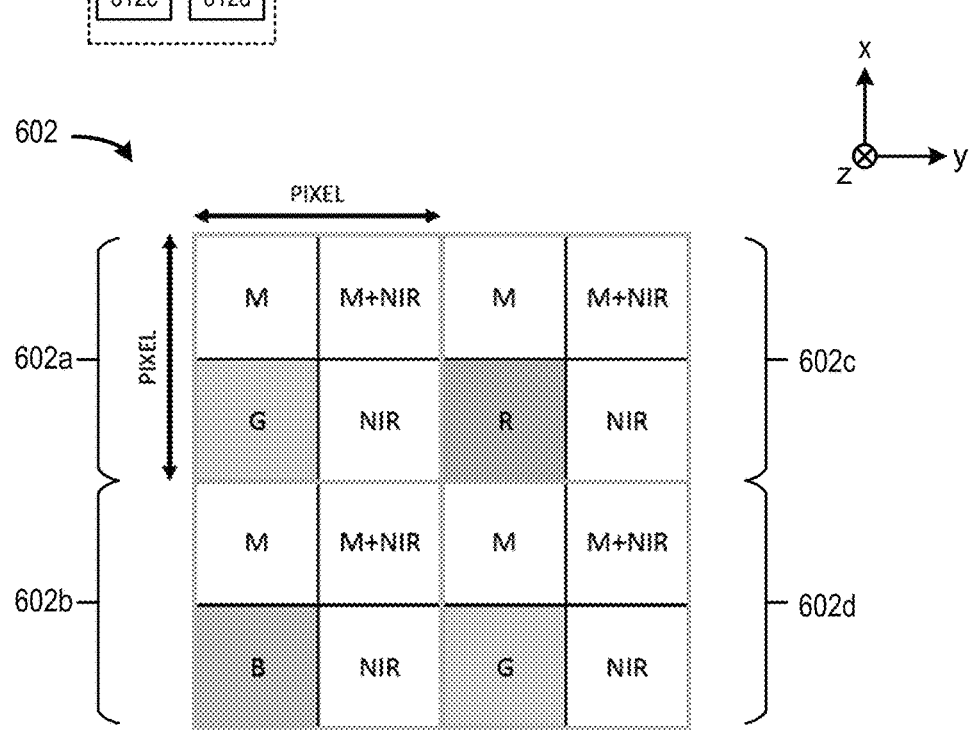
Figure 8D:
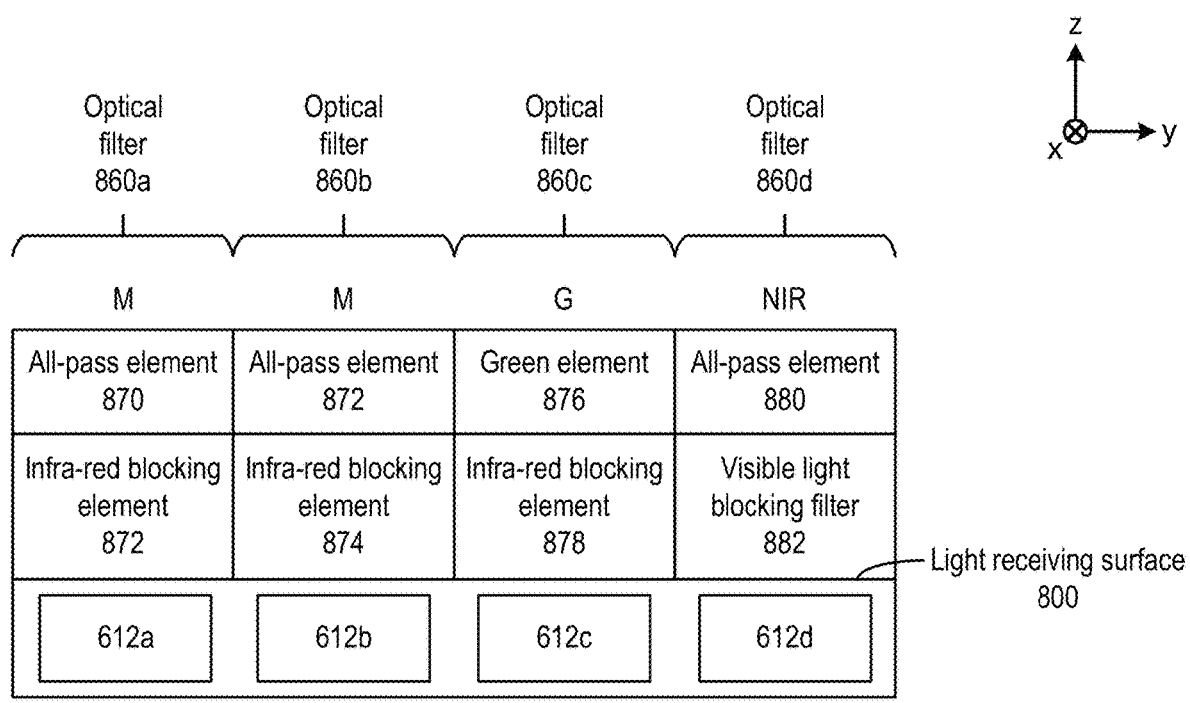
Figure 8D:
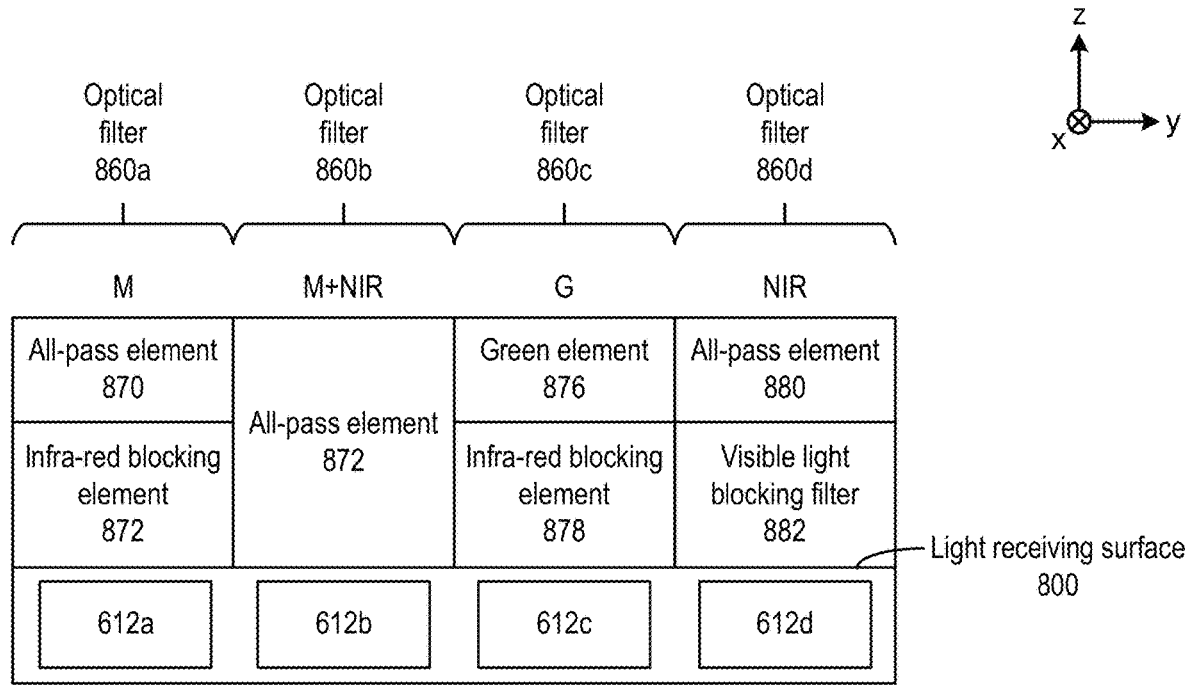

FIG. 8B-FIG. 8D illustrate other example arrangements of photodiodes 612. As shown in FIG. 8B-FIG. 8D, the plurality of photodiodes 612 can be arranged laterally parallel with light receiving surface 800. The top graph of FIG. 8B illustrates a side view of an example of pixel cell 602a, whereas the bottom graph of FIG. 8B illustrates a top view of pixel array 602 including pixel cell 602a. As shown in FIG. 8B, with light receiving surface 800 being parallel with the x and y axes, photodiodes 612a, 612b, 612c, and 612d can be arranged adjacent to each other also along the x and y axes in semiconductor substrate 840. Pixel cell 602a further includes an optical filter array 860 overlaid on the photodiodes. Optical filter array 860 can be part of optical filter 624. Optical filter array 860 can include a filter element overlaid on each of photodiodes 612a, 612b, 612c, and 612d to set a wavelength range of incident light component received by the respective photodiode. For example, filter element 860a is overlaid on photodiode 612a and can allow only visible blue light to enter photodiode 612a. Moreover, filter element 860b is overlaid on photodiode 612b and can allow only visible green light to enter photodiode 612b. Further, filter element 860c is overlaid on photodiode 612c and can allow only visible red light to enter photodiode 612c. Filter element 860d is overlaid on photodiode 612d and can allow only infra-red light to enter photodiode 612d. Pixel cell 602a further includes one or more microlens 862 which can project light 864 from a spot of a scene (e.g., spot 804a) via optical tiler array 860 to different lateral locations of light receiving surface 800, which allows each photodiode to become a sub-pixel of pixel cell 602a and to receive components of light from the same spot corresponding to a pixel. Pixel cell 602a can also include semiconductor substrate 848 which can include circuit 849 (e.g., charge sensing units 614, ADCs 616, etc.) to generate digital values from the charge generated by the photodiodes. Semiconductor substrates 840 and 848 can form a stack and can be connected with interconnect 856.

The arrangements of FIG. 8B, in which the photodiodes are arranged laterally and an optical filter array is used to control the light components received by the photodiodes, can offer numerous advantages. For example, the number of stacks and the number of semiconductor substrates can be reduced, which not only reduce the vertical height but also the interconnects among the semiconductor substrates. Moreover, relying on filter elements rather than the propagation distance of light to set the wavelength ranges of the components absorbed by each photodiode can offer flexibilities in selecting the wavelength ranges. As shown in top graph of FIG. 8C, pixel cells array 602 can include different optical filter arrays 860 for different pixel cells. For example, each pixel cell of pixel cells array 602 can have an optical filter array that provides monochrome channel of a wavelength range of 380-740 nm (labelled with "M") for photodiodes 612a and 612b, and an infra-red channel of a wavelength range of 700-1000 nm (labelled with "NIR") for photodiode 612d. But the optical filter arrays may also provide a different visible color channel for the different pixel cells. For example, the optical filter arrays 860 for pixel cells array 602a, 602b, 602c, and 602d may provide, respectively, a visible green channel (labelled with "G"), a visible red channel (labelled with "R"), a visible blue channel (labelled with "B"), and a visible green channel for photodiode 612c of the pixel cells arrays. As another example, as shown in the bottom graph of FIG. 8C, each optical filter array 860 can provide a monochrome and infra-red channel (labelled "M+NIR") which spans a wavelength range of 380-1000 nm for photodiode 612b of each pixel cells array.

FIG. 8D illustrates examples of optical filter array 860 to provide the example channels shown in FIG. 8C. As shown in FIG. 8D, optical filter array 860 can include a stack of optical filters to select a wavelength range of light received by each photodiode within a pixel cell array. For example, referring to the top graph of FIG. 8D, optical filter 860a can include an all-pass element 870 (e.g., a transparent glass that passes both visible light and infra-red light) and an infra-red blocking element 872 forming a stack to provide a monochrome channel for photodiode 612a. Optical filter 860b can also include an all-pass element 874 and an infra-red blocking element 876 to also provide a monochrome channel for photodiode 612b. Further, optical filter 860c can include a green-pass element 876 which passes green visible light (but reject other visible light component), and an infra-red blocking element 878, to provide a green channel for photodiode 612c. Lastly, optical filter 860d can include an all-pass element 880 and a visible light blocking filter 882 (which can block out visible light but allows infra-red light to go through) to provide an infra-red channel for photodiode 612d. In another example, as shown in the bottom graph of FIG. 8D, optical filter 860b can include only all-pass element 872 to provide a monochrome and infra-red channel for photodiode 612b.

Figure 9A:
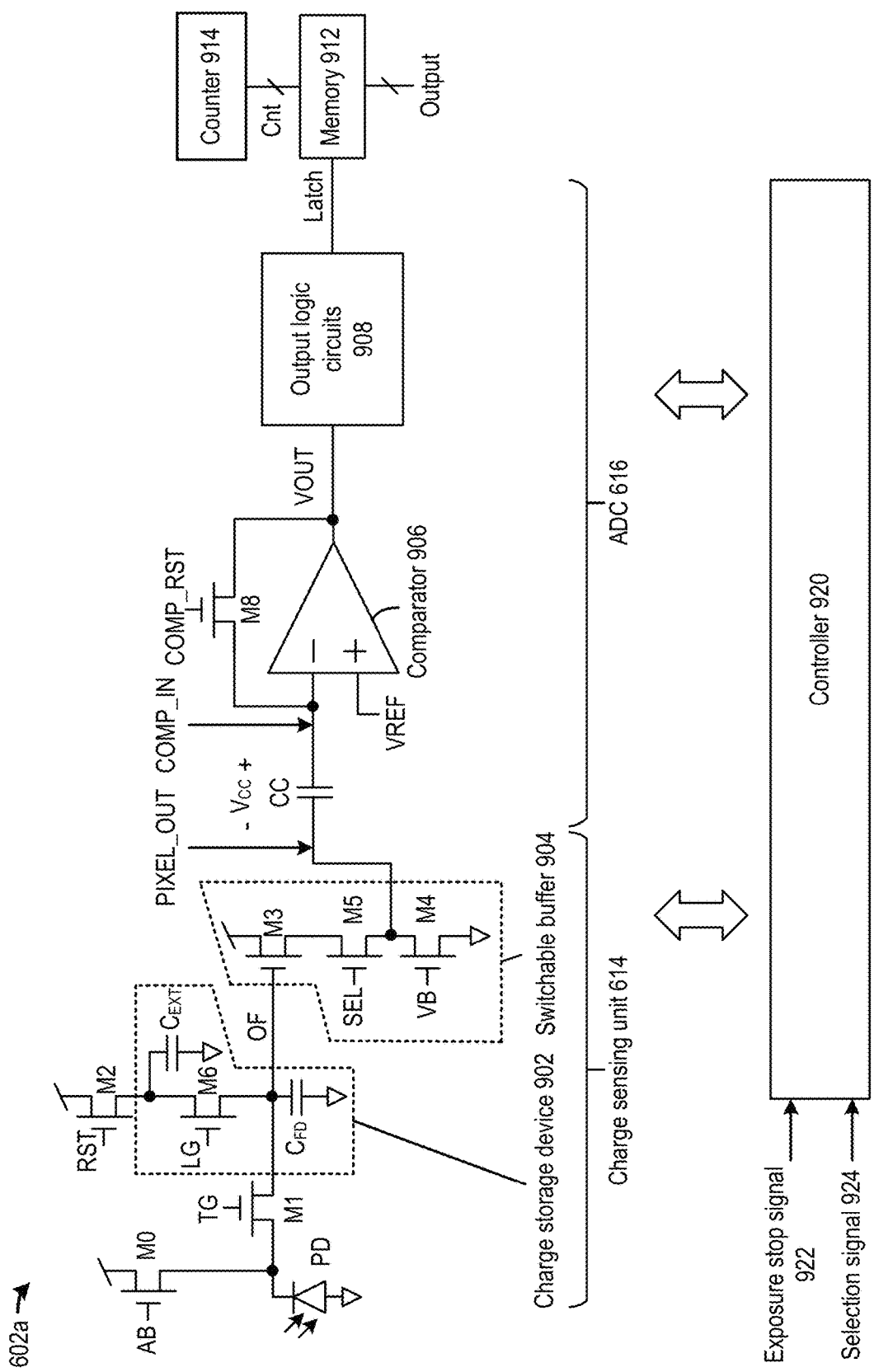
FIG. 9A and FIG. 9B illustrate examples of internal components of the example pixel cells of FIG. 8A, FIG. 8B, FIG. 8C, and FIG. 8D.
Figure 9B:
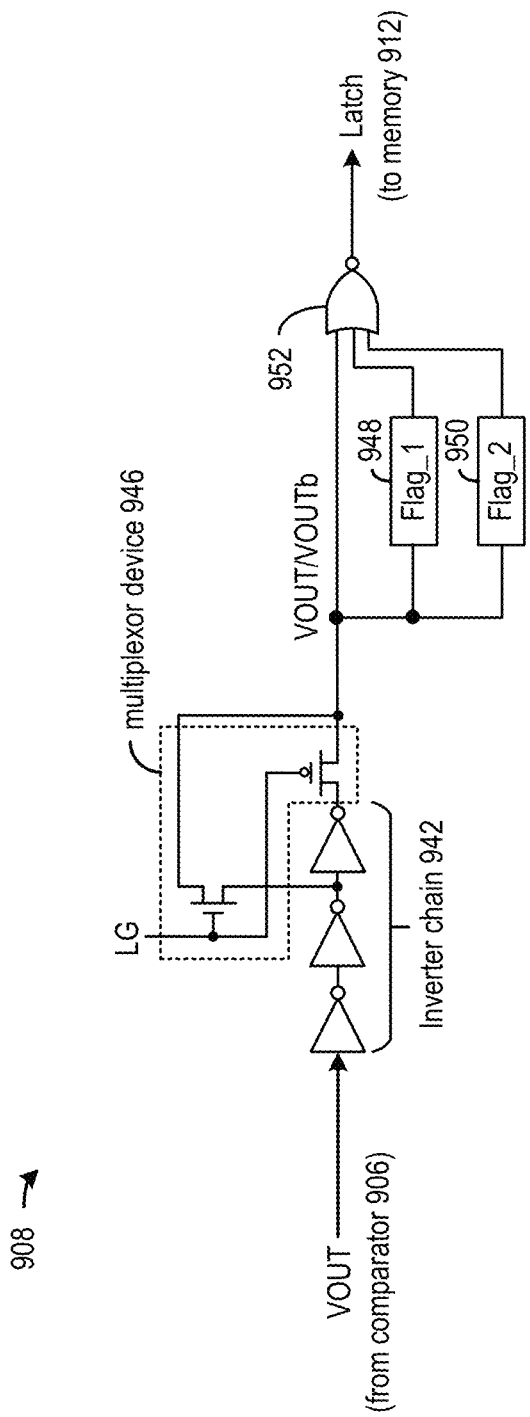

Reference is now made to FIG. 9A and FIG. 9B, which illustrates additional components of pixel cell 602a including an example of charge sensing unit 614 and ADC 616. As shown in FIG. 9A, pixel cell 602a can include a photodiode PD (e.g., photodiode 612a), a shutter switch M0, a transfer switch M1, a charge sensing unit 614 comprising a charge storage device 902 and a switchable buffer 904, and an ADC 616 comprising a CC capacitor, a comparator 906, and output logic circuits 908. The output of comparator 906 is coupled, via output logic circuits 908, with a memory 912 and a counter 914 which can be internal to or external to pixel cell 602a. Pixel cell 602 further includes a controller 920 to control the switches, charge sensing unit 614, as well as ADC 616. As to be described below, controller 920 can enable photodiode PD to accumulate charge based on incident light within a pre-configured exposure period. Controller 920 can also stop the exposure period earlier than as pre-configured, based on an exposure stop signal 922. Moreover, within the exposure period, controller 920 can control charge sensing unit 614 and ADC 616 to perform multiple quantization operations associated with different light intensity ranges to generate a digital representation of the intensity of the incident light. Controller 920 can receive a selection signal 924 to select which of the multiple quantization operations to be performed (and which is to be skipped). The selection can come from a host device which hosts an application that uses the digital representation of incident light intensity. Output logic circuits 908 can determine which quantization operation output is to be stored in memory 912 and/or to be output as a pixel value. Controller 920 can be internal to pixel cell 602a or part of sensing controller 640. Each switch can be a transistor such as, for example, a metal-oxide-semiconductor field-effect transistor (MOSFET), a bipolar junction transistor (BJT), etc.

Specifically, shutter switch M0 can be disabled by an AB signal provided by controller 920 to start an exposure period, in which the photodiode PD can generate and accumulate charge in response to incident light. Transfer switch M1 can be controlled by a TG signal provided by controller 920 to transfer some of the charge to charge storage device 902. In one quantization operation, transfer switch M1 can be biased at a partially-on state to set a quantum well capacity of photodiode PD, which also sets a quantity of residual charge stored at the photodiode PD. After the photodiode PD is saturated by the residual charge, overflow charge can flow through transfer switch M1 to charge storage device 902. In another quantization operation, transfer switch M1 can be fully turned on to transfer the residual charge from the photodiode PD to charge storage device for measurement.

Charge storage device 902 has a configurable capacity and can convert the charge transferred from switch M1 to a voltage at the OF node. Charge storage device 902 includes a $C_{FD}$ capacitor (e.g., a floating drain) and a $C_{EXT}$ capacitor (e.g., an MOS capacitor) connected by a M6 switch. M6 switch can be enabled by a LG signal to expand the capacity of charge storage device 902 by connecting $C_{FD}$ and $C_{EXT}$ capacitors in parallel, or to reduce the capacity by disconnecting the capacitors from each other. The capacity of charge storage device 902 can be reduced for measurement of residual charge to increase the charge-to-voltage gain and to reduce the quantization error. Moreover, the capacity of charge storage device 902 can also be increased for measurement of overflow charge to reduce the likelihood of saturation and to improve non-linearity. As to be described below, the capacity of charge storage device 902 can be adjusted for measurement of different light intensity ranges. Charge storage device 902 is also coupled with a reset switch M2 which can be controlled by a reset signal RST, provided by controller 920, to reset $C_{FD}$ and $C_{EXT}$ capacitors between different quantization operations.

Switchable buffer 904 can be include a switch M3 configured as a source follower to buffer the voltage at the OF node to improve its driving strength. The buffered voltage can be at the input node PIXEL_OUT of ADC 616. The M4 transistor provides a current source for switchable buffer 904 and can be biased by a VB signal. Switchable buffer 904 also includes a switch M5 which be enabled or disabled by a SEL signal. When switch M5 is disabled, source follower M3 can be disconnected from the PIXEL_OUT node. As to be described below, pixel cell 602a may include multiple charge sensing units 614 each including a switchable buffer 904, and one of the charge sensing units can be coupled with PIXEL_OUT (and ADC 616) at one time based on the SEL signal.

Figure 10:
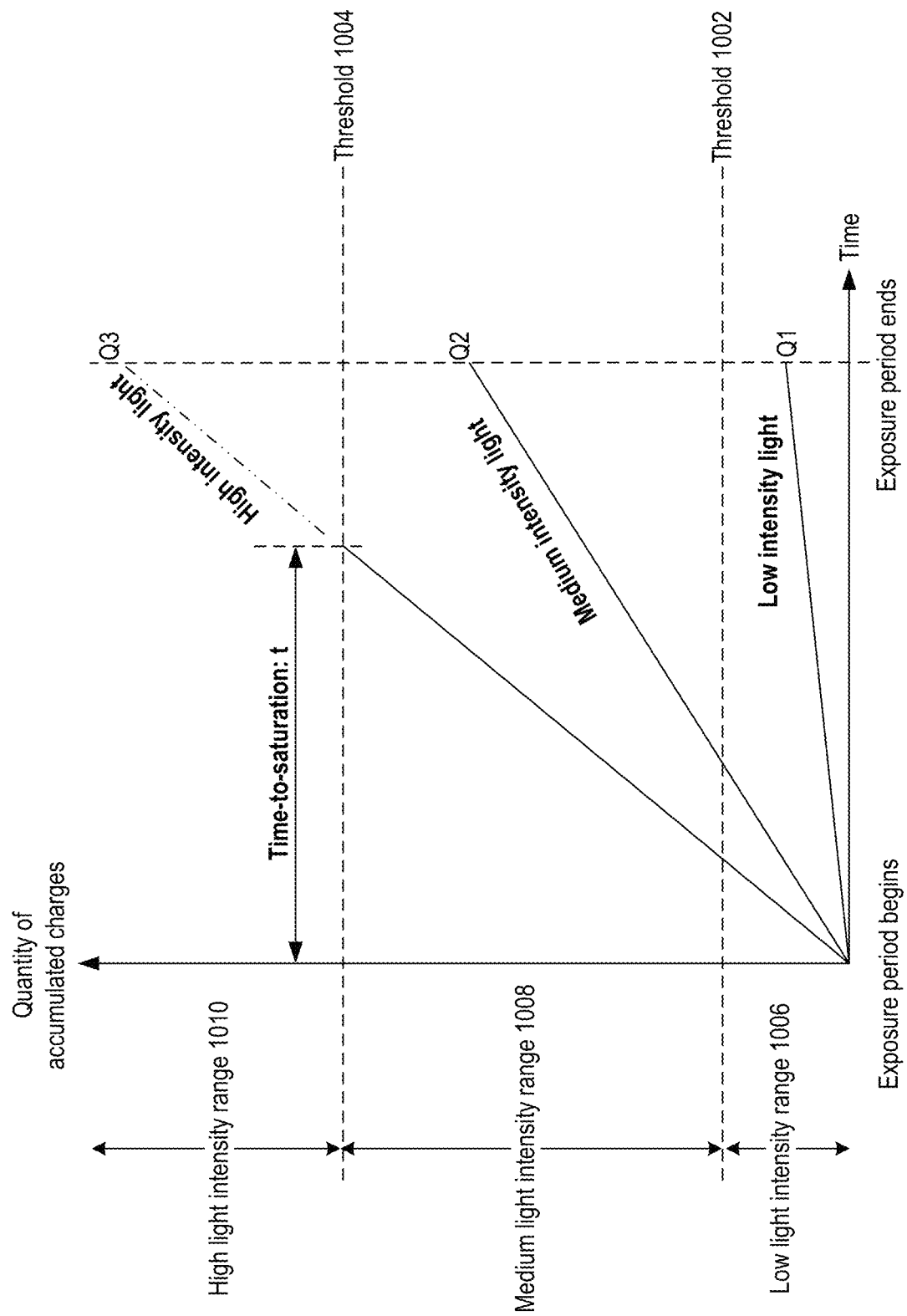
FIG. 10 illustrates an example of ranges of light intensity to be measured by the disclosed techniques.

As described above, charge generated by photodiode PD within an exposure period can be temporarily stored in charge storage device 902 and converted to a voltage. The voltage can be quantized to represent an intensity of the incident light based on a pre-determined relationship between the charge and the incident light intensity. Reference is now made to FIG. 10, which illustrates a quantity of charge accumulated with respect to time for different light intensity ranges. The total quantity of charge accumulated at a particular time point can reflect the intensity of light incident upon photodiode PD of FIG. 6 within an exposure period. The quantity can be measured when the exposure period ends. A threshold 1002 and a threshold 1004 can be defined for a threshold's quantity of charge defining a low light intensity range 1006, a medium light intensity range 1008, and a high light intensity range 1010 for the intensity of the incident light. For example, if the total accumulated charge is below threshold 1002 (e.g., Q1), the incident light intensity is within low light intensity range 1006. If the total accumulated charge is between threshold 1004 and threshold 1002 (e.g., Q2), the incident light intensity is within medium light intensity range 1008. If the total accumulated charge is above threshold 1004, the incident light intensity is within medium light intensity range 1010. The quantity of the accumulated charge, for low and medium light intensity ranges, can correlate with the intensity of the incident light, if the photodiode does not saturate within the entire low light intensity range 1006 and the measurement capacitor does not saturate within the entire medium light intensity range 1008.

The definitions of low light intensity range 1006 and medium light intensity range 1008, as well as thresholds 1002 and 1004, can be based on the full well capacity of photodiode PD and the capacity of charge storage device 902. For example, low light intensity range 706 can be defined such that the total quantity of residual charge stored in photodiode PD, at the end of the exposure period, is below or equal to the storage capacity of the photodiode, and threshold 1002 can be based on the full well capacity of photodiode PD. Moreover, medium light intensity range 1008 can be defined such that the total quantity of charge stored in charge storage device 902, at the end of the exposure period, is below or equal to the storage capacity of the measurement capacitor, and threshold 1004 can be based on the storage capacity of charge storage device 902. Typically threshold 1004 is can be based on a scaled storage capacity of charge storage device 902 to ensure that when the quantity of charge stored in charge storage device 902 is measured for intensity determination, the measurement capacitor does not saturate, and the measured quantity also relates to the incident light intensity. As to be described below, thresholds 1002 and 1004 can be used to detect whether photodiode PD and charge storage device 902 saturate, which can determine the intensity range of the incident light.

In addition, in a case where the incident light intensity is within high light intensity range 1010, the total overflow charge accumulated at charge storage device 902 may exceed threshold 1004 before the exposure period ends. As additional charge is accumulated, charge storage device 902 may reach full capacity before the end of the exposure period, and charge leakage may occur. To avoid measurement error caused due to charge storage device 902 reaching full capacity, a time-to-saturation measurement can be performed to measure the time duration it takes for the total overflow charge accumulated at charge storage device 902 to reach threshold 1004. A rate of charge accumulation at charge storage device 902 can be determined based on a ratio between threshold 1004 and the time-to-saturation, and a hypothetical quantity of charge (Q3) that could have been accumulated at charge storage device 902 at the end of the exposure period (if the capacitor had limitless capacity) can be determined by extrapolation according to the rate of charge accumulation. The hypothetical quantity of charge (Q3) can provide a reasonably accurate representation of the incident light intensity within high light intensity range 1010.

Referring back to FIG. 9A, to measure high light intensity range 1010 and medium light intensity range 1008, transfer switch M1 can be biased by TG signal in a partially turned-on state. For example, the gate voltage of transfer switch M1 (TG) can be set based on a target voltage developed at photodiode PD corresponding to the full well capacity of the photodiode. With such arrangements, only overflow charge (e.g., charge generated by the photodiode after the photodiode saturates) will transfer through transfer switch M1 to reach charge storage device 902, to measure time-to-saturation (for high light intensity range 1010) and/ or the quantity of charge stored in charge storage device 902 (for medium light intensity range 1008). For measurement of medium and high light intensity ranges, the capacitance of charge storage device 902 (by connecting $C_{EXT}$ and $C_{FD}$) can also be maximized to increase threshold 1004.

Moreover, to measure low light intensity range 1006, transfer switch M1 can be controlled in a fully turned-on state to transfer the residual charge stored in photodiode PD to charge storage device 902. The transfer can occur after the quantization operation of the overflow charge stored at charge storage device 902 completes and after charge storage device 902 is reset. Moreover, the capacitance of charge storage device 902 can be reduced. As described above, the reduction in the capacitance of charge storage device 902 can increase the charge-to-voltage conversion ratio at charge storage device 902, such that a higher voltage can be developed for a certain quantity of stored charge. The higher charge-to-voltage conversion ratio can reduce the effect of measurement errors (e.g., quantization error, comparator offset, etc.) introduced by subsequent quantization operation on the accuracy of low light intensity determination. The measurement error can set a limit on a minimum voltage difference that can be detected and/or differentiated by the quantization operation. By increasing the charge-to-voltage conversion ratio, the quantity of charge corresponding to the minimum voltage difference can be reduced, which in turn reduces the lower limit of a measurable light intensity by pixel cell 602a and extends the dynamic range.

The charge (residual charge and/or overflow charge) accumulated at charge storage device 902 can develop an analog voltage at the OF node, which can be buffered by switchable buffer 904 at PIXEL_OUT and quantized by ADC 616. As shown in FIG. 9A, ADC 616 includes a comparator 906 which can be reset by a switch M8, and output logic circuits 908. ADC 616 is also coupled with memory 912 and counter 914. Counter 914 can generate a set of count values based on a free-running clock signal, whereas memory 912 can be controlled, by comparator 906 via output logic circuits 908, to store a count value (e.g., the latest count value) generated by counter 914. Memory 912 can be, for example, a latch circuit to store the counter value based on local pixel value as described below. The stored count value can be output to represent incident light intensity.

Comparator 906 can compare an analog voltage COMP_IN, which is derived from PIXEL_OUT by the CC capacitor, against a threshold VREF, and generate a decision VOUT based on the comparison result. The CC capacitor can be used in a noise/offset compensation scheme to store the reset noise and comparator offset information in a VCC voltage, which can be added to the PIXEL_OUT voltage to generate the COMP_IN voltage, to cancel the reset noise component in the PIXEL_OUT voltage. The offset component remains in the COMP_IN voltage and can be cancelled out by the offset of comparator 906 when comparator 906 compares the COMP_IN voltage against threshold VREF to generate the decision VOUT. Comparator 906 can generate a logical one for VOUT if the COMP_IN voltage equals or exceeds VREF. Comparator 906 can also generate a logical zero for VOUT if the COMP_IN voltage falls below VREF. VOUT can control a latch signal which controls memory 912 to store a count value from counter 914.

Figure 11B:
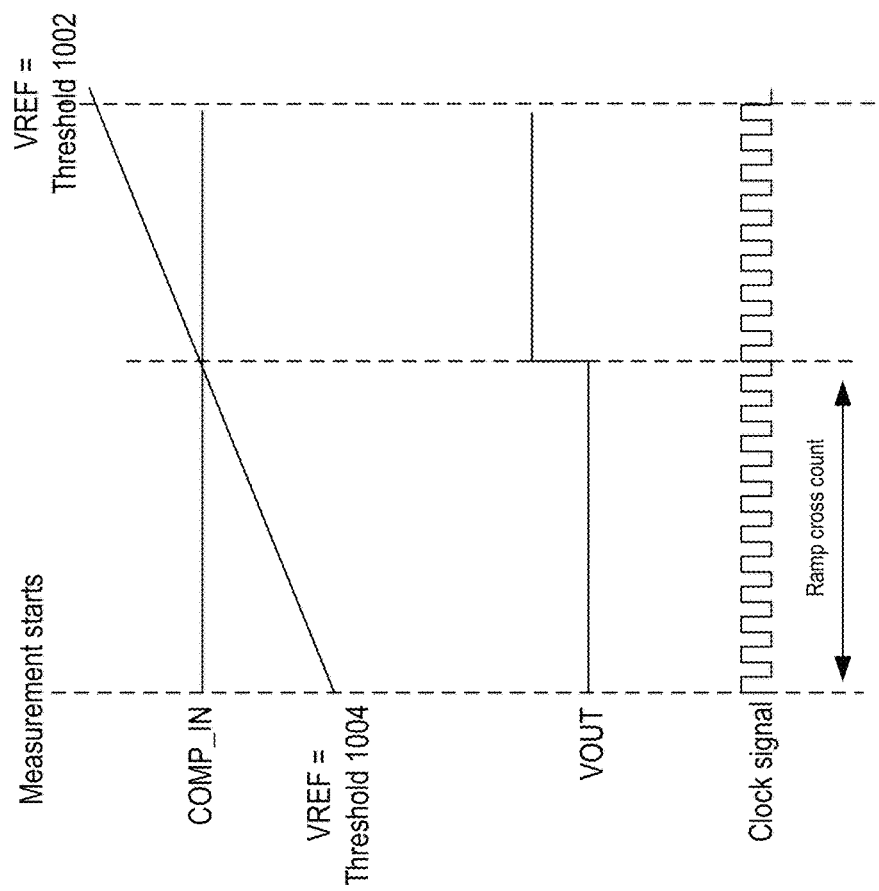
FIG. 11A, FIG. 11B, FIG. 11C, and FIG. 11D illustrate example methods for determining a light intensity.
Figure 11A:
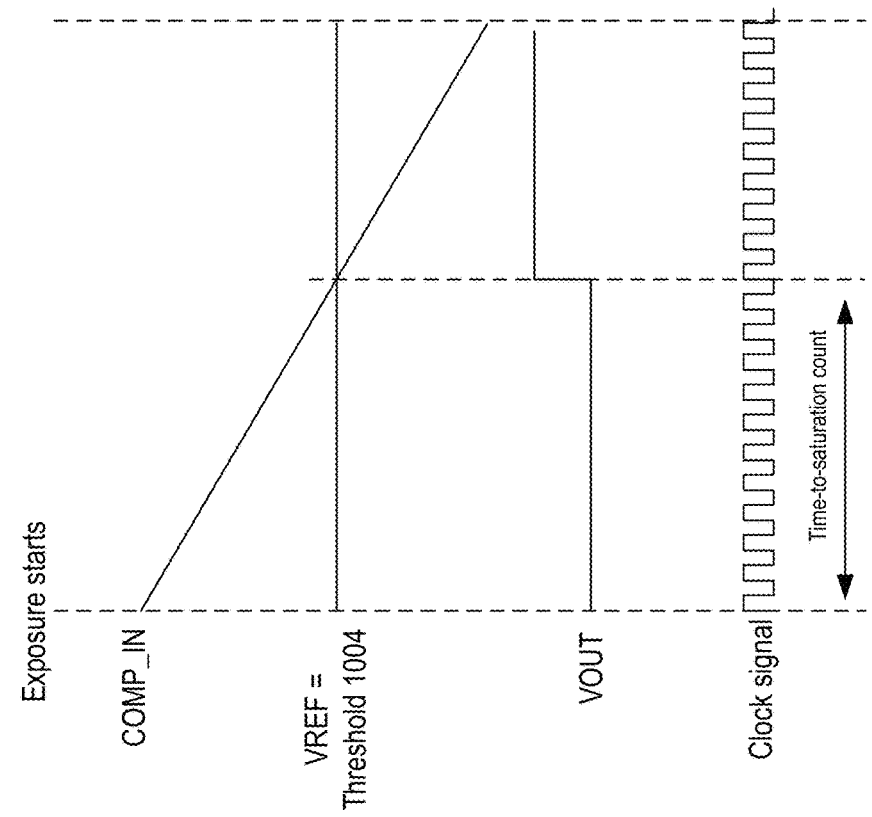

FIG. 11A illustrates an example of time-to-saturation measurement by ADC 616. To perform the time-to-saturation measurement, a threshold generator (which can be external to pixel cell 602a) can generate a fixed VREF. Fixed VREF can be set at a voltage corresponding a charge quantity threshold for saturation of charge storage device 902 (e.g., threshold 1004 of FIG. 10). Counter 914 can start counting right after the exposure period starts (e.g., right after shutter switch M0 is disabled). As the COMP_IN voltage ramps down (or up depending on the implementation) due to accumulation of overflow charge at charge storage device 902, clock signal keeps toggling to update the count value at counter 914. The COMP_IN voltage may reach the fixed VREF threshold at a certain time point, which causes VOUT to flip from low to high. The change of VOUT may stop the counting of counter 914, and the count value at counter 914 may represent the time-to-saturation.

FIG. 11B illustrates an example of measurement of a quantity of charge stored at charge storage device 902. After measurement starts, the threshold generator can generate a ramping VREF, which can either ramp up (in the example of FIG. 11B) or ramp down depending on implementation. The rate of ramping can be based on the frequency of the clock signal supplied to counter 914. In a case where overflow charge is measured, the voltage range of ramping VREF can be between threshold 1004 (charge quantity threshold for saturation of charge storage device 902) and threshold 1002 (charge quantity threshold for saturation of photodiode PD), which can define the medium light intensity range. In a case where residual charge is measured, the voltage range of the ramping VREF can be based on threshold 1002 and scaled by the reduced capacity of charge storage device 902 for residual charge measurement. In the example of FIG. 11B, the quantization process can be performed with uniform quantization steps, with VREF increasing (or decreasing) by the same amount for each clock cycle. The amount of increase (or decrease) of VREF corresponds to a quantization step. When VREF reaches within one quantization step of the COMP_IN voltage, VOUT of comparator 906 flips, which can stop the counting of counter 914, and the count value can correspond to a total number of quantization steps accumulated to match, within one quantization step, the COMP_IN voltage. The count value can become a digital representation of the quantity of charge stored at charge storage device 902, as well as the digital representation of the incident light intensity.

As discussed above, ADC 616 can introduce quantization errors when there is a mismatch between a quantity of charge represented by the quantity level output by ADC 616 (e.g., represented by the total number of quantization steps) and the actual input quantity of charge that is mapped to the quantity level by ADC 808. The quantization error can be reduced by using a smaller quantization step size. In the example of FIG. 11B, the quantization error can be reduced by the amount of increase (or decrease) in VREF per clock cycle.

Although quantization error can be reduced by using smaller quantization step sizes, area and performance speed may limit how far the quantization step can be reduced. With smaller quantization step size, the total number of quantization steps needed to represent a particular range of charge quantities (and light intensity) may increase. A larger number of data bits may be needed to represent the increased number of quantization steps (e.g., 8 bits to represent 255 steps, 7 bits to represent 127 steps, etc.). The larger number of data bits may require additional buses to be added to pixel output buses 816, which may not be feasible if pixel cell 601 is used on a head-mounted device or other wearable devices with very limited spaces. Moreover, with a larger number of quantization step size, ADC 808 may need to cycle through a larger number of quantization steps before finding a quantity level that matches (with one quantization step), which leads to increased processing power consumption and time, and reduced rate of generating image data. The reduced rate may not be acceptable for some applications that require a high frame rate (e.g., an application that tracks the movement of the eyeball).

One way to reduce quantization error is by employing a non-uniform quantization scheme, in which the quantization steps are not uniform across the input range. FIG. 11C illustrates an example of a mapping between the ADC codes (the output of the quantization process) and the input charge quantity level for a non-uniform quantization process and a uniform quantization process. The dotted line illustrates the mapping for the non-uniform quantization process, whereas the solid line illustrates the mapping for the uniform quantization process. For the uniform quantization process, the quantization step size (denoted by $\Delta_1$) is identical for the entire range of input charge quantity. In contrast, for the non-uniform quantization process, the quantization step sizes are different depending on the input charge quantity. For example, the quantization step size for a low input charge quantity (denoted by $\Delta_S$) is smaller than the quantization step size for a large input charge quantity (denoted by $\Delta_L$). Moreover, for the same low input charge quantity, the quantization step size for the non-uniform quantization process ($\Delta_S$) can be made smaller than the quantization step size for the uniform quantization process ($\Delta_1$).

One advantage of employing a non-uniform quantization scheme is that the quantization steps for quantizing low input charge quantities can be reduced, which in turn reduces the quantization errors for quantizing the low input charge quantities, and the minimum input charge quantities that can be differentiated by ADC 616 can be reduced. Therefore, the reduced quantization errors can push down the lower limit of the measureable light intensity of the image sensor, and the dynamic range can be increased. Moreover, although the quantization errors are increased for the high input charge quantities, the quantization errors may remain small compared with high input charge quantities. Therefore, the overall quantization errors introduced to the measurement of the charge can be reduced. On the other hand, the total number of quantization steps covering the entire range of input charge quantities may remain the same (or even reduced), and the aforementioned potential problems associated with increasing the number of quantization steps (e.g., increase in area, reduction in processing speed, etc.) can be avoided.

Figure 11D:
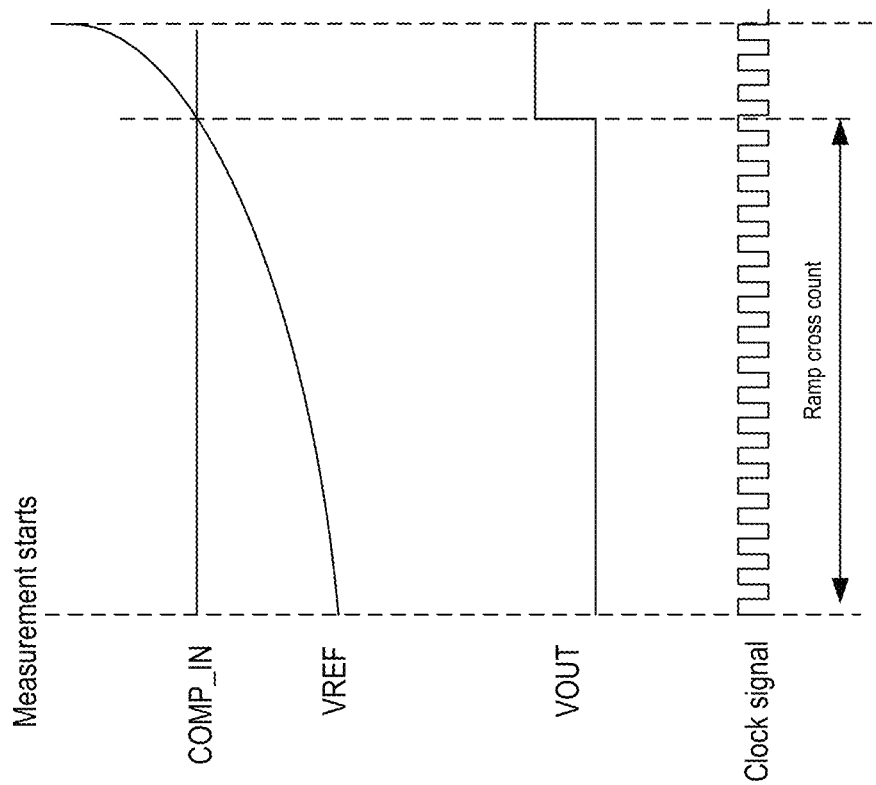
Figure 11C:
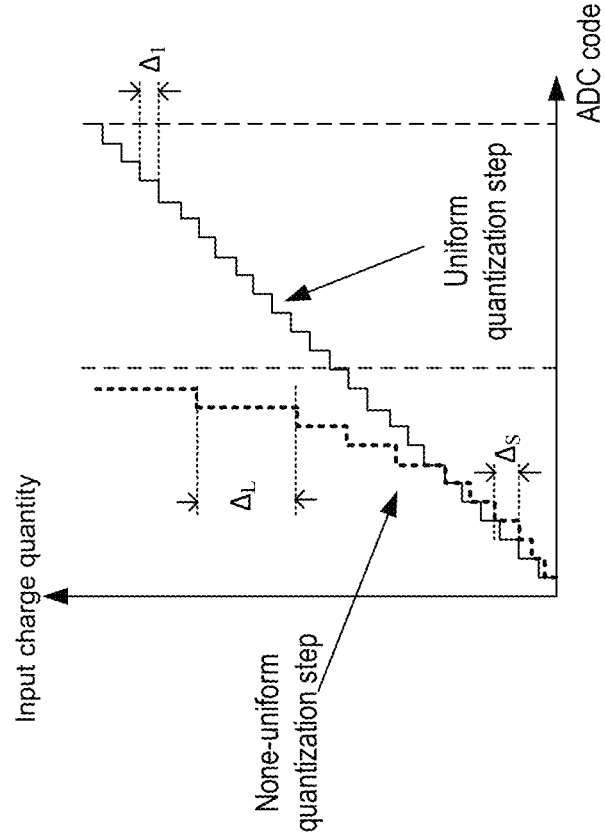

FIG. 11D illustrates an example of quantizing an analog voltage by pixel ADC 808 using a non-uniform quantization process. Compared with FIG. 11B (which employs a uniform quantization process), VREF increases in a non-linear fashion with each clock cycle, with a shallower slope initially and a steeper slope at a later time. The differences in the slopes are attributed to the uneven quantization step sizes. For lower counter count values (which correspond to a lower input quantity range), the quantization steps are made smaller, hence VREF increases at a slower rate. For higher counter count values (which correspond to a higher input quantity range), the quantization steps are made larger, hence VREF increases at a higher rate. The non-uniform VREF slope can be generated based on, for example, changing the frequency of counting of counter 814, changing the relationship between the VREF voltage and the count values of counter 914, etc. In some examples, the non-uniform quantization process of FIG. 11D can be employed for light intensity determination for low light intensity range 1006 and medium light intensity range 1008.

Figure 12:
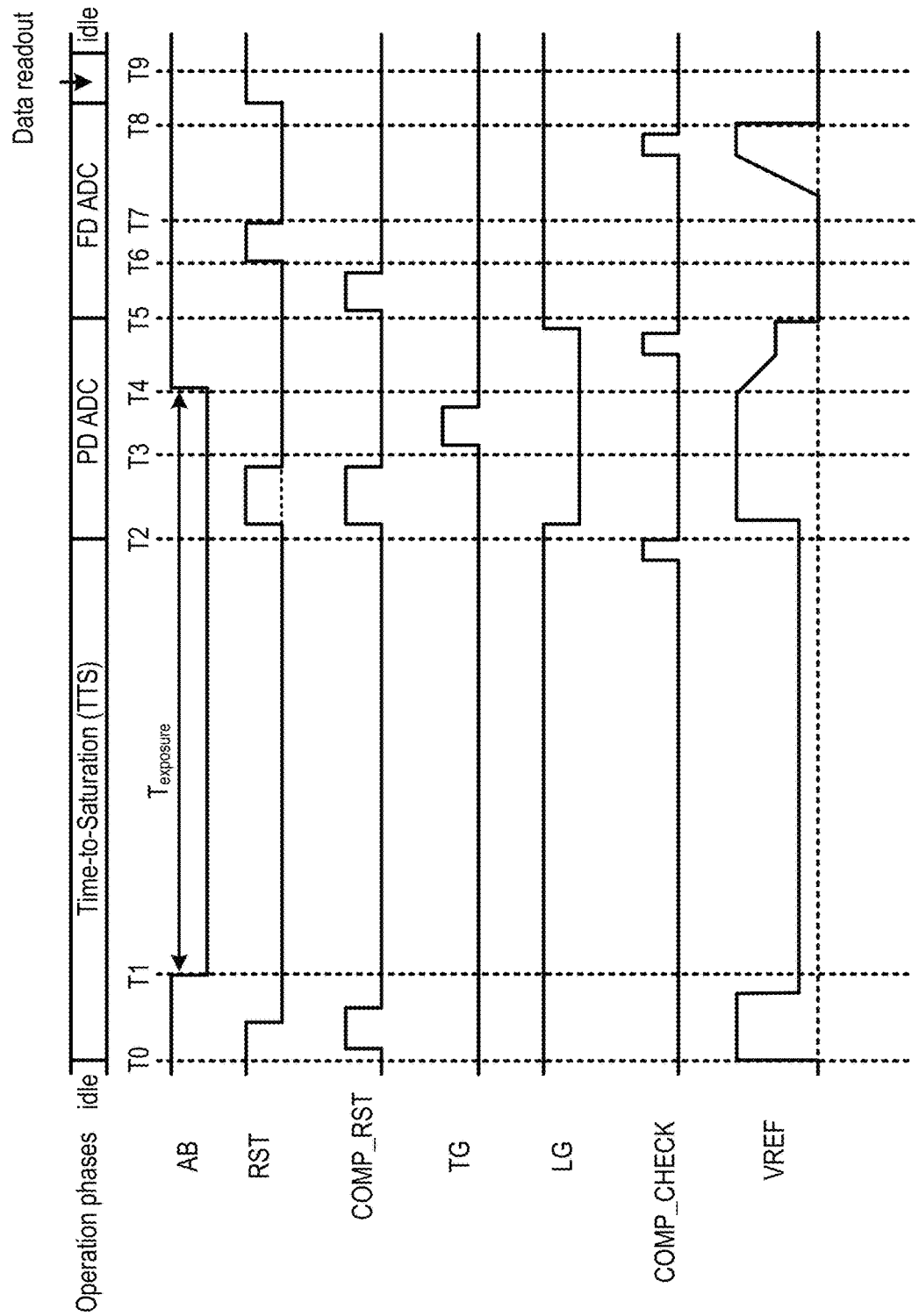
FIG. 12 illustrates an example sequence of control signals to perform light intensity measurement.

Reference is now made to FIG. 12, which illustrate an example sequence of the control signals of pixel cell 1100 for measurement of incident light intensity. As shown in FIG. 12, between times T0 and T1 is a first reset phase as in FIG. 12, in which both charge storage device 608 and comparator 906 can be put in a reset state by controller 1110 by asserting the RST and COMP_RST signals. Moreover, LG signal is asserted, which allows $C_{FD}$ and $C_{EXT}$ capacitors to be reset by the RST signal and the PIXEL_OUT signal is set at the reset level. With COMP_RST signal asserted and the positive terminal of comparator 906 connected to $V_{ref\_high}$, COMP_IN can be set to a sum of $V_{ref\_high}$ and comparator offset $V_{comp\_offset}$. Moreover, with RST signal asserted, PIXEL_OUT can be set the reset voltage $V_{pixel\_out\_rst}$ and can include reset noise $V\sigma_{KTC}$. A first sampling operation can be performed by the CC cap to store a $V_{CC}$ voltage including the components of the comparator offset, the reset noise, and PIXEL_OUT voltage at the reset level, as follows:

$$V_{cc}(T1) = (V_{ref\_high} + V_{comp\_offset}) - (V_{pixel\_out\_rst} + V\sigma_{KTC}) \quad \text{(Equation 1)}$$

Moreover, shutter signal AB can be asserted to prevent charge generated by photodiode PD from reaching charge storage device 608.

At time T1, the AB, COMP_RST, and the RST signals are released, which starts an exposure period (labelled $T_{exposure}$) in which photodiode PD can accumulate and transfer charge. TG signal can set transfer switch M1 in a partially turned-on state to allow PD to transfer overflow charge to charge storage device 608. LG signal can remain asserted to operate in low gain mode, in which both $C_{FD}$ capacitor and $C_{EXT}$ capacitor are connected in parallel to form charge storage device 608 to store the overflow charge. The overflow charge develops a new PIXEL_OUT voltage, $V_{pixel\_out\_sig1}$. The CC capacitor can AC couple the PIXEL_OUT voltage to become the COMP_IN voltage. The COMP_IN voltage between times T1 and T2 can be set based on Equation 1 above.

Between times T1 and T2, a time-to-saturation (TTS) measurement can be performed by comparator 906 comparing COMP_IN voltage with a static $V_{ref\_low}$ to generate VOUT. At time T2, when controller 1110 determines the state of VOUT of comparator 906. The state of VOUT can be provided to output logic circuits 908, which can generate a latch signal to control memory 912 to store a count value from counter 914 if VOUT indicates that COMP_IN voltage reaches $V_{ref\_low}$, which in turn indicates that charge storage device 902 is saturated. Output logic circuits 908 can also store in its internal state that charge storage device 902 is saturated to prevent the subsequent PD ADC and FD ADC operations from overwriting the TTS output in memory 912. On the other hand, if charge storage device 902 is not saturated, no count value will be stored in memory 912 at time T2, and count values from subsequent PD ADC or FD ADC operation can be stored into memory 912.

Following the TTS measurement, between times T2 and T5, the PD ADC operation can be performed to measure the residual charge stored in the photodiode PD. The LG signal is de-asserted to disconnect $C_{EXT}$ from $C_{FD}$ to increase charge-to-voltage conversion ratio, as described above. The overflow charge (if any) is divided between $C_{FD}$ and $C_{EXT}$ based on a ratio of capacitances between $C_{FD}$ and $C_{EXT}$ such that $C_{FD}$ stores a first portion of the overflow charge and $C_{EXT}$ stores a second portion of the overflow charge. $V_{pixel\_out\_sig1}$ can correspond to the first portion of the overflow charge stored in $C_{FD}$.

To prepare for the PD ADC operation, between times T2 and T3, COMP_RST signal is asserted again to reset comparator 906. The resetting of comparator 906 can set a new $V_{CC}$ voltage across the CC capacitor based on a difference between $V_{pixel\_out\_sig1}$ and the output of comparator 906 in the reset state, as follows:

$$V_{cc}(T2) = (V_{ref\_high} + V_{comp\_offset}) - (V_{pixel\_out\_sig1}(T3) + V\sigma_{KTC}) \quad \text{(Equation 2)}$$

Optionally, the RST signal can be asserted between times T2 and T3 to reset $C_{FD}$ and to remove the first portion of the overflow charge, prior to the transfer of the residual charge. This allows the subsequent PD ADC operation to quantize only the residual charge rather than a mixture of the residual charge and the first portion of the overflow charge. Such arrangements can improve the accuracy of measurement of low light intensity as there is no need to remove the overflow charge component (based on the result of the subsequent FD ADC operation) from the PD ADC operation output which could otherwise introduce additional errors. On the other hand, not asserting the RST signal between times T2 and T3 can be advantageous, as such arrangements can introduce redundancy in the PD ADC and FD ADC operations and increase the signal-to-noise ratio, as both operations measure a mixture of residual and overflow charge.

Between times T3 and T4, COMP_RST signal is released so that comparator 906 exits the reset state. Moreover, the TG signal can set transfer switch M1 in a fully turned-on state to transfer the residual charge to $C_{FD}$. The residual charge can be transferred to $C_{FD}$, which changes the PIXEL_OUT voltage to $V_{pixel\_out\_sig2}$. The new PIXEL_OUT voltage can be AC coupled into a new COMP_IN voltage at time T4, as follows:

$$V_{comp\_in}(T4) = V_{pixel\_out\_sig2} - V_{pixel\_out\_sig1} + V_{ref\_high} + V_{comp\_offset} \quad \text{(Equation 3)}$$

In Equation 3, the difference between $V_{pixel\_out\_sig2} - V_{pixel\_out\_sig1}$ represents the quantity of residual charge transferred by the photodiode to charge storage device 608 between times T3 and T4.

After TG is fully turned-on between times T3 and T4, the TG is de-asserted to disconnect the photodiode PD from $C_{FD}$ and $C_{EXT}$. As a result, no additional charge is transferred to $C_{FD}$ and $C_{EXT}$ after time T4 until the start of next exposure period.

Between times T4 and T5, controller 1110 can perform the PD ADC operation by comparing the COMP_IN voltage with a VREF ramp that starts from $V_{ref\_high}$ to $V_{ref\_low\_margin}$. In PD ADC phase, $V_{ref\_high}$ can represent the minimum detectable quantity of residual charge stored in photodiode PD, whereas $V_{ref\_low}$ margin can represent the saturation threshold of photodiode PD with margin to account for dark current, as described above.

At time T5, controller 1110 can check whether the COMP_IN voltage falls below $V_{ref\_low\_margin}$, which can indicate whether the photodiode PD saturates. If the COMP_IN voltage goes above $V_{ref\_low\_margin}$ (which indicates the photodiode PD saturates), and if no TTS output is stored in the memory (based on the internal state of output logic circuits 908), output logic circuits 908 can generate a latch signal to control memory 912 to store a count value from counter 914. Output logic circuits 908 can also store, as part of its internal state, the indication that the photodiode PD saturates, so that the subsequent FD ADC operation will not be able overwrite the PD ADC output (or TTS output) stored in the memory. If the COMP_IN voltage falls below $V_{ref\_low\_margin}$, no count value will be stored into memory 912 at time T5, and a count value from a subsequent FD ADC operation can be stored into memory 912.

Between times T5 and T8, a FD ADC operation can be made to measure the overflow charge transferred by the photodiode PD within the exposure period $T_{exposure}$. As photodiode PD remains disconnected from $C_{FD}$ and $C_{EXT}$, no additional charge is transferred to $C_{FD}$ and $C_{EXT}$, and the total charge stored in $C_{FD}$ and $C_{EXT}$ is mostly generated in the exposure period $T_{exposure}$, together with additional charge generated by the photodiode between times T3 and T4. With such arrangement, the GSE of pixel At time T5, the LG signal is asserted to connect $C_{FD}$ with $C_{EXT}$, which allows the second portion of the overflow charge stored in $C_{EXT}$ to combine with the residual charge stored in $C_{FD}$ (and the first portion of the overflow charge if RST is not asserted between times T2 and T3), and a new PIXEL_OUT voltage $V_{pixel\_out\_sig3}$ can develop at the parallel combination of $C_{FD}$ and $C_{EXT}$ and is to be quantized.

Between times T5 and T7, a noise sampling operation can be performed to mitigate the effect of reset noise and comparator offset on the FD ADC operation. Between times T5 and T6, comparator 906 can be reset as part of the first sampling operation. The positive terminal of comparator 906 is connected to the lower end of VREF, $V_{ref\_low}$. The $V_{CC}$ voltage can include components of reset noise and comparator offset as described above. The $V_{CC}$ voltage can be as follows:

$$V_{CC}(T5) = (V_{ref\_low} + V_{comp\_offset}) - (V_{pixel\_out\_sig3} V\sigma_{KTC1})$$ (Equation 4)

Between times T6 and T7, both $C_{FD}$ and $C_{EXT}$ can be reset, while comparator 906 exits the reset state, as part of a second sampling operation. As a result of resetting, PIXEL_OUT can be reset to a reset voltage $V_{pixel\_out\_rst}$. Moreover, second reset noise charge is also introduced into charge storage device 608, which can be represented by $V\sigma_{KTC2}$. The second reset noise charge typically tracks the first reset noise charge. At time T6, as the result of the second sampling operation, $V_{pixel\_out}$ can be as follows:

$$V_{pixel\_out}(T6) = V_{pixel\_out\_rst} + V\sigma_{KTC2}$$ (Equation 5)

At time T7, COMP_RST is released, and comparator 906 exits the reset state. Via AC-coupling, the COMP_IN voltage can track $V_{pixel\_out}(T6)$ in addition to $V_{CC}(T5)$ as follows:

$$V_{comp\_in}(T7) = (V_{ref\_low} + V_{comp\_offset}) + (V_{pixel\_out\_rst} - V_{pixel\_out\_sig3}) + (V\sigma_{KTC2} - V\sigma_{KTC1})$$ (Equation 6)

Following the second sampling operation, the COMP_IN voltage can be quantized by comparing against a VREF ramp between times T7 and T8. The VREF ramp can start from $V_{ref\_low}$, which can represent a minimum quantity of overflow charge detectable in charge storage device 608 including $C_{EXT}$ and $C_{FD}$, and $V_{ref\_high}$, which can represent the quantity of overflow charge when charge storage device 608 saturates. A count value from counter 914 when VOUT trips can be stored into memory 912 to represent the intensity of light received in the exposure period. After time T8, the digital value stored in memory 912 can be read out to represent the intensity of light received by the photodiode PD within the exposure period $T_{exposure}$, at time T9. In a case where one image frame is generated in a single frame period, the frame period can span from time T0 to T8.

The sequence of control signals, as well as their timing, are controlled by controller 920, as well as by exposure stop signal 922 and selection signal 924. Specifically, controller 920 can assert and de-assert the control signals (e.g., AB, RST, COMP_RST, TG, and LG signals) and control the VREF signal based on a pre-configured timing sequence, which can be overwritten by exposure stop signal 922 and/or selection signal 924. Exposure stop signal 922 can trigger the PD ADC operation, which includes assertion of the RST and COMP_RST signal, the de-assertion of the LG signal, followed by the assertion of the TG signal to transfer the residual charge and then the assertion of the AB signal to stop the exposure period, to start at an earlier time than the time T2 of the pre-configured timing sequence. Exposure stop signal 922 can cause the exposure period to stop earlier than the time T4 of the pre-configured timing sequence. Such arrangements can reduce the likelihood of charge storage device 902 being saturated by the overflow charge. Moreover, selection signal 924 can configure controller 920 to skip one or more of TTS, PD ADC, and FD ADC operations. As to be described in details below, in a pixel cell comprising multiple photodiodes, selection signal 924 can be provided to configure controller 920 to skip the TTS operation for some of the multiple photodiodes to reduce the total time of quantization operations of all the photodiodes of a pixel cell to reduce frame period, whereas exposure stop signal 922 can be provided to dynamically reduce the exposure period of the photodiodes for which the TTS operation is not performed to prevent those photodiodes from saturating their respective charge storage devices 902 so that the intensity of the light components detected by those photodiodes can be measured by the PD ADC and/or FD ADC operations with a reasonable fidelity.

As shown in Equations 3 and 6, the polarity of comparison in PD ADC operation, where $V_{comp\_in}$ represents $V_{pixel\_out\_sig2} - V_{pixel\_out\_sig1}$, is opposite to the polarity of comparison in FD ADC operation, where $V_{comp\_in}$ represents $V_{pixel\_out\_rst} - V_{pixel\_out\_sig3}$. In PD ADC, the VOUT of comparator 906 of FIG. 9A becomes a logical zero when COMP_IN voltage is higher than $V_{ref\_low\_margin}$, which indicates the photodiode PD does not saturate. But in order to store the digital value when VOUT trips, which represents a measurement of the residual charge, into memory 912, memory 912 needs to receive a positive VOUT from comparator 906. In contrast, in FD ADC, the VOUT of comparator 906 of FIG. 9A becomes a logical one when COMP_IN voltage is higher than $V_{ref\_low}$, which indicates that the overflow charge exceeds the minimum detectable level. The polarity of comparison of FD ADC and the TTS operation is also identical.

Referring back to FIG. 9A, output logic circuits 908 include circuits that account for the different polarities of comparisons among the PD ADC, FD ADC, and TTS operations and to maintain an internal state to control the storing of count values into the memory. FIG. 9B includes an example of internal components of output logic circuits 908. As shown in FIG. 9B, output logic circuits 908 includes an inverter chain 942, a multiplexor device 946, flag registers 948 and 950, and a NOR gate 952. Flag registers 948 and 950 can store, respectively, a FLAG_1 state bit and a FLAG_2 state bit. FLAG_2 state can indicate a state of VOUT at the end of the TTS operation, whereas FLAG_1 state can indicate a state of VOUT at the end of the PD ADC operation. If FLAG_2 is asserted after the TTS operation, which indicates that the TTS operation has stored a count value into memory 912, NOR gate 952 can keep the latch signal low to lock memory 912 from being overwritten by the subsequent PD ADC operation. Moreover, if FLAG_1 is asserted after the PD ADC operation, FD ADC can be prevented from storing a count value into memory 912. Inverter chain 942 and multiplexor device 946 can control the output of the VOUT state based on the LG signal to registers 948 and 950 and NOR gate 952 to account for the different polarities of comparisons among the PD ADC, FD ADC, and TTS operations. Specifically, referring back to FIG. 12, for TTS and FD ADC operation the LG signal is asserted to combine $C_{EXT}$ with $C_{FD}$. Multiplexor device 946 can be controlled by the asserted LG signal to select the non-inverted VOUT to output to register 950 (for FLAG_2 bit) and NOR gate 952. For PD ADC operation the LG signal is de-asserted to disconnect $C_{EXT}$ from $C_{FD}$ to increase the charge-to-voltage conversion ratio. Multiplexor device 946 can be controlled by the de-asserted LG signal to select the inverted VOUT (VOUTb in FIG. 9B) to output to register 948 (for FLAG_1 bit) and NOR gate 952.

Referring back to FIG. 8A and FIG. 8B, in some examples, a pixel cell having multiple photodiodes may include a charge sensing unit 614 and an ADC 616 of FIG. 9A for each of the photodiodes to perform the multi-stage quantization operations (TTS, FD ADC, and PD ADC) as described in FIG. 12 for each of the photodiodes. Such arrangements, however, can substantially increase the footprint and power consumption of a pixel cell. Specifically, comparator 906 of ADC 616 may include an analog differential amplifier and other support circuitries (e.g., biasing circuits, output buffers, etc.), which can occupy the largest space and consume the most power among the components of the pixel cell. If multiple ADCs 616 (and multiple comparators 906) are included in the pixel cell, the size and power consumption of the pixel cell, as well as the pixel cell array, can become prohibitively large.

Figure 13A:
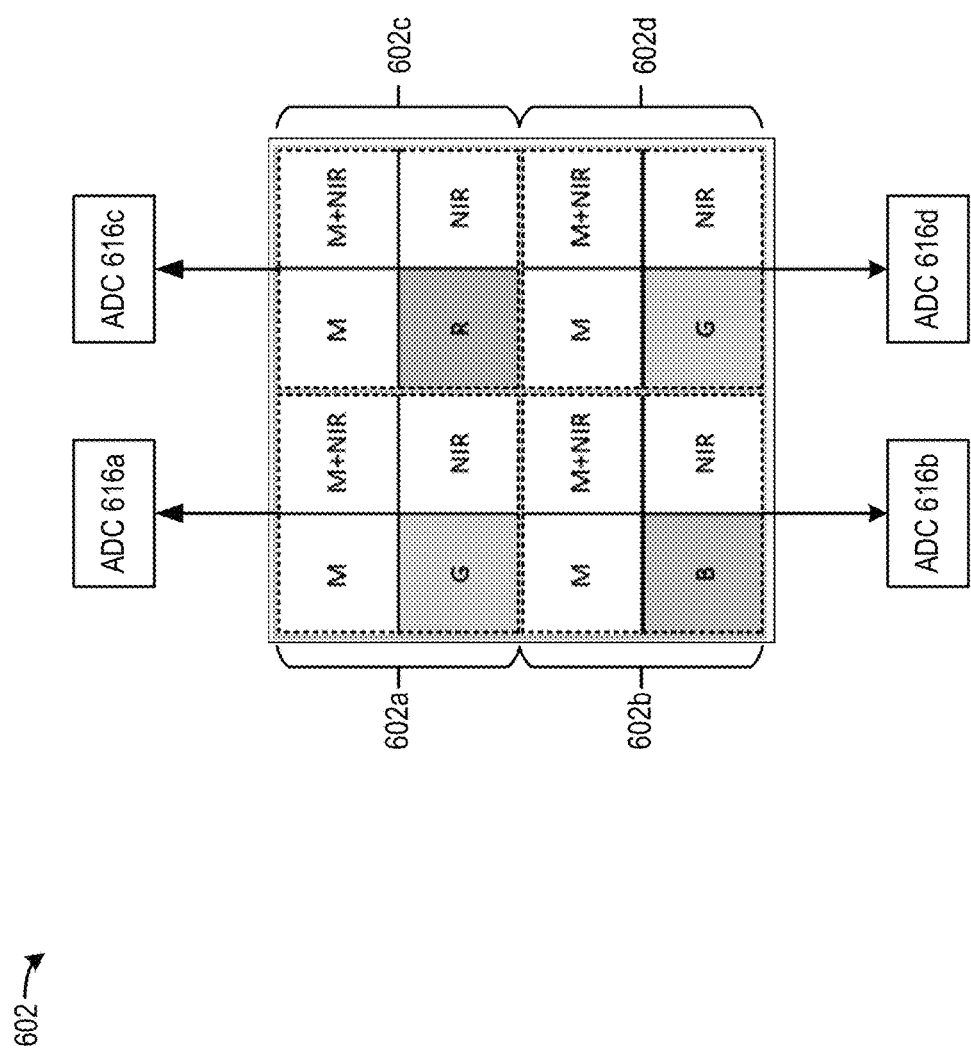
Figure 13B:
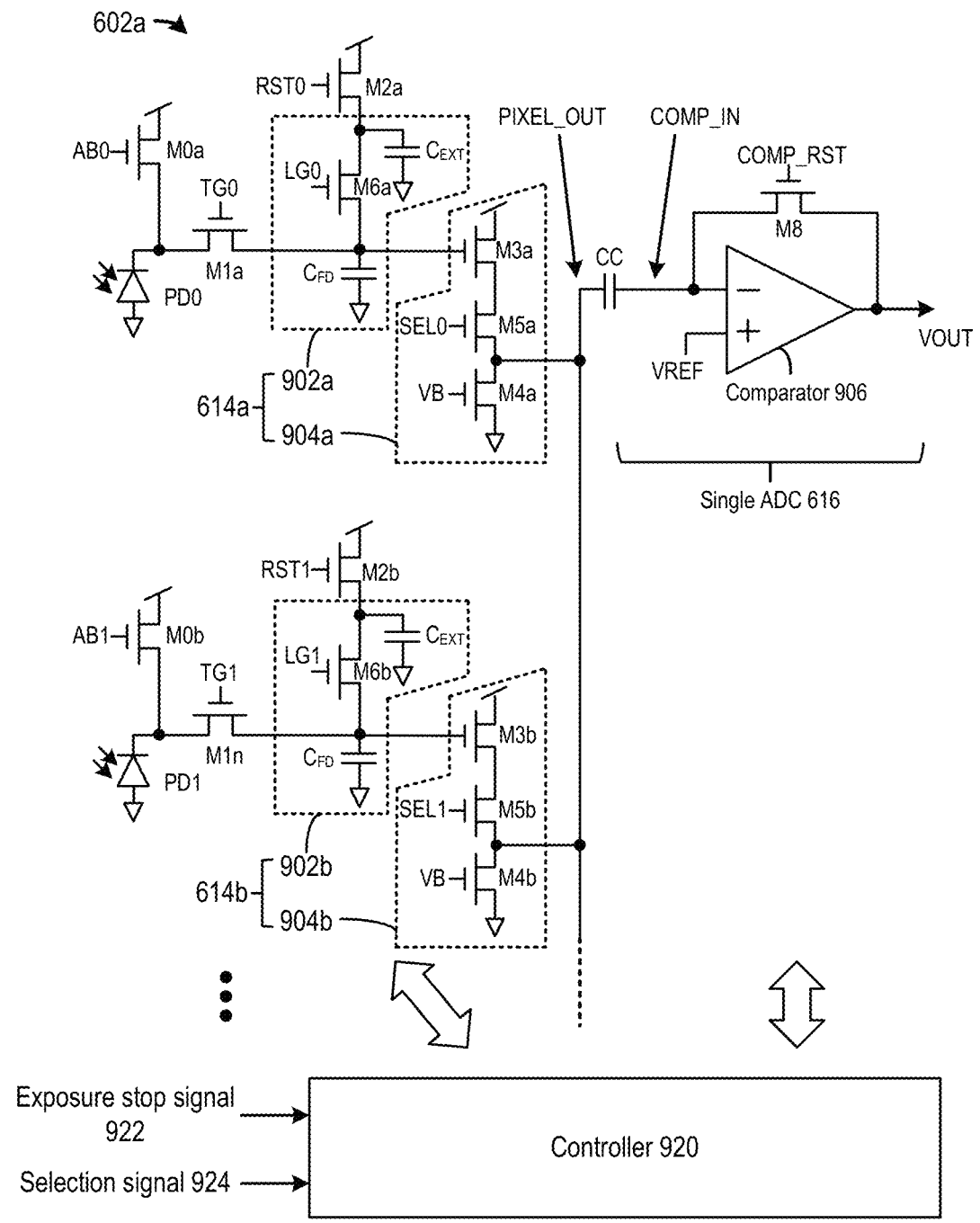

To reduce the footprint and power consumption of a pixel cell, a single ADC 616 can be shared among the photodiodes of the pixel cell. The charge sensing unit 614 of each photodiode can take turn to be connected with the single ADC 616 to perform the quantization operations and store the output at memory 912. FIG. 13A-FIG. 13C illustrate an example of a multi-photodiode pixel cell which includes a single ADC 616 shared among the multiple photodiodes of the pixel cell. As shown in FIG. 13A, pixel cell 602a can include a single ADC 616a shared among the monochrome channel (M) photodiode, monochrome +near infra-red channel (M+NIR) photodiode, the green channel (G) photodiode, and the near infra-red channel (NIR) photodiode. Moreover, each of other pixel cells 602b, 602c, and 602d also includes, respectively, a single ADC 616b, 616c, and 616d.

FIG. 13B illustrates an example of pixel cell 602a including multiple photodiodes. As shown in FIG. 13B, pixel cell 602a includes a plurality of photodiodes including PD0, PD1, etc., as well as a plurality of charge sensing units 614 including charge sensing unit 614a, 614b, etc. Charge sensing unit 614a includes a charge storage device 902a and a switchable buffer 904a and is configured to convert residual charge and overflow charge transferred from photodiode PD0 to voltages. Charge sensing unit 614b includes a charge storage device 902b and a switchable buffer 904b and is configured to convert residual charge and overflow charge transferred form photodiode PD1 to voltages. Each photodiode is coupled with a respective shutter switch and a respective transfer switch. For example, photodiode PD0 is coupled with shutter switch M0a and transfer switch M1a, whereas photodiode PD1 is coupled with shutter switch M0b and transfer switch M1b. Controller 920 can control the timing of control signals AB0 and AB1 (for shutter switches M0a and M0b), control signals TG0 and TG1 (for transfer switches M1a and M1b), as well as control signals RST0, LG0, RST1, and LG1 to individually enable each photodiode to generate/accumulate residual charge, and to transfer overflow charge to a respective charge sensing unit 614. In addition, controller 920 can also control the timing of control signals SEL0 and SEL1 to provide each charge sensing unit 614a and 614b access to ADC 616 to perform quantization operations selected by selection signal 924.

In one example configuration, selection signal 924 can select one of the photodiodes (e.g., PD0) to perform TTS operation as well as at least one of the PD ADC or the FD ADC operations, and the rest of photodiodes to perform at least one of the PD ADC or the FD ADC operations.

FIG. 13C illustrates an example sequence 1300 of some of the control signals of pixel cell 602a of FIG. 13B. The example sequence can be based on the sequence described in FIG. 12 and provided by controller 920. At time T0 the AB signal for each photodiode (AB0, AB1, ABn, etc.) is de-asserted to start the exposure period for each photodiode. The TX signal for each photodiode (TX0, TX1, TXn, etc.) are biased to allow overflow charge (if any) to flow to the respective charge sensing unit, while the LG signal for each photodiode (LG0, LG1, LGn, etc.) is asserted to connect $C_{EXT}$ and $C_{FD}$ together to sense the overflow charge. At time T1 SEL0 is asserted to connect charge sensing unit 614a of photodiode PD0 to ADC 616 to quantize the charge generated by PD0.

Between times T1 and T2, based on selection signal 924 ADC 616 can perform the TTS operation to determine whether the overflow charge from photodiode PD0 saturates charge storage device 902a, and the time it took to saturate charge storage device 902a (saturation time). Meanwhile, other charge storage devices 902 (e.g., 902b) of pixel cell 602a can continue accumulating charge generated by the respective photodiode PD between times T0 and T2. The other charge storage devices can have a larger combined capacity of $C_{EXT}$ and $C_{FD}$ than charge storage device 902a so that when charge storage device 902a saturates the other charge storage devices remain unsaturated.

At time T2, after TTS operation completes, the LG signal for each photodiode (LG0, LG1, LGn, etc.) is asserted to disconnect $C_{EXT}$ from $C_{FD}$ to prepare for the subsequent PD ADC operation. $C_{EXT}$ can be disconnected from $C_{FD}$ to preserve a portion of the overflow charge (if any) in $C_{EXT}$ for the subsequent FD ADC operation, whereas $C_{FD}$ can be optionally reset so that $C_{FD}$ only stores the residual charge to be transferred from the respective photodiodes, as described in FIG. 12. At time T3, the TG signal for each photodiode (TG0, TG1, TGn, etc.) is asserted to transfer the residual charge from the photodiode to the $C_{FD}$ of the respective charge storage device 902. At time T4, the AB signal for each photodiode (AB0, AB1, ABn, etc.) is asserted to stop the exposure period of each photodiode in the pixel cell. The duration of the exposure period in FIG. 13C is $T_{exposure-global}$, which spans between times T0 and T4. $T_{exposure-global}$ can be pre-configured (e.g., based on selection signal 924 or other programming information) and can be a global exposure period for all pixel cells of the pixel cell array.

Between times T4 and T5, based on selection signal 924 ADC 616 can perform the PD ADC operation on $C_{FD}$ of charge storage device 902a to measure a quantity of residual charge stored in the $C_{FD}$. A count value from the PD ADC operation can be stored in memory 912 for photodiode PD0 if the TTS operation does not store a count value in memory 912. At time T5, after the PD ADC operation completes, $C_{FD}$ of charge storage device 902a can be reset to remove the residual charge, and then at time T6 the LG0 signal for photodiode PD0 can be asserted to connect $C_{EXT}$ from $C_{FD}$ together again to redistribute the portion of the overflow charge stored in $C_{EXT}$ within charge storage device 902a. A FD ADC operation can then be performed between times T6 and T7 to quantize the overflow charge stored in charge storage device 902a for photodiode PD0. A count value from the FD ADC operation can be stored in memory 912 for photodiode PD0 if neither the prior TTS operation nor the PD ADC operation stores a count value in the memory.

At time T7, after the quantization operations for photodiode PD0 complete, SEL1 can be asserted to connect charge sensing unit 614b of photodiode PD1 to ADC 616. Between times T7 and T8, based on selection signal 924, ADC 616 can perform PD ADC operation on $C_{FD}$ of charge storage device 902b to measure a quantity of residual charge stored in the $C_{FD}$ for photodiode PD1. Following the completion of the PD ADC operation, the $C_{FD}$ of charge storage device 902b can be reset at time T8, followed by assertion of LG1 for the photodiode PD1 and then FD ADC operation. Controller 920 can also control ADC 616 to perform PD ADC and FD ADC operation for other photodiodes of pixel cell 602a in sequence 1300 to generate the count values for other photodiodes.

Compared with a case where the same sequence of quantization operations (e.g., TTS, PD ADC, and FD ADC operations) are repeated for each photodiodes, the arrangements in FIG. 13C can reduce the total time of quantization operations of a pixel cell by selectively disabling the TTS operations for all of the photodiodes except one photodiode. The reduced total time of quantization operations can reduce the frame period and increase the frame rate. Moreover, as the exposure periods of all the photodiodes of the pixel cell end at the same time (T4 in FIG. 13C), all the photodiodes of the pixel cell can have a uniform exposure period, which can improve shutter efficiency. All these can improve the performance of the image sensor especially when used to image high speed objects.

On the other hand, the arrangements in FIG. 13C may reduce the upper limit of the dynamic range of the image sensor. This is because the TTS operation, which measures the time-to-saturation to extend the upper limit of the measurable light intensity beyond the level that saturates the charge sensing unit, is performed for only one photodiode. For other photodiodes for which only FD ADC and/or PD ADC operations are performed, the upper limit of the dynamic range is still limited by the charge storage capacity of the charge sensing units of those photodiodes and is not extended by the TTS operation. As a result, the dynamic range of the image sensor as a whole can be reduced.

Figure 14A:
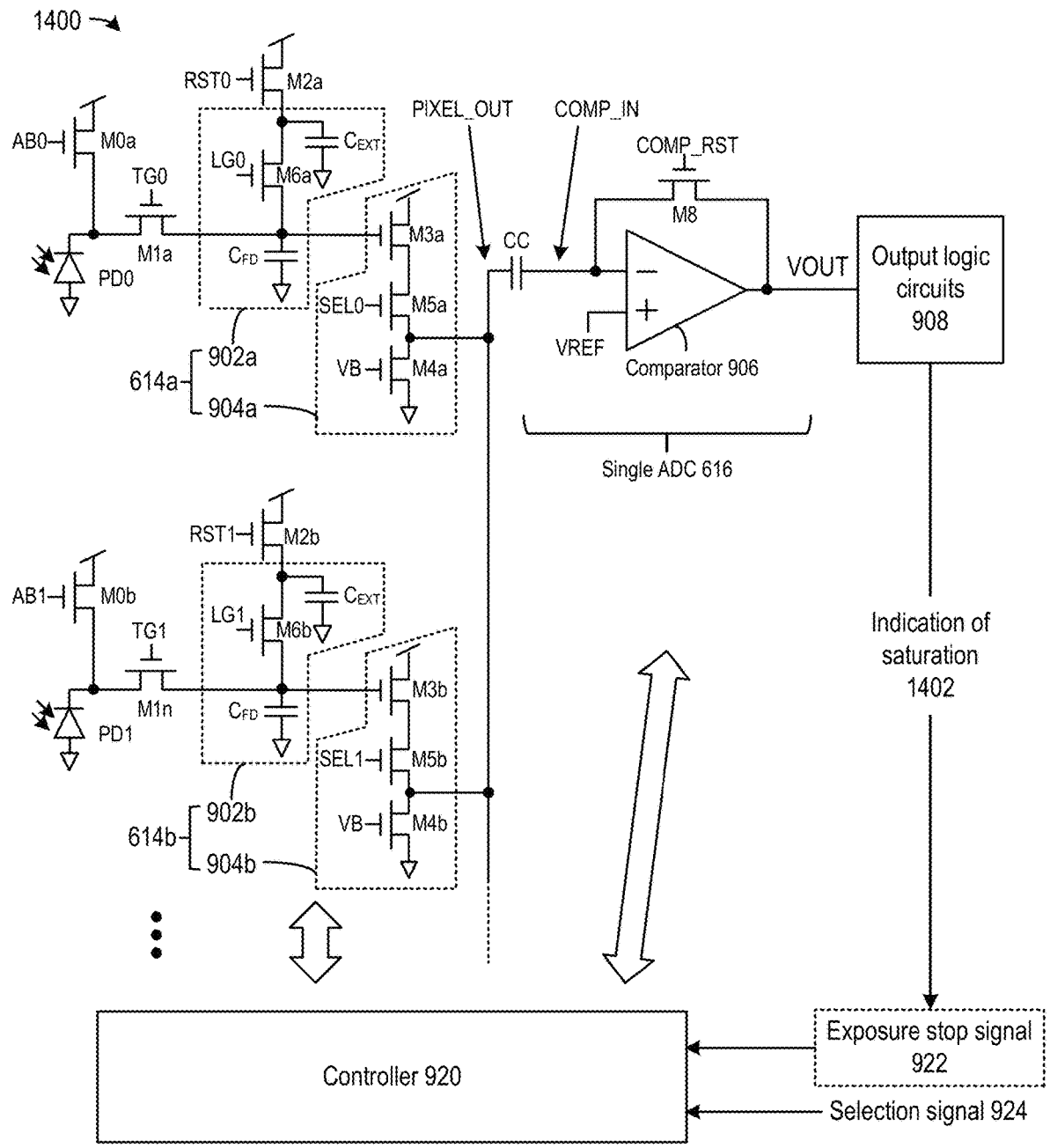
FIG. 14A, and FIG. 14B illustrate another example of a multi-photodiode pixel cell and its operation.

FIG. 14A illustrates an example of a multi-photodiode pixel cell 1400 that can provide an extended dynamic range. As shown in FIG. 14A, output logic circuits 908 can output an indication of saturation 1402 to controller 920 as exposure stop signal 922. Indication of saturation 1402 can be generated during the TTS operation to indicate that charge storage device 902a is saturated by the overflow charge. After controller 920 receives exposure stop signal 922, controller 920 can stop the exposure period of all the photodiodes of the pixel cell before the pre-configured end time. Such arrangements can reduce the quantity of charge transferred to a charge storage device for a given light intensity, which can reduce the likelihood of the charge storage devices of the pixel cell becoming saturated and cannot support accurate FD ADC and/or PD ADC operations.

Figure 14B:
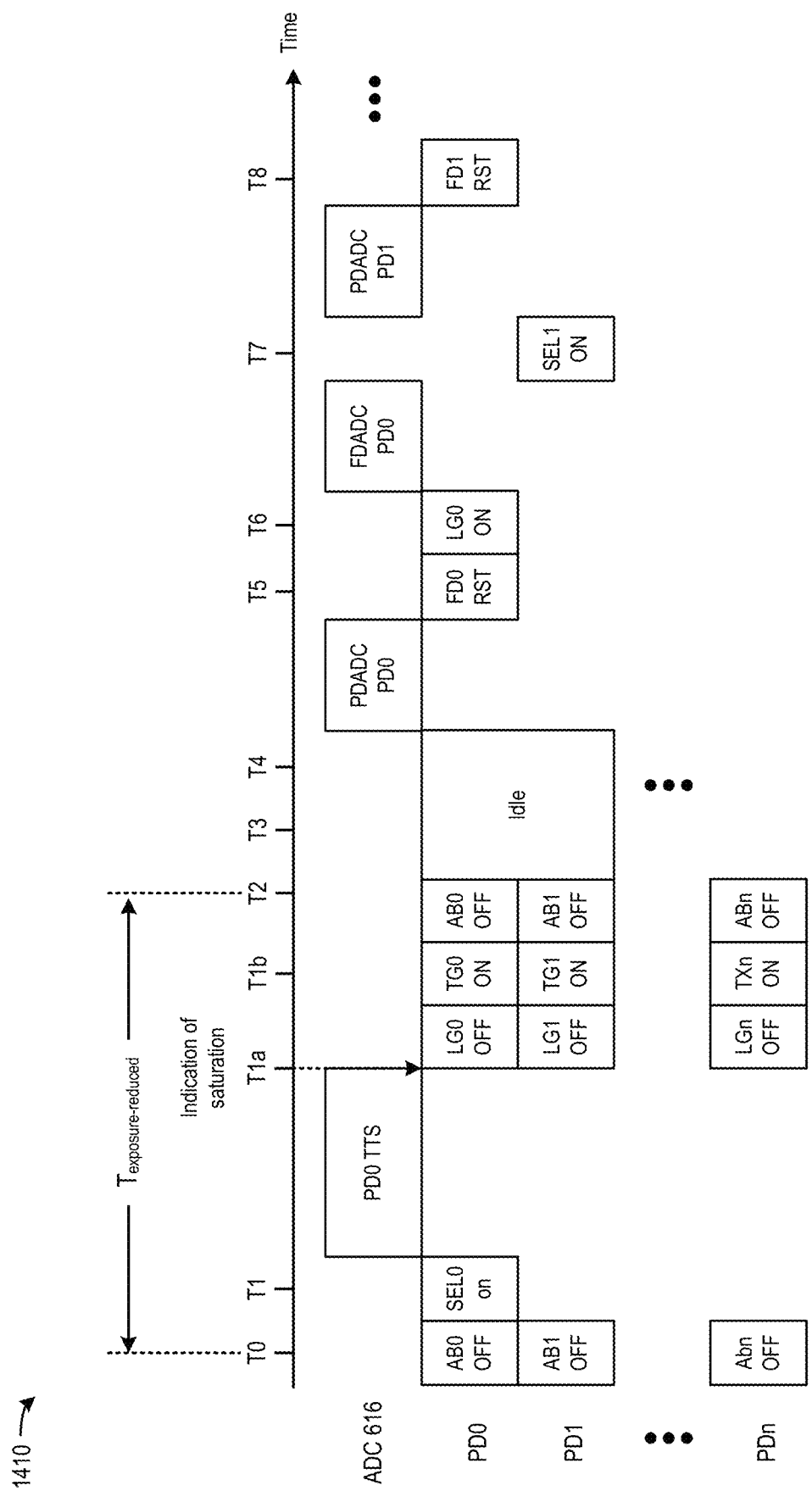

FIG. 14B illustrates an example sequence 1410 of some of the control signals of pixel cell 1400 of FIG. 14A. The operations at times T0 and T1 are identical to sequence 1300 of FIG. 13C. TTS operation for photodiode PD0 is performed between times T1 and T1a. At time T1', output logic circuits 908 outputs an indication of saturation 1402 based on VOUT indicating that the COMP_IN voltage reaches the static VREF threshold. Based on the indication of saturation, controller 920 can de-assert the LG signals of all the photodiodes (e.g., LG0, LG1, LGn, etc.) at time T1a, followed by assertion of the TG signals of all the photodiodes (e.g., TG0, TG1, TGn, etc.) at time T1b to transfer the residual charge from each photodiode to its respective charge storage unit. Controller 920 can then assert the AB signals to stop the exposure period at time T2. Compared with sequence 1300 where the exposure period ends at time T4, the exposure period in sequence 1410 ends at time T2 and have a duration of $T_{exposure-reduced}$ that spans between times T0 and T2. The exposure period $T_{exposure-reduced}$ is reduced with respect to the global exposure period $T_{exposure-global}$ which spans between times T0 and T4.

By reducing the exposure period based on the TTS output of photodiode PD0, the likelihood of the charge storage devices of photodiode PD1 and other photodiodes becoming saturated can be reduced. The likelihood of saturation is further reduced if the capacity of the charge storage devices of those photodiodes is made larger than that of photodiode PD0. As a result, the linearity of the light intensity measurements from the ADC can become more linear, which can improve the dynamic range of the image sensor. Moreover, by detecting saturation and adjusting the exposure period within the same frame period, the exposure period can adapt to changing light intensities more quickly, which can improve the performance of the image sensor especially when imaging high speed objects and scenes.

The PD ADC operation for PD0 can start from when the exposure period ends. In some examples, after the exposure period ends at time T2, controller 920 and pixel cell 1400 can enter an idle state until time T4 so that the PD ADC operation for PD0 can start at the same pre-configured time T4 as in sequence 1300. Moreover, the rest of the quantization operations are also performed at the same pre-configured times as sequence 1300. Such arrangements can ensure that the frame period of pixel cell 1400 remains identical to other pixel cells that operate with the pre-configured exposure period. In some examples, rather than entering an idle state to make up for the reduced exposure time, controller 920 can also scale up the duration of the PD ADC and FD ADC operations (e.g., by reducing the clock rate, by reducing the slope of the voltage ramp, etc.) to increase the quantization resolution, while ensuring that the quantization operations of pixel 1400 complete at the same time, to maintain the same frame period for pixel cell 1400 and other pixel cells of the pixel cell array.

As pixel cell 1400 can have a reduced exposure period compared with other pixel cells, when generating an image frame comprising the count value from pixel cell 1400 and other pixel cells/photodiodes that generate count values based on exposure to light within the pre-configured global exposure time, the count value from pixel cell 1400 can be scaled based on the following equation:

$$DN_{norm} = DN_{raw} \times \frac{T_{exposure-global}}{T_{exposure-reduced}} \quad \text{(Equation 7)}$$

In Equation 7, $DN_{raw}$ represents the PD ADC or FD ADC count output from a photodiode of pixel 1400 obtained from exposure period $T_{exposure-reduced}$ which is reduced from the global exposure period $T_{exposure-global}$. As the quantity of charge (represented by the count value) is directly proportional to the exposure period, $DN_{raw}$ can be extrapolated to a normalized count value $DN_{norm}$, based on the ratio between $T_{exposure-global}$ and $T_{exposure-reduced}$ so that the count values from all the photodiodes are obtained based on the same exposure period and follow the same scale.

In the example of FIG. 14A, photodiodes of pixel cell 1400 shares a single ADC. In some examples, however, photodiodes of different pixel cells can share a single ADC, and the TTS operation for a photodiode of a pixel cell can control the exposure period of another photodiode of a different pixel cell. The photodiodes that share a single ADC can be grouped in a kernel, which can include photodiodes from different pixel cells or from the same pixel cell. Each group of photodiodes in a kernel can be configured to detect the same or different light components. In the group of photodiodes of a kernel, all of the photodiodes except the a master photodiode (e.g., the first photodiode) has access to an ADC to perform only PD ADC and/or FD ADC operations, whereas the first photodiode has access to an ADC to perform the TTS, as well as PD ADC and/or FD ADC operations. All the photodiodes within the group can have the same exposure period, which can be stopped when the charge sensing unit of the master photodiode is saturated. As a result, the quantization result of the charge sensing units of those photodiodes, based on PD ADC and/or FD ADC operations, can still represent the intensities of the light components with a reasonable fidelity. On the other hand, if there is no indication of saturation from the master photodiode, the photodiodes can generate at least a threshold quantity of charge within the pre-configured exposure period to maintain a minimum signal-to-noise ratio for measurements of low and medium light intensities, which can set the lower limit of the dynamic range.

Figure 15A:
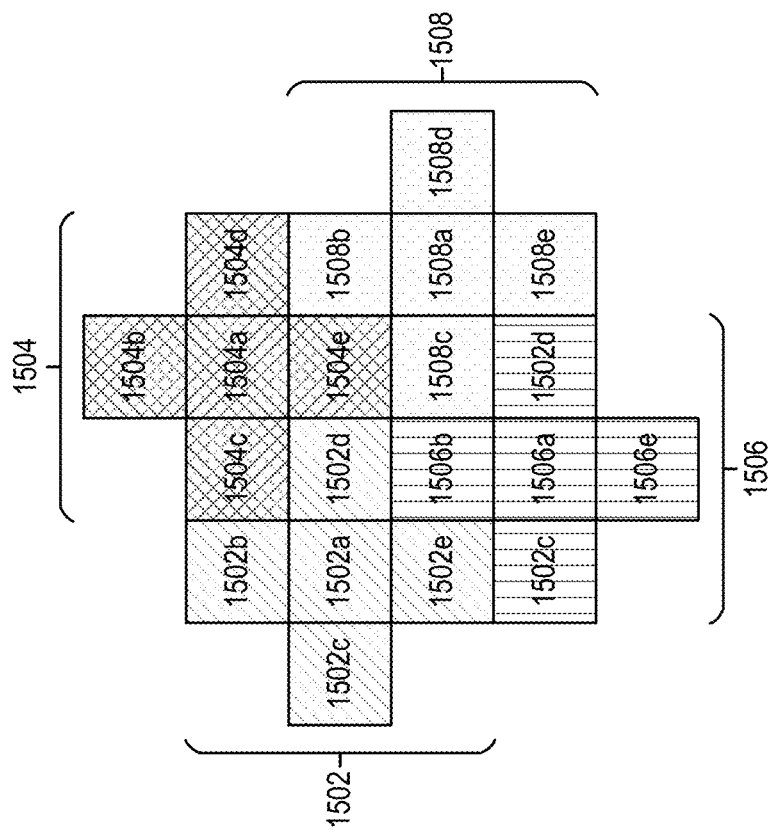
FIG. 15A, FIG. 15B, and FIG. 15C illustrate example grouping of photodiodes to share quantization resources.
Figure 15A:
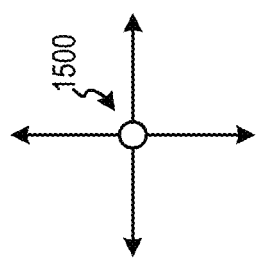
Figure 15B:
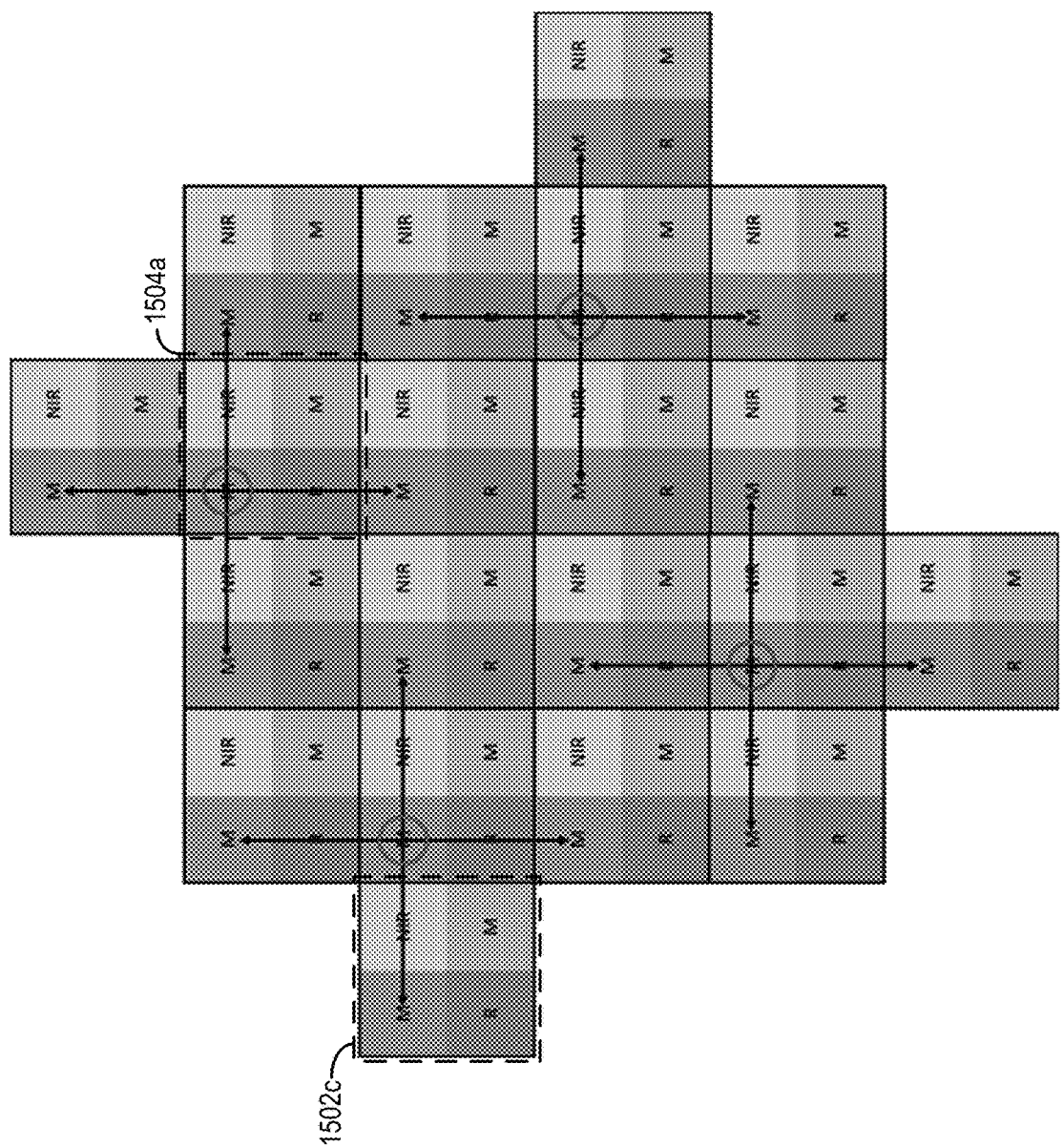
Figure 15C:
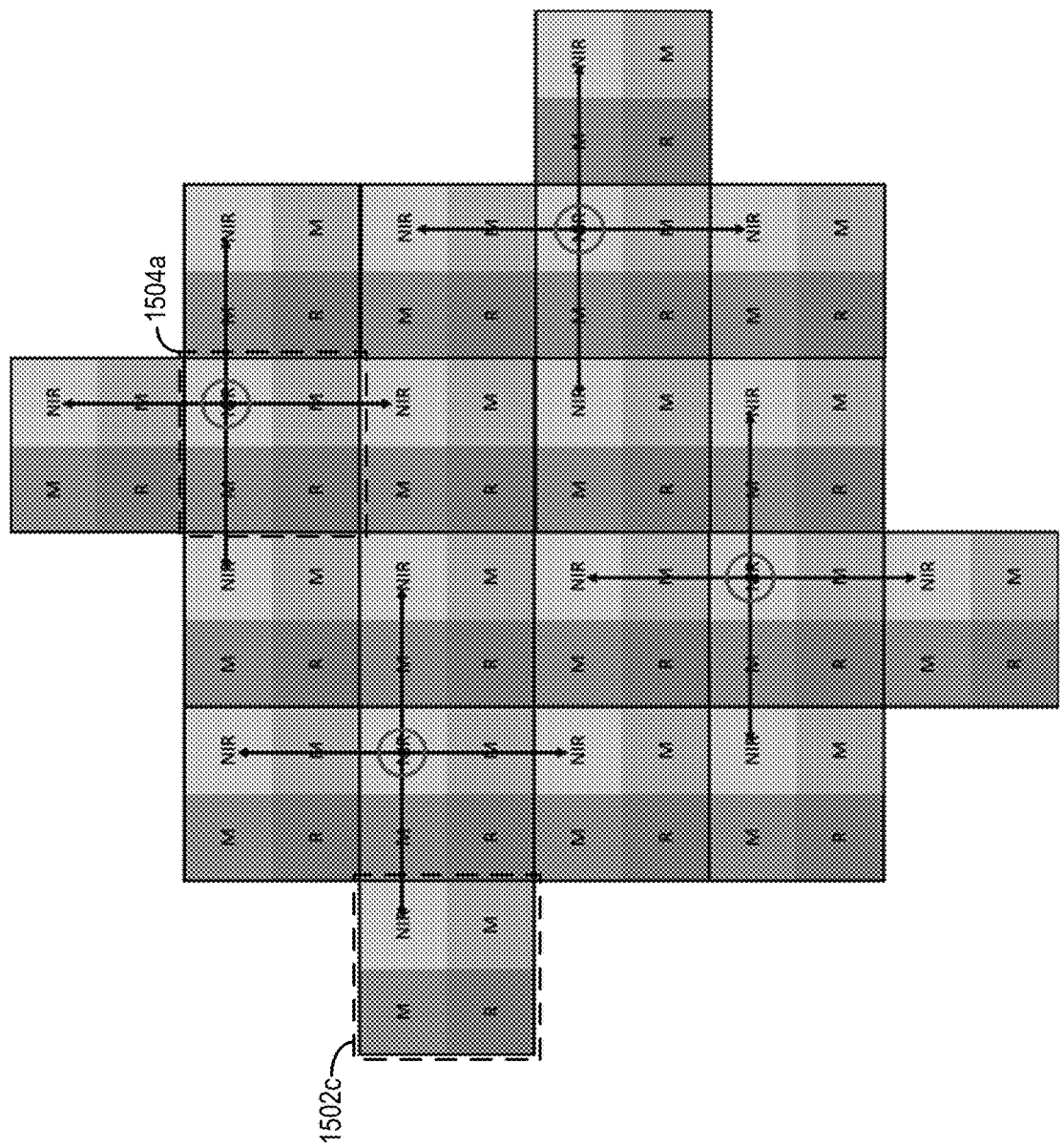

The grouping of photodiodes into a kernel can be based on various schemes and can be application specific. In one example, a kernel of pixels can be defined based on the contour/shape of a pre-determined object to be imaged. FIG. 15A, FIG. 15B, and FIG. 15C illustrate examples of a kernel determined based on the contour/shape of a target object. As shown in FIG. 15A, a kernel can include five pixel cells based on a shape that reflects the radiation of light from a pointed light source 1500, with one pixel cell in the center and four pixel cells on four sides (e.g., north, south, left, and right). In FIG. 15A, four kernels of pixel cells are shown including 1502, 1504, 1506 and 1508. Kernel 1502 includes a pixel cell 1502a which includes a master photodiode of kernel 1502, as well as pixel cells 1502b, 1502c, and 1502d. Kernel 1504 includes a pixel cell 1504a which includes a master photodiode of kernel 1504, as well as pixel cells 1504b, 1504c, and 1504d. Kernel 1506 includes a pixel cell 1502a which includes the master photodiode of kernel 1506, as well as pixel cells 1506b, 1506c, and 1506d. Moreover, kernel 1508 includes a pixel cell 1508a which includes the master photodiode of kernel 1508, as well as pixel cells 1508b, 1508c, and 1508d.

In the kernels shown in FIG. 15A, the pixel cell in the center of the kernel can include a master photodiode for which the TTS operation can be performed and, if saturation is detected, the exposure period of all the photodiodes of the kernel can be reduced, as described above. For example, in a case where the pixel cell array is used to image pointed light source 1500, the pixel cell in the center of the kernel can receive light from the brightest portion of the pointed light source and saturates the charge storage device. The exposure period for all the photodiodes within the kernel can be stopped upon the detection of saturation, so that other pixel cells within the kernel, which may receive the radiated light as well as light from other parts of a scene, can generate digital outputs that are linearly related to the incident light instead of the saturated outputs.

The photodiodes in the center pixel of the kernel can be configured as master photodiodes for different light components. Each master photodiode can share an ADC with other photodiodes (within the kernel) that detect the same light component and can control the exposure period of the other photodiodes. For example, as shown in FIG. 15B and FIG. 15C, each pixel cell (e.g., pixel cell 1502c) includes two photodiodes for detecting visible monochrome light (M), a photodiode for detecting near infra-red light (NIR), and a photodiode for detecting green light (G). Each set of M photodiodes, NIR photodiodes, and G photodiodes share an ADC, such that four ADCs are provided for each kernel, and each kernel can have two master M photodiodes, a master NIR photodiode, and a master G photodiode in the center pixel cell (e.g., pixel cell 1504a). In FIG. 15B, a master M photodiode (denoted by a circle) can control the exposure period of other M photodiodes in the same kernel, whereas in FIG. 15C, a master NIR photodiode (denoted by a circle) can control the exposure period of other NIR photodiodes in the same kernel.

Figure 16A:
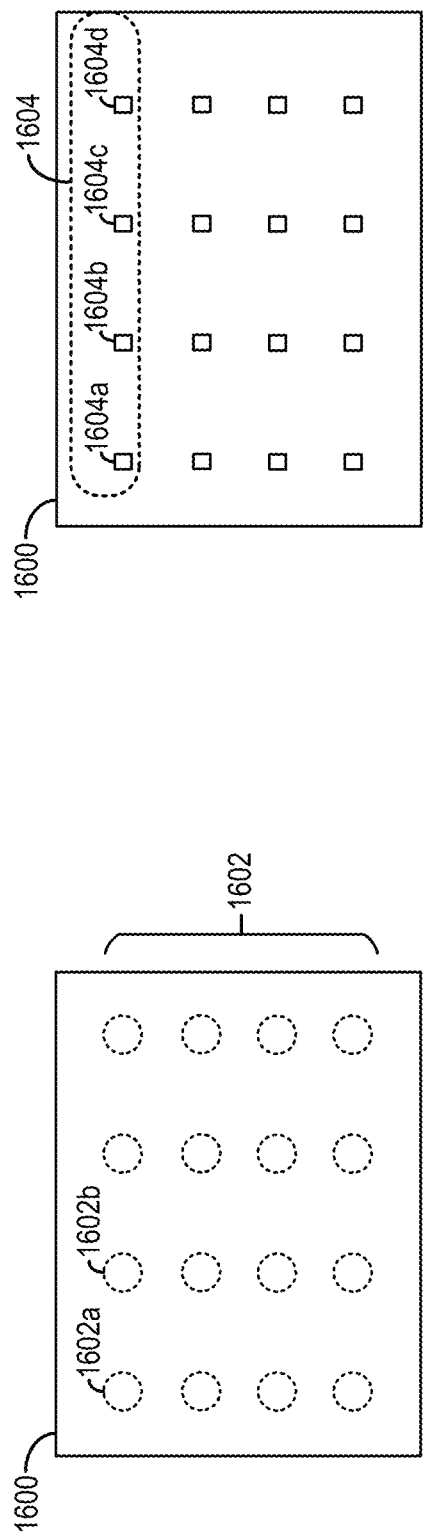
FIG. 16A and FIG. 16B illustrate another example grouping of photodiodes to share quantization resources.
Figure 16B:
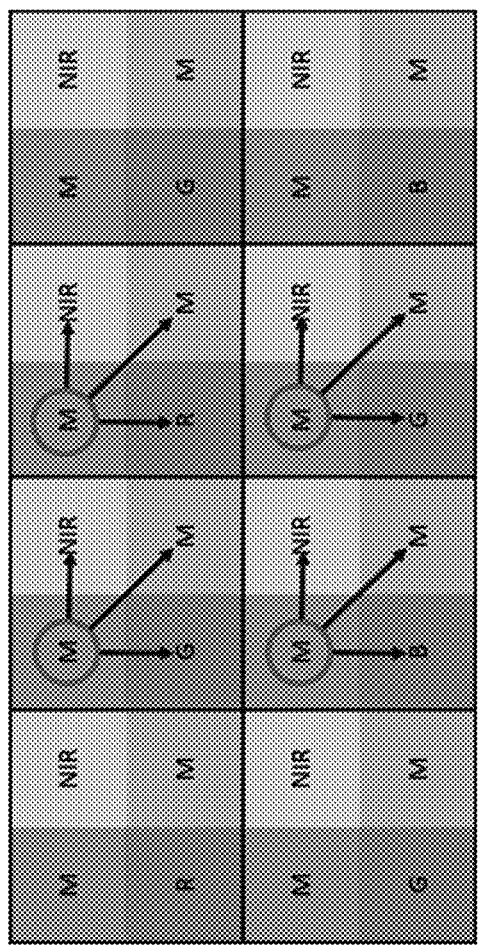

As another example, pixel cells that are likely to receive light components of similar intensity can form a kernel. The spatial distribution of the photodiodes of the kernel within a pixel cell array can be based on the application of the image sensor. FIG. 16A and FIG. 16B illustrate examples of kernels having different spatial distribution of the photodiodes within a pixel cell array. As shown in FIG. 16A, an image sensor 1600 may be configured to receive structured MR light of a pattern 1602 (which includes dot 1602a, dot 1602b, etc.) from a scene. In this application, a kernel 1604 can include pixel cells (e.g., 1604a, 1604b, 1604c, and 1604d) that are spaced apart based on the pattern 1602, with the master pixel cell (e.g., 1604a) of the kernel including a NIR photodiode to control the exposure period of the NIR photodiode of other pixel cells within the kernel.

In some examples, a kernel can also include photodiodes of the same pixel cell, as described above. Such arrangements can be provided when, for example, the image sensor is used to image a small part of a scene, and/or when image sensor operates in an environment with strong ambient light and where each photodiode of a pixel cell can receive a high-intensity light component, and the charge sensing unit of each photodiode within the pixel cell is likely to saturate. As shown in FIG. 16B, each pixel cell can include a master photodiode for detecting a light component (e.g., monochrome as circled) which can control the exposure period of other photodiodes that detect other or the same light components (e.g., NIR, B, M, etc.).

Figure 17:
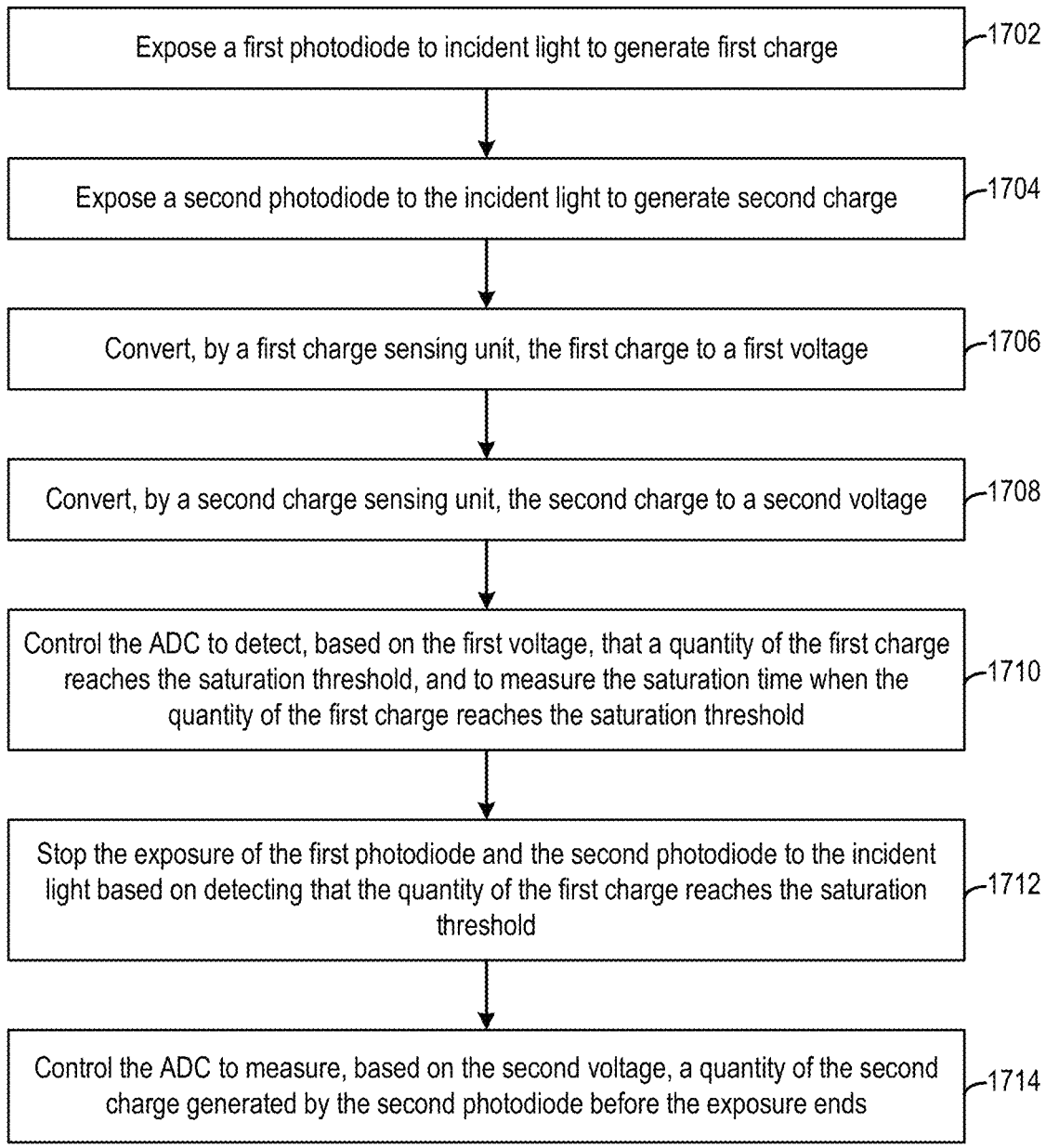
FIG. 17 illustrates a flowchart of an example process for measuring light intensity.

FIG. 17 illustrates a method 1700 for performing a light intensity measurement by multiple photodiodes comprising a first photodiode and a second photodiode, such as PD0 and PD1 of FIG. 14A. The first photodiode and the second photodiode can be part of the same pixel cell 602a, as shown in FIG. 14A, or can be in different pixel cells, as shown in FIG. 15A-FIG. 16B. The first photodiode and the second photodiode can be configured to detect incident light components of the same wavelength range or different wavelength ranges. The first photodiode may be coupled with a first charge sensing unit (e.g., charge sensing unit 614a) comprising a first charge storage device (e.g., charge storage device 902a) and a first switchable buffer (e.g., buffer 904a), whereas the second photodiode may be coupled with a second charge sensing unit (e.g., charge sensing unit 614b) comprising a second charge storage device (e.g., charge storage device 902b) and a second switchable buffer (e.g., buffer 904b). The outputs of first charge sensing unit and second charge sensing unit is coupled with a single ADC (e.g., ADC 616) which can quantize a first voltage at the first charge storage device when the first switchable buffer is switched on, and can quantize a second voltage at the second charge storage device when the second switchable buffer is switched on. Both the first charge storage device and the second charge device can include a primary capacitor and an auxiliary capacitor.

Method 1700 starts with step 1702, in which the first photodiode is exposed to incident light to generate first charge. In some examples, a first shutter switch is coupled between the first photodiode and a charge sink, and the first shutter switch can be switched off to expose the first photodiode to the incident light to generate the first charge, and the switching off of the first shutter switch can being an exposure period.

In step 1704, the second photodiode is exposed to incident light to generate second charge. In some examples, a second shutter switch is coupled between the second photodiode and the charge sink, and the second shutter switch can be switched off to expose the second photodiode to the incident light to generate the second charge. In some examples, the first shutter switch and the second shutter switch can be switched off at the same time so that the exposure period starts at the same time for both the first photodiode and the second photodiode.

In step 1706, the first charge sensing unit can convert the first charge to the first voltage. In some examples, the first charge sensing unit is coupled with the first photodiode via a first transfer switch, which can be biased to allow the first photodiode to store a quantity of first residual charge as part of the first charge, and to transfer the rest of the first charge as first overflow charge to the first charge storage device of the first charge sensing unit. The first overflow charge can be stored in both the primary and auxiliary capacitors of the first charge storage device. In step 1706, the first voltage can be developed based on the accumulation of the first overflow charge in the first charge storage device during the exposure period. Moreover, the first switchable buffer is turned on to connect the first charge storage device to the ADC to perform TTS operation.

In step 1708, the second charge sensing unit can convert the second charge to the first voltage. In some examples, the second charge sensing unit is coupled with the second photodiode via a second transfer switch, which can be biased to allow the second photodiode to store a quantity of second residual charge as part of the second charge, and to transfer the rest of the second charge as second overflow charge to the second charge storage device of the second charge sensing unit. The second overflow charge can be stored in both the primary and auxiliary capacitors of the second charge storage device. In step 1708, the second voltage can be developed based on the accumulation of the second overflow charge in the second charge storage device during the exposure period. Moreover, the second switchable buffer is turned off to disconnect the second charge storage device from the ADC.

In step 1710, as part of the TTS operation, the ADC is controlled to detect, based on the first voltage, that a quantity of the first charge reaches the saturation threshold, and to measure the saturation time when the quantity of the first charge reaches the saturation threshold. Specifically, in step 1710, the ADC can compare the first voltage against a static threshold voltage representing a saturation limit of the first charge storage device. If the first voltage crosses the static threshold, the ADC can output an indication of saturation that a quantity of the first charge (represented by the first overflow charge) stored in the first charge storage device reaches the saturation limit. The indication (e.g., VOUT signal of FIG. 14A) can control a memory (e.g., memory 912) to store a count value from a free-running counter (e.g., counter 914), and the count value can represent the intensity of the incident light component received by the first photodiode.

In step 1712, the exposure of the first photodiode and the second photodiode are stopped based on detecting that the quantity of the first charge reaches the saturation threshold. Specifically, the indication of saturation from step 1710 (and from the TTS operation of the first photodiode) can overrule the control signals of the first and second shutter switches to enable those switches to stop the exposure period for both the first photodiode and the second photodiode.

In some examples, after the exposure ends, the ADC can be controlled to perform PD ADC and FD ADC measurements. Specifically, after the exposure ends, the primary capacitor can be disconnected from the auxiliary capacitor of both the first and second charge storage devices to preserve a part of the first overflow charge and a part of the second overflow charge in, respectively, the auxiliary capacitor of the first and second charge storage devices. As part of the PD ADC operation, the primary capacitor of the first charge sensing unit can be reset, and then the first transfer switch can be controlled to transfer the first residual charge from the first photodiode to the primary capacitor. The ADC can compare the first voltage at the primary capacitor of the first charge sensing unit with a first ramping voltage to quantize the first residual charge, as described above. A determination of whether the first photodiode is saturated by the first residual charge is made during the PD ADC operation. In the FD ADC operation, the primary and auxiliary capacitors can be connected together again to redistribute the portion of the first overflow charge and the first residual charge between the primary and auxiliary capacitors. The ADC can compare the first voltage at the primary and auxiliary capacitors with a second voltage ramp to quantize the combination of the first overflow charge and the first residual charge, and the quantization result can be post-processed to measure the quantity of the first overflow charge. The result of one of the TTS, PD ADC, or FD ADC operations can be provided to represent the intensity of the incident light component received by the first photodiode based on whether the first charge storage device is saturated by the first overflow charge and whether the first photodiode is saturated by the first residual charge.

In step 1714, the ADC can be controlled to measure, based on the second voltage, a quantity of the second charge generated by the second photodiode before the exposure period ends. After the TTS, PD ADC and FD ADC operations for the first photodiode are complete, the first switchable buffer can be disabled while the second switchable buffer can be enabled, to connect the ADC to the output of the second charge storage device. A PD ADC operation followed by a FD ADC operation can be performed on the second charge storage device similar to as described in step 1712. The result of one of PD ADC or FD ADC operations can be provided to represent the intensity of the incident light component received by the second photodiode based on whether the second photodiode is saturated by the second residual charge.

Some portions of this description describe the examples of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some examples, a software module is implemented with a computer program product comprising a computer-readable medium containing computer program code, which can be executed by a computer processor for performing any or all of the steps, operations, or processes described.

Examples of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Examples of the disclosure may also relate to a product that is produced by a computing process described herein. Such a product may comprise information resulting from a computing process, where the information is stored on a non-transitory, tangible computer readable storage medium and may include any example of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the examples is intended to be illustrative, but not limiting, of the scope of the disclosure, which is set forth in the following claims.

What is claimed is:

1. An apparatus comprising:
    a first photodiode to generate first charge;
    a second photodiode to generate second charge;
    a first charge sensing unit to convert the first charge to a first voltage;
    a second charge sensing unit to convert the second charge to a second voltage;
    an ADC capable of measuring a saturation time and a quantity of charge; and
    a controller configured to:
        expose the first photodiode and the second photodiode to incident light to generate, respectively, the first charge and the second charge;
        connect the ADC to the first charge sensing unit to detect, based on the first voltage, that a quantity of the first charge reaches a saturation threshold, and to measure the saturation time when the quantity of the first charge reaches the saturation threshold;
        stop the exposure of the first photodiode and the second photodiode to the incident light based on detecting that the quantity of the first charge reaches the saturation threshold; and
        connect the ADC to the second charge sensing unit to measure, based on the second voltage, a quantity of the second charge generated by the second photodiode before the exposure ends.

2. The apparatus of claim 1, further comprising:
    a first shutter switch coupled between the first photodiode and a first charge sink; and
    a second shutter switch coupled between the second photodiode and a second charge sink;
    wherein the controller is configured to:
        exposure the first photodiode and the second photodiode to the incident light based on disabling the first shutter switch and the second shutter switch; and
        stop the exposure of the first photodiode and the second photodiode to the incident light based on enabling the first shutter switch and the second shutter switch.

3. The apparatus of claim 2, wherein the controller is configured to disable the first shutter switch and the second shutter switch together at a first time and to enable the first shutter switch and the second shutter switch together at a second time, such that a global shutter switch for the first photodiode and the second photodiode starts at the first time and ends at the second time.

4. The apparatus of claim 1, wherein each of the first charge sensing unit and the second charge sensing unit includes, respectively, a first capacitor and a second capacitor;
    wherein the apparatus further comprises:
        a first transfer switch coupled between the first photodiode and the first charge sensing unit; and
        a second transfer switch coupled between the second photodiode and the second charge sensing unit; and
    wherein the controller is configured to:
        control the first transfer switch to transfer the first charge to the first capacitor of the first charge sensing unit;
        control the second transfer switch to transfer the first charge to the second capacitor of the first charge sensing unit; and
        stop the exposure of the first photodiode and the second photodiode to the incident light after the transfer of the first charge and the second charge completes.

5. The apparatus of claim 4, wherein the controller is configured to:
    at a first time, bias the first transfer switch at a first bias voltage to transfer first overflow charge of the first charge from the first photodiode to the first charge sensing unit for storage;
    at the first time, bias the second transfer switch at the first bias voltage to transfer second overflow charge of the second charge from the second photodiode to the second charge sensing unit for storage;
    at a second time, bias the first transfer switch at a second bias voltage to transfer first residual charge of the first charge from the first photodiode to the first charge sensing unit for storage; and
    at the second time, bias the second transfer switch at the second bias voltage to transfer second residual charge of the second charge from the second photodiode to the second charge sensing unit for storage; and
    wherein the exposure of the first photodiode and the second photodiode to the incident light is stopped after the transfer of the first residual charge and the transfer of the second residual charge completes.

6. The apparatus of claim 5, wherein:
the first charge sensing unit includes a first switchable buffer coupled between the first capacitor and the ADC; and
the second charge sensing unit includes a second switchable buffer coupled between the first capacitor and the ADC;
the controller is configured to:
when the first transfer switch is biased at the first bias voltage, enable the first switch buffer to control the ADC to detect whether the quantity of the first overflow charge exceeds the saturation threshold, and to measure the saturation time when the quantity of the first overflow charge reaches the saturation threshold; and
after the exposure of the first photodiode and the second photodiode to the incident light stops:
control the ADC to measure a quantity of the second residual charge stored in the second capacitor.

7. The apparatus of claim 6, wherein:
the first capacitor develops the first voltage when the first overflow charge is transferred to the first capacitor; and
the ADC is configured to measure the saturation time based on comparing the first voltage against a first static threshold voltage representing the saturation threshold.

8. The apparatus of claim 7, wherein:
the first capacitor includes a first main capacitor and a first auxiliary capacitor;
prior to the transfer of the first residual charge, the controller is configured to:
disconnect the first auxiliary capacitor from the first main capacitor; and
reset the first main capacitor;
the first residual charge is transferred to the first main capacitor after the first main capacitor is reset to generate a third voltage; and
the ADC is configured to measure a quantity of the first residual charge stored in the first main capacitor based on comparing the third voltage at the first main capacitor with a first ramping threshold voltage.

9. The apparatus of claim 8, wherein the ADC is configured to, after measuring a quantity of the first residual charge:
connect the first auxiliary capacitor that stores a portion of the first overflow charge with the first main capacitor to generate a fourth voltage; and
measure a quantity of the first overflow charge based on comparing the fourth voltage with a second ramping threshold voltage.

10. The apparatus of claim 9, wherein the controller is configured select an output generated by ADC based on one of the first voltage, the third voltage, or the fourth voltage;
wherein the selection is based on whether the first voltage crosses the first static threshold voltage and based on whether the third voltage crosses a second static threshold voltage representing a storage capacity of the first photodiode; and
wherein the controller is configured to provide the selected output to represent an intensity of the incident light received by the first photodiode.

11. The apparatus of claim 6, wherein:
the second capacitor includes a second main capacitor and a second auxiliary capacitor;
prior to the transfer of the second residual charge, the controller is configured to:
disconnect the second auxiliary capacitor from the second main capacitor; and
reset the second main capacitor;
the second residual charge is transferred to the second main capacitor after the second main capacitor is reset to generate the second voltage; and
the ADC is configured to measure the quantity of the second residual charge stored in the second main capacitor based on comparing the second voltage at the second main capacitor with a first ramping threshold voltage.

12. The apparatus of claim 11, wherein the ADC is configured to, after measuring a quantity of the second residual charge:
connect the second auxiliary capacitor that stores a portion of the second overflow charge with the second main capacitor to generate a third voltage; and
measure a quantity of the second overflow charge based on comparing the third voltage with a second ramping threshold voltage.

13. The apparatus of claim 12, wherein the controller is configured select an output generated by ADC based on one of the second voltage or the third voltage;
wherein the selection is based on whether the second voltage crosses a static threshold voltage representing a storage capacity of the second photodiode; and
wherein the controller is configured to provide the selected output to represent an intensity of the incident light received by the second photodiode.

14. The apparatus of claim 1, wherein the first photodiode is configured to detect a first component of the incident light having a first wavelength range; and
wherein the second photodiode is configured to detect a second component of incident light having a second wavelength range.

15. The apparatus of claim 14, wherein the first wavelength range and the second wavelength range are identical.

16. The apparatus of claim 15, wherein the first photodiode and the second photodiode are part of a pixel cell.

17. The apparatus of claim 15, wherein the first photodiode and the second photodiode are part of, respectively, a first pixel cell and a second pixel cell.

18. The apparatus of claim 17, wherein the first pixel cell and the second pixel cell are part of a pixel cell array; and
wherein the first pixel cell and the second pixel cell are separated by one or more pixel cells.

19. A method comprising:
exposing a first photodiode to incident light to generate first charge;
exposing a second photodiode to the incident light to generate second charge;
converting, by a first charge sensing unit, the first charge to a first voltage;
converting, by a second charge sensing unit, the second charge to a second voltage;
controlling an ADC to detect, based on the first voltage, that a quantity of the first charge reaches a saturation threshold, and to measure a saturation time when the quantity of the first charge reaches the saturation threshold;
stopping the exposure of the first photodiode and the second photodiode to the incident light based on detecting that the quantity of the first charge reaches the saturation threshold; and controlling the ADC to measure, based on the second voltage, a quantity of the second charge generated by the second photodiode before the exposure ends.

20. The method of claim 19, wherein the first charge is generated by the first photodiode based on detecting a first component of the incident light having a first wavelength range;

wherein the second charge is generated by the second photodiode based on detecting a second component of the incident light having a second wavelength range; and wherein the first wavelength range and the second wavelength range are different.

* * * * *